United States Patent [19]
Inumiya et al.

[11] Patent Number: 6,054,355
[45] Date of Patent: Apr. 25, 2000

[54] METHOD OF MANUFACTURING A SEMICONDUCTOR DEVICE WHICH INCLUDES FORMING A DUMMY GATE

[75] Inventors: Seiji Inumiya, Tokyo; Tomohiro Saito, Yokohama; Atsushi Yagishita, Yokohama; Katsuhiko Hieda, Yokohama; Toshihiko Iinuma, Yokohama, all of Japan

[73] Assignee: Kabushiki Kaisha Toshiba, Kawasaki, Japan

[21] Appl. No.: 09/105,956

[22] Filed: Jun. 29, 1998

[30] Foreign Application Priority Data

Jun. 30, 1997 [JP] Japan .................................. 9-174552
Dec. 26, 1997 [JP] Japan .................................. 9-366810

[51] Int. Cl.$^7$ ................................................ H01L 21/336
[52] U.S. Cl. ..................................... 438/296; 438/595
[58] Field of Search ................................ 438/296, 305, 438/306, 307, 424, 595

[56] References Cited

U.S. PATENT DOCUMENTS

| | | | |
|---|---|---|---|
| 4,753,897 | 6/1988 | Lund et al. ........................ | 438/296 |
| 5,624,866 | 4/1997 | Kim .................................. | 438/296 |
| 5,877,066 | 3/1999 | Stolmeijer et al. ............... | 438/424 |
| 5,879,998 | 3/1999 | Krivokapic ...................... | 438/595 |

*Primary Examiner*—Chandra Chaudhari
*Attorney, Agent, or Firm*—Finnegan, Henderson, Farabow, Garrett & Dunner, L.L.P.

[57] ABSTRACT

A method of manufacturing a semiconductor device comprises the steps of forming a first film and a second film on a semiconductor substrate, selectively removing the second film, the first film and a top portion of the semiconductor substrate to form a first groove, burying a first insulator film in the first groove to form an isolation region, patterning the second film surrounded by the isolation region to form a dummy gate layer, doping the semiconductor substrate with an impurity using the dummy gate layer as a mask, forming a second insulator film on the semiconductor substrate surrounded by the dummy gate layer and the first insulator film, removing the dummy gate layer and the first film to form a second groove, forming a gate insulator film on the semiconductor substrate in the second groove, and forming a gate electrode on the gate insulator film in the second groove.

23 Claims, 42 Drawing Sheets

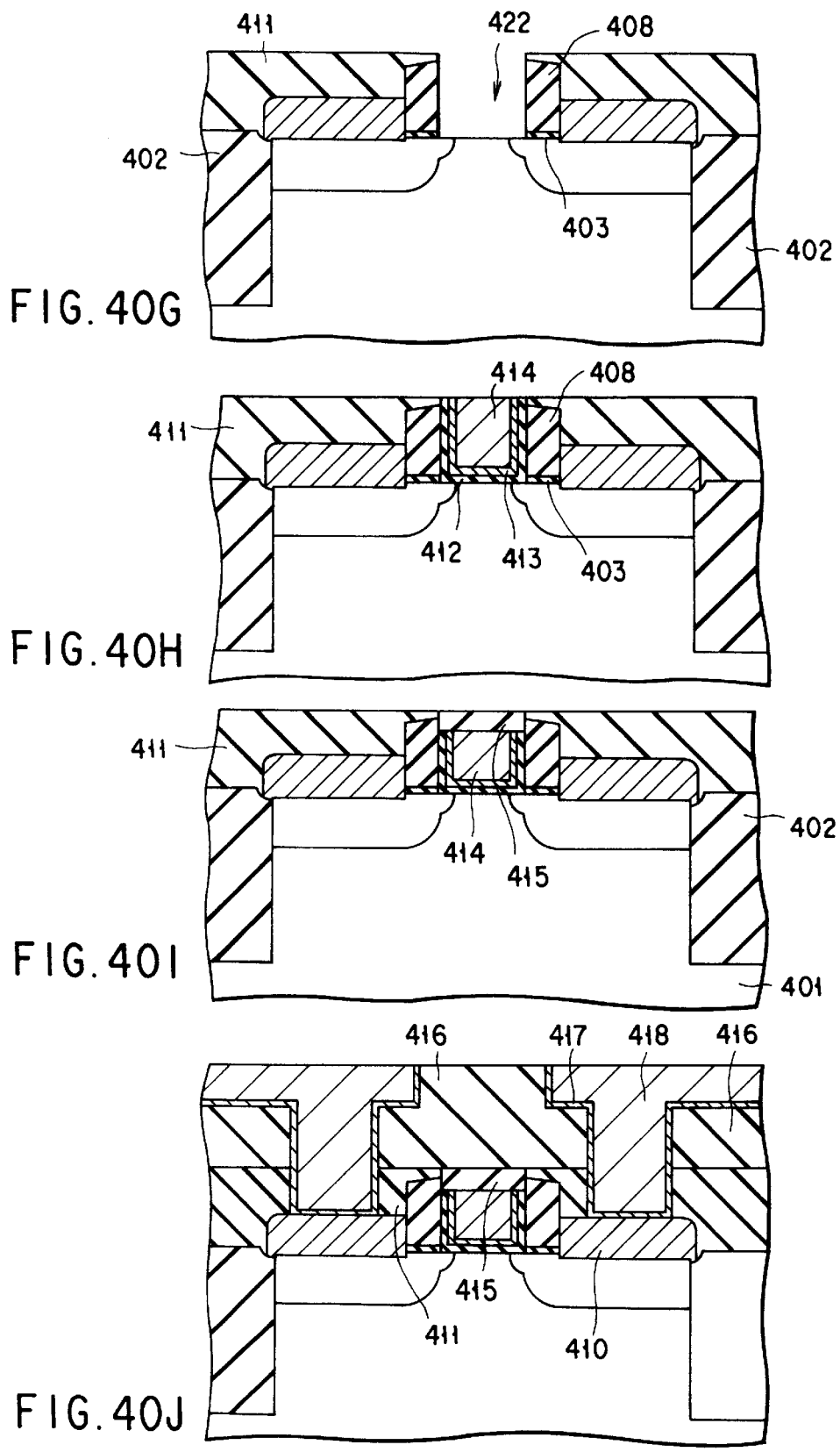

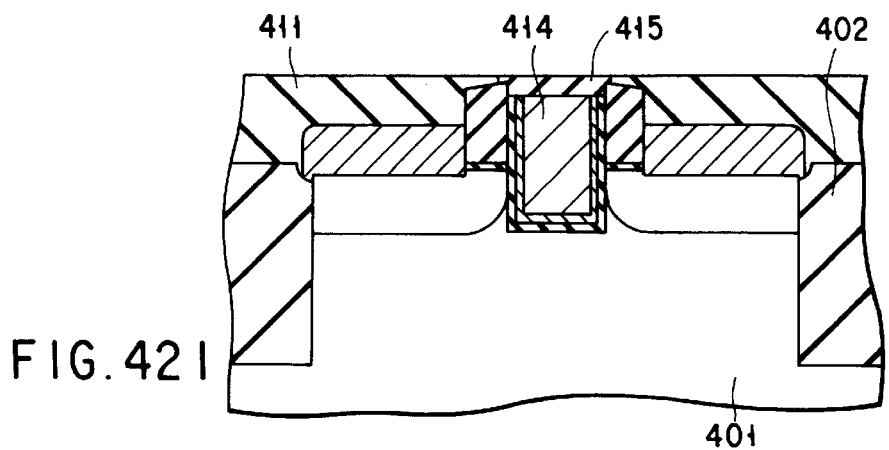
FIG.42I
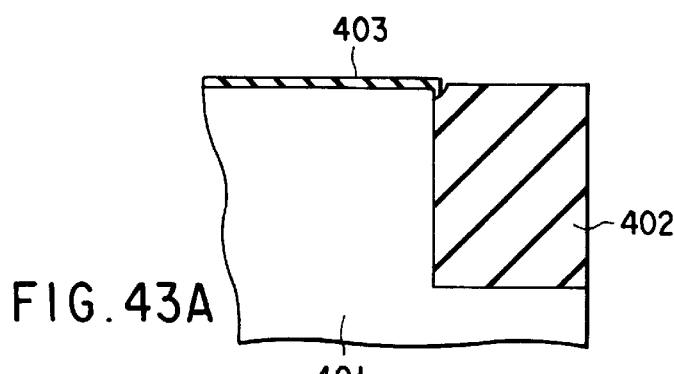
FIG.43A
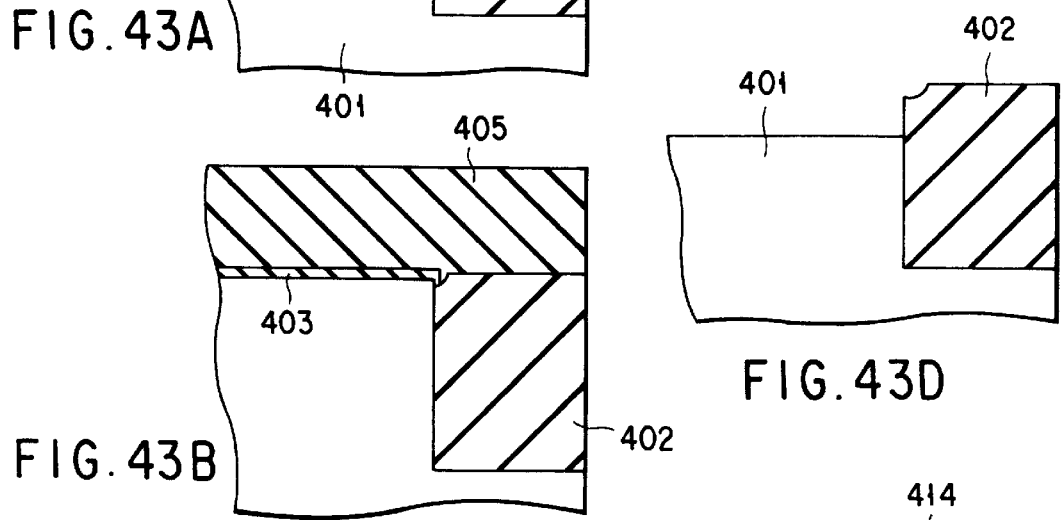
FIG.43B
FIG.43C
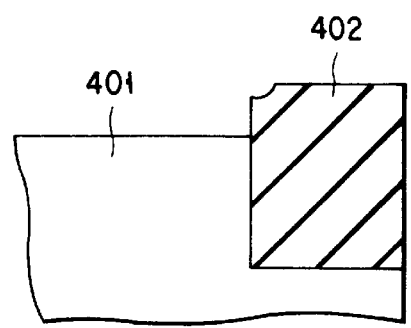
FIG.43D
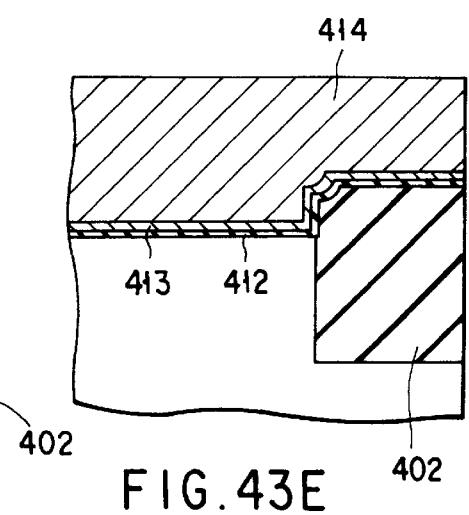
FIG.43E

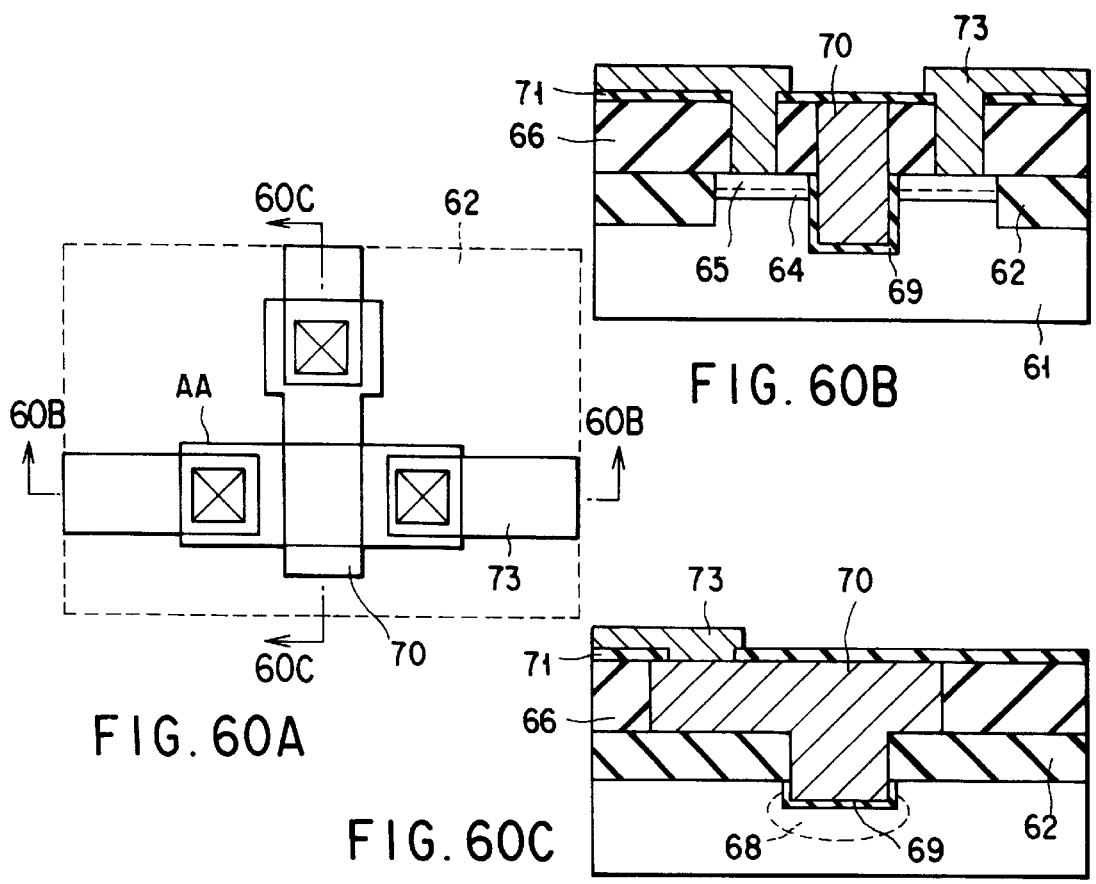
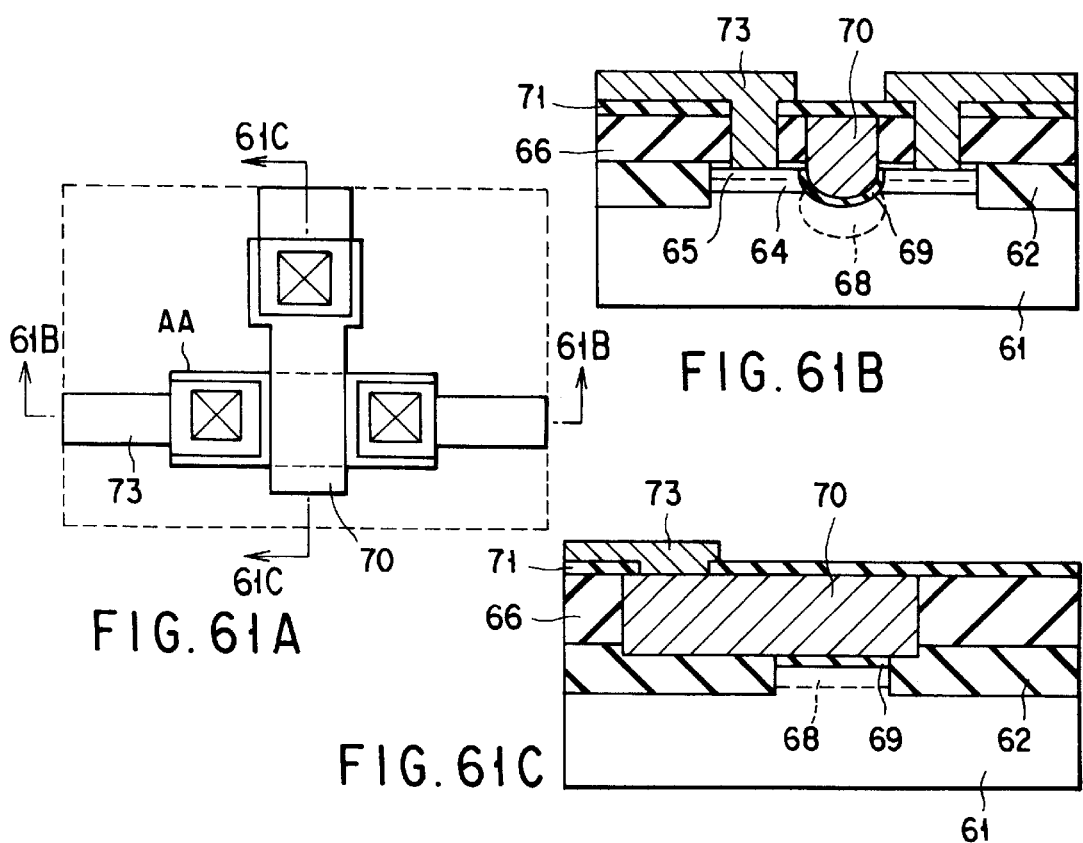

METHOD OF MANUFACTURING A SEMICONDUCTOR DEVICE WHICH INCLUDES FORMING A DUMMY GATE

BACKGROUND OF THE INVENTION

The present invention relates to a semiconductor device and a manufacturing method thereof, and, more particularly, to a manufacturing method of manufacturing a semiconductor device which includes a step of forming a dummy gate.

To implement a higher performance and lower cost of a semiconductor integrated circuit using MOS transistors, miniaturization of devices is important. The miniaturization of devices, which can be accomplished by using the STI (Shallow Trench Isolation) technique, faces a problem of an increased wiring resistance. To overcome this problem, a scheme of reducing the wiring resistance using a metal material of a low resistance for the gate electrode has been proposed.

In a conventional case where a source/drain region is formed after forming a gate insulator film and a gate electrode, a high temperature treatment and thermal oxidation are required, which raise such problems as the increased resistance of the metal electrode and deterioration of the reliability of the gate insulator film.

As means of overcoming those problems, a step of forming a source/drain region, which involves a high temperature treatment, is carried out prior to burying the gate insulator film and gate electrode in a groove which is self-aligned with the source/drain region.

Referring to FIGS. 1A through 1I, 2A and 2B, one example of this technique (Jpn. Pat. Appln. No. 8-356493) will be discussed below. FIGS. 1A through 1I illustrate the cross-section of a transistor in a gate length direction (channel length direction), and FIGS. 2A and 2B illustrate the cross-section of the transistor in a gate width direction (channel width direction).

First, using the shallow trench isolation (STI) technique, a transistor-forming region 502 and an isolation region 503 are formed on an Si substrate 501 (FIGS. 1A and 2A).

Next, an $SiO_2$ film 504 of about 10 nm in thickness is formed on the exposed surface of the Si substrate 501, and a poly Si film for a dummy gate pattern is deposited about 300 nm thick on this $SiO_2$ film 504 and is processed to form a dummy gate pattern 505 using, for example, lithography and RIE (FIG. 1B).

Then, with the dummy gate pattern 505 used as a mask, phosphorous ions, for example, are injected in a device region surrounded by the isolation region 503 to form an $n^-$ type diffusion region 506 (FIG. 1C).

After an $Si_3N_4$ film is deposited on the entire surface, RIE is performed on the entire surface to form an $Si_3N_4$ film 507 with a thickness of approximately 20 nm on the side wall of the dummy gate pattern 505 (FIG. 1D).

Then, with the dummy gate pattern 505 and the $Si_3N_4$ film 507 used as masks, arsenic ions, for example, are injected in the $n^-$ type diffusion region 506, forming an $n^+$ type diffusion region 508, thus forming or a so-called LDD (Lightly Doped Drain) structure (FIG. 1E).

Next, a CVD-$SiO_2$ film 509 is deposited, for example, about 300 nm thick on the entire surface, and is densified for approximately 30 minutes in the $N_2$ atmosphere at about 800° C., after which the entire surface is flattened by CMP (Chemical Mechanical Polishing) to expose the surface of the dummy gate pattern 505 (FIG. 1F).

Then, the dummy gate pattern 505 is selectively removed to form a groove 510, after which with a resist film (not shown) formed on a desired region, an interlayer film ($SiO_2$ film 509) and a sidewall insulator film ($Si_3N_4$ film 507) used as masks, ion injection is carried out only in the channel reserved region under the groove 510. The activation of this channel impurity is implemented by a heat treatment at 800° C. for about 10 seconds using RTA, for example, thereby forming a channel impurity region 511 (FIG. 1G).

Then, the $SiO_2$ film 504 at the bottom of the groove 510 is removed (FIGS. 1H and 2B).

Next, a high dielectric film, such as a $Ta_2O_5$ film, is deposited about 20 nm thick as a gate insulator film 512 on the entire surface, followed by deposition of a metal film of Ru or the like on the entire surface as a gate electrode 513. Thereafter, CMP is performed on the entire surface to leave the metal electrode 513 and the high-dielectric gate film 512 buried in the groove 510 (FIG. 1I).

Thereafter, after an $SiO_2$ film is deposited about 200 nm thick as an interlayer insulator film on the entire surface, contact holes to the source and drain regions and the gate electrode are formed in the interlayer insulator film, then an Al layer is formed on the entire surface and patterned to form Al wiring. Then, a passivation film is deposited on the entire surface, which completes the basic structure of a transistor.

Since this method however exposes the end portions of the isolation region twice as shown in FIGS. 2A and 2B, etching with, for example, a fluorine-based etching solution would form large dents at those portions, thus exposing the edge corners of the device region. As a result, an electric field is concentrated on the edge corners, resulting in deterioration of the transistor characteristics, such as a lower reliability of the gate insulator film.

In the conventional transistor manufacturing method which forms a source/drain region using a dummy gate pattern and then forming a gate insulator film and a gate electrode in a groove formed by removing the dummy gate pattern, large dents are formed at the edge corners of the isolation region, exposing the edge corners of the device region, so that an electric field is concentrated on the edge corners, deteriorating the transistor characteristics.

A description will now be given of other problems of a manufacturing process for an MOS transistor using a dummy gate.

The first problem will be discussed below.

In a manufacturing process for MOS transistor to be used in a DRAM or the like, as shown in FIG. 3A, a sidewall insulator film 507 having an etching-resistive property is formed on the side surface of a dummy gate 505, so that even with slight misalignment at the time of forming contact holes to the gate electrode and the source and drain regions in an interlayer insulator film which will be formed later, the sidewall insulator film 507 prevents the gate electrode and the source/drain region from being short-circuited and thus improves the integration density.

In a manufacturing process for damascene gate transistors, conventionally, to form the sidewall insulator film 507 on the side surface (where an oxide film is formed) of the dummy gate 505, which is comprised of an amorphous silicon film 505a and a silicon nitride film 505b, the height of the sidewall insulator film 507 should be controlled by RIE that is carried out to form the sidewall insulator film 507, at the time of performing CMP on the interlayer insulator film, so that the sidewall insulator film 507 will not be exposed when the CMP is completed.

When the sidewall insulator film 507 is exposed upon completion of CMP as shown in FIG. 3B, however, the sidewall insulator film 507 may be removed at the time of removing the dummy gate 505 as shown in FIG. 3C. That is, the margin for a fluctuation in etching result was low.

In the case of ordinary transistors, when a silicon nitride film is used as an etching stopper to be formed on the gate electrode and the sidewall insulator film 507 of the gate electrode, the parasitic capacitance may not become low enough to meet the requirements of ultra-miniaturization and fast operation because the dielectric constant of the silicon nitride film is not so low.

The second problem will be discussed below.

In the manufacturing process for damascene gate transistors, since the dummy gate also serves as a CMP stopper at the time of flattening the interlayer insulator film, the silicon nitride film 505b is used for the dummy gate (FIG. 4A) as in the example illustrated in FIGS. 3A–3C. Normally, a silicon nitride film 520 is a typical liner to be formed on the side wall of the dummy gate 505. In the case of damascene gate transistors, however, the gate liner 520 is also etched at the time of removing the dummy gate.

Thereafter, at the time of the polycrystalline or amorphous silicon film 505a, the lower layer of the dummy gate, is removed (FIG. 4C), and removing the silicon oxide film 504 which has been used as a buffer, the upper portion of the groove where the gate is to be formed becomes widened by the size t of the dummy gate 505 due to no liner or silicon nitride film 520 present (FIG. 4D).

The finer the miniaturization of individual semiconductor devices in a semiconductor integrated circuit becomes and the higher the integration gets, the larger the memory capacity can become. The above-described prior art however sets the size of actual completed transistors wider than the designed width of the dummy gate, which is disadvantageous for device miniaturization.

If the thickness of the buffer oxide film of the dummy gate is 10 nm and the width of the liner of the silicon nitride film is 15 nm, for example, the transistor size becomes 28 nm, which is 15 nm, the designed gate size the liner thickness, plus the widened amount of 10 nm×1.3=13 nm of the buried insulator film around the gate at the time the buffer oxide film is separated. For transistors of the 0.1 μm generation, this means that the portion where the gate lines run adjacent to one another becomes narrower by 28 nm×2=56 nm with respect to the distance of 0.2 μm between gate lines. This is disadvantageous in implementing a high-frequency operation in consideration of the interline capacitance.

The wider transistor size also reduces a margin for patterning the interlayer insulator film for forming contacts in the source and drain regions, so that the minimum design size should be set larger accordingly, which is also disadvantageous in implementing a higher integration density.

To overcome the widening of the upper portion of the gate line, overetching should be performed by CMP or the like to the level where the gate's groove is not widened. This cannot ensure a sufficient gate height; in a case where the dummy gate is comprised of a polycrystalline film of 200 nm in thickness and a silicon nitride film of 200 nm in thickness, for example, the gate height after the formation of the gate becomes very low. Consequently, the resistance of the gate line becomes higher, resulting in increased dissipation power and impaired dielectric characteristic.

The third problem will be discussed below.

Miniaturization of, particularly, MOSFET devices using silicon has rapidly progressed since the use of polycrystalline silicon as a material for the gate electrode. The manufacturing process for metal gate transistors which had been used before the use of polycrystalline silicon will be discussed below with reference to FIGS. 5A to 5D.

First, an isolation region 602 and a p-type diffusion layer 603 are formed on a silicon substrate 601 (FIG. 5A). Then, with a photoresist 604 as a mask, ions of an n-type impurity like arsenic are injected to form an n-type diffusion layer (source/drain region) 605 (FIG. 5B).

After the impurity doped in the n-type diffusion layer (source/drain region) 605 is activated by a heat treatment at 900° C. or higher, the surface of the silicon substrate 601 is oxidized by thermal oxidation, forming a silicon oxide film 606 on which a metal layer 607 of aluminum or the like is deposited. This metal layer 607 is so patterned by photolithography as to leave the area surrounded by the n-type diffusion layer (source/drain region) 605, thus forming a metal gate electrode 607.

Finally, an insulator film 608 such as a silicon oxide film is deposited on the entire surface, contact holes are bored, and a metal wiring layer 609 is formed, thus completing a transistor.

This process requires that steps up to the activation of the source/drain diffusion layer 605 should be finished before forming the metal gate electrode 607, so that the positional relation between the source/drain diffusion layer 605 and the gate electrode 607 is determined by the photolithography step. As shown in FIG. 5C, therefore, the source/drain diffusion layer 605 and the gate electrode 607 need to be overlap each other by the alignment margin "d" in the photolithography step. Because this process cannot employ a so-called LDD structure which has a lighter impurity concentration of the diffusion layer at the gate's edge portions at a shallower depth, it is difficult to suppress a short channel effect.

Because of those reasons, polycrystalline silicon which has a higher heat resistivity and is easier for microprocessing than metal like aluminum has been used for the gate electrode. One example of a manufacturing method for transistors using polycrystalline silicon for the gate electrode will now be described referring to FIGS. 6A through 6D.

First, an isolation region 702 and a p-type diffusion layer 703 are formed on a silicon substrate 701 (FIG. 6A).

Next, the surface of the silicon substrate 701 is oxidized by thermal oxidation, forming a silicon oxide film 704 on which a polycrystalline silicon layer 705 is deposited. This polycrystalline silicon layer 705 is patterned by photolithography to form a gate electrode 705, and the surface of the silicon substrate 701 and the area around the polycrystalline silicon layer 705 are oxidized by thermal oxidation, forming a silicon oxide film 706. Then, ion injection of an n-type impurity like arsenic is carried out and the impurity is activated by a heat treatment at 900° C. or higher to form a shallow n-type diffusion layer (LDD region) 707 with a relatively low impurity concentration (FIG. 6B).

An insulator film like a silicon oxide film is deposited on the entire surface, after which anisotropic etching is performed to form a silicon oxide side wall 708 on the side wall of the polycrystalline silicon gate electrode 705. With the gate electrode 705 and the silicon oxide side wall 708 used as masks, ion injection and activation of the impurity by a heat treatment at 900° C. or higher are implemented again, forming an $n^+$ impurity diffusion layer (source/drain region) 709, and the polycrystalline silicon gate electrode 705 is doped to an $n^+$ type (FIG. 6C).

Finally, an insulator film 710 such as a silicon oxide film is deposited on the entire surface, contact holes are bored, and a metal wiring layer 711 is formed, thus completing a transistor (FIG. 6D).

This process, as compared with the process illustrated in FIGS. 5A–5D, not only improves the processability of the gate electrode but can also ensure self-alignment of the gate electrode and the source/drain diffusion layer because ion injection and activation of the impurity can be carried out with the polycrystalline gate electrode used as a mask, thus requiring no margin for the alignment in the photolithography step. Further, it is easy to use a so-called LDD structure which has a lighter impurity concentration of the diffusion layer at the gate's edge portions at a shallower depth, as a measure against a short channel effect which is originated from miniaturization of devices.

As the recent device miniaturization progresses to fabricate transistors with a gate length of 0.1 μm or shorter, however, the parasitic resistance of the polycrystalline silicon gate electrode becomes too large to be neglected, deteriorating the device performance. To overcome this problem, a low-resistance material should be used for the gate electrode and its use for the gate electrode becomes desirable again. Since the manufacturing method as shown in FIGS. 5A–5D has a difficulty in manufacturing ultra-small devices as mentioned earlier, there is a demand for a process which can ensure self-alignment of the source/drain diffusion layer and forms the gate electrode after activation of the source/drain diffusion layer is completed.

Although the silicon oxide film formed by thermal oxidization has been used as the gate insulator film in today's transistors, the generation of transistors with a gate length of 0.1 μm or shorter requires a very thin gate insulator film, 5 nm or thinner, so that the tunnel current may be produced. To overcome this problem, a high-dielectric film like a tantalum oxide film ($Ta_2O_5$) which has a higher dielectric constant than the silicon oxide film should be used to increase the physical film thickness. Even this high-dielectric film like a tantalum oxide film should avoid a heat treatment for impurity activation from the viewpoint of the heat resistivity. It is therefore desirable to form the gate insulator film after forming the source/drain diffusion layer.

To meet those requirements, a transistor manufacturing process as illustrated in FIGS. 7A to 7H has been proposed.

An isolation region 802 and a p-type diffusion layer 803 are formed on a silicon substrate 801 (FIG. 7A).

Then, the surface of the silicon substrate 801 is oxidized by thermal oxidization to form a silicon oxide film 804 on which a silicon nitride film 805 is deposited and patterned to form a dummy gate electrode. with this dummy gate 805 used a mask, ions of an n-type impurity like arsenic are injected in the p-type diffusion layer 803 and the impurity is activated by a heat treatment at 900° C. or higher, forming an n⁻ type LDD diffusion layer 806 (FIG. 7B).

A silicon oxide film is deposited on the entire surface and anisotropic etching is carried out to form a silicon oxide side wall 807 on the side wall of the dummy gate 805 of silicon nitride. With the gate electrode 805 and the silicon oxide side wall 807 used as masks, ion injection and activation of the impurity by a heat treatment at 900° C. or higher are implemented again, forming an n⁺ impurity diffusion layer (source/drain region) 808 (FIG. 7C).

Next, a silicon oxide film 809 is deposited on the entire surface and is polished to be flattened by using the dummy gate 805 of silicon nitride as a stopper. Silicon nitride is desirable as a material for the dummy gate, which is used as a stopper in polishing the silicon oxide film 809 (FIG. 7D).

The exposed silicon nitride film 805 is removed by a treatment using hot phosphorus or the like, thereby forming a groove in the gate-electrode forming region (FIG. 7E).

Further, the silicon oxide film 804 remaining in the groove is etched out by hydrofluoric acid or the like, exposing the surface of the silicon substrate 801 (FIG. 7F).

A high-dielectric film 810 like tantalum oxide film is deposited on the entire surface, then a titanium nitride film 811 as a diffusion barrier layer and an aluminum layer 812 as the gate electrode are deposited, the aluminum film and the titanium nitride film located outside the groove are removed by CMP or the like (FIG. 7G).

A silicon oxide film 813 is deposited on the entire surface, then contact holes are bored and a metal wiring layer 814 is formed, completing a transistor (FIG. 7H).

The above-described process can form the gate electrode of a low-resistance metal after forming the source/drain diffusion layer and can self-align the source/drain diffusion layer and the gate electrode.

This process however causes the width (L') of the groove to become wider than the size (L) of the dummy gate pattern, initially formed by miniaturization, at the time of removing the dummy gate 805 and exposing the silicon substrate 801 as shown in FIG. 7F. This makes it difficult to form ultra-small gates. This problem appears to be able to be overcome by using an insulator material which has an etching selectivity with the silicon nitride film, the material for the dummy gate 805, and the silicon oxide film 804 underlying the lower portion of the dummy gate electrode, for the sidewall insulator film 807 and the buried material 810 around the dummy gate pattern. The new use of a material having such a property in the semiconductor manufacturing process involves significant difficulty.

In a MOS transistor which uses a silicon oxide film ($SiO_2$ film) as a gate oxide film, making the gate oxide film thinner plays an important role in suppressing the short channel effect of the transistor. Making the gate oxide film thinner than the level at which direct tunneling occurs (e.g., a thickness smaller than about 3 nm) is considered inappropriate from the viewpoint of the reliability of transistors.

The conventional polycide gate structure (the lamination of a polysilicon film and a silicide film), as the width of the gate electrode becomes narrower, the thickness of the gate electrode becomes thicker, undesirably increasing the steps of the gate electrode.

As solutions to those shortcomings, various schemes have been proposed, such as the use of a metal gate electrode and the use of a high-dielectric film like a $Ta_2O_5$ film to reduce the equivalent thickness of the oxide film while suppressing the leak current (direct tunneling).

However, the metal gate electrode is not a good choice in view of the heat resistivity. An MOS transistor using a high-dielectric film as the gate insulator film faces the following problems.

Through a high-temperature treatment at 800 to 1000° C. after the formation of the gate insulator film (high-dielectric film) (e.g., formation of the source/drain diffusion layer or reflowing of the interlayer insulator film), the interface reaction between the silicon substrate and the gate insulator film or the interface reaction between the gate insulator film and the gate electrode occurs.

It is however difficult for the gate insulator film (high-dielectric film) to endure such a high-temperature treatment. This results in deterioration of the gate insulator film, making it difficult to provide MOS transistors with good electric characteristics.

As another solution has been proposed an MOS transistor with a groove channel structure (e.g., in "Groove Gate MOSFET," 8th Conf. On Solid State Device, pp. 179–183, 1976 by Nishimatsu et al.).

FIG. 8 shows the cross section of a conventional MOS transistor with a groove channel structure. In the diagram, "901" is a p-type silicon substrate, "9022 is an isolation region (STI), "9032 is a gate insulator film, "904" is an LDD, "905" is a source/drain diffusion layer with a high impurity concentration, "906" is an interlayer insulator film, "970" is a gate electrode (polysilicon film) and "908" is a source/drain line electrode.

In this type of MOS transistor, as the gate electrode 907 extends over the source/drain diffusion layer 905, it is necessary to prevent the gate electrode 907 and the source/drain line electrode 908 from being short-circuited due to, for example, misalignment.

This may be avoided by putting some distance between the gate electrode 907 and the source/drain line electrode 908, which however becomes a bottleneck in ultra-miniaturization of devices.

Because the silicon surface of the recess which is formed by etching the silicon substrate 901 is used as a channel, an etching damage should be removed. As it is difficult to remove such an etching damage, the device characteristics will not be improved as expected.

In the conventional MOS transistor with a groove channel structure, as apparent from the above, the gate electrode extends over the source/drain diffusion layer, it is necessary to put some distance between the gate electrode and the source/drain line electrode, which makes ultra-miniaturization of devices difficult.

With the conventional gate structure of polycide (lamination of a polysilicon film and a silicide film), as the width of the gate electrode becomes narrower, the thickness of the gate electrode is increased to reduce the wiring resistance of the gate electrode. As the size of the gate electrode in the direction of the channel length (L) becomes smaller, therefore, the step of the gate electrode increases. This raises such a problem that the aspect ratio of a contact hole becomes larger at the time of forming the contact hole in the gate electrode.

BRIEF SUMMARY OF THE INVENTION

Accordingly, it is a primary object of the present invention to provide a manufacturing method for a semiconductor device which can suppress local concentration of an electric field on edge corner portions of a device region, thereby preventing deterioration of the characteristic of a transistor.

It is another object of this invention to provide a manufacturing method for a semiconductor device which has a wider margin against a variation at the time of forming a side wall on the side wall of a gate electrode to thereby ensure manufacturing of semiconductor devices with a high yield.

It is a different object of this invention to provide a manufacturing method for a semiconductor device which prevents a groove from becoming wider at the time of removing a dummy gate layer to thereby ensure manufacturing of fine semiconductor devices.

It is a further object of this invention to provide a manufacturing method for a semiconductor device which can fabricate fine semiconductor devices without increasing the parasitic capacitance of each device.

It is still further object of this invention to provide a semiconductor device whose gate electrode has a reduced resistance and in which a step formed by the gate electrode is suppressed.

According to this invention, there is provided a method of manufacturing a semiconductor device comprising the steps of forming a first film and a second film on a semiconductor substrate; selectively removing the second film, the first film and a top portion of the semiconductor substrate to form a first groove; burying a first insulator film in the first groove to form an isolation region; patterning the second film surrounded by the isolation region to form a dummy gate layer; doping the semiconductor substrate with an impurity using the dummy gate layer as a mask; forming a second insulator film on the semiconductor substrate surrounded by the dummy gate layer and the first insulator film; removing the dummy gate layer and the first film to form a second groove; forming a gate insulator film on the semiconductor substrate in the second groove; and forming a gate electrode on the gate insulator film in the second groove.

According to this invention, there is provided a method of manufacturing a semiconductor device comprising the steps of forming a gate insulator film and a first conductive film on a semiconductor substrate; selectively removing the first conductive film, the gate insulator film and a top portion of the semiconductor substrate to form a first groove; burying a first insulator film in the first groove to form an isolation region; forming a dummy film on the first conductive film and the isolation region; patterning the dummy film and the first conductive film to form an island-like layer; doping the semiconductor substrate with an impurity using the island-like layer as a mask; forming a second insulator film on the gate insulator film surrounded by the island-like layer and the first insulator film; removing the dummy film to form a second groove; and forming a second conductive film on the first conductive film in the second groove to form a gate electrode comprised of the first conductive film and the second conductive film.

According to this invention, there is provided a method of manufacturing a semiconductor device comprising the steps of forming a first groove in a semiconductor substrate; burying a first insulator film in the first groove to form an isolation region; forming a first film and a second film on a surface of the semiconductor substrate surrounded by the isolation region; patterning the second film to form a dummy gate layer; doping the semiconductor substrate with an impurity using the dummy gate layer as a mask; forming a second insulator film on the first film surrounded by the dummy gate layer and the first insulator film; removing the dummy gate layer and the first film to form a second groove; forming a gate insulator film on the semiconductor substrate in the second groove; and forming a gate electrode on the gate insulator film in the second groove.

According to this invention, there is provided a method of manufacturing a semiconductor device comprising the steps of forming a dummy gate layer on a semiconductor substrate; forming a dummy side wall on a side surface of the dummy gate layer; depositing an interlayer insulator film on an entire surface; removing the interlayer insulator film until a top surface of the dummy gate layer is exposed; removing the dummy gate layer to form a groove; forming a gate electrode on a bottom surface of the groove; removing the dummy side wall to form a cavity; and burying a sidewall material in the cavity to form a side wall.

According to this invention, there is provided a method of manufacturing a semiconductor device comprising the steps of forming a gate insulator film on a semiconductor substrate; forming a gate electrode on the gate insulator film; forming a dummy side wall on a side surface of the gate electrode; depositing an interlayer insulator film on an entire surface; removing the interlayer insulator film until a top surface of the gate electrode is exposed; removing the dummy side wall to form a cavity; and burying a sidewall material in the cavity to form a side wall.

According to this invention, there is provided a method of manufacturing a semiconductor device comprising the steps of forming a dummy gate layer on a semiconductor substrate; forming a sidewall insulator film on a side surface of the dummy gate layer, the sidewall insulator film having an etching selectivity with a material for forming the dummy gate layer; depositing an interlayer insulator film on an entire surface; removing the interlayer insulator film until a top surface of the dummy gate layer is exposed; removing the dummy gate layer to form a groove; forming a gate insulator film on a bottom surface of the groove; and forming a gate electrode in the groove on whose bottom surface the gate insulator film is formed.

According to this invention, there is provided a semiconductor device comprising a semiconductor substrate; a gate insulator film formed on the semiconductor substrate; a gate electrode formed on the gate insulator film; an insulator layer formed on a side surface of the gate electrode and consisting of a same material as the gate insulator film; and a silicon nitride film formed on the insulator layer.

According to this invention, there is provided a method of manufacturing a semiconductor device comprising the steps of forming a dummy gate comprised of a first silicon nitride film, on a semiconductor substrate; forming a first silicon oxide film on an entire surface of the semiconductor substrate having the first silicon nitride film formed thereon; forming a second silicon nitride film on an entire surface of the first silicon oxide film; forming an interlayer insulator film on an entire surface of the second silicon nitride film; polishing the interlayer insulator film until the dummy gate is exposed; removing upper portions of the first and second silicon nitride films to form a first groove; burying a second silicon oxide film in the first groove; performing anisotropic etching on the second silicon oxide film to expose the dummy gate while leaving the second silicon oxide film remaining on the second silicon nitride film; removing the dummy gate to form a second groove; forming a gate insulator film on a bottom surface and a side surface of the second groove; and forming a gate electrode in the second groove on whose bottom surface and side surface the gate insulator film is formed.

According to this invention, there is provided a semiconductor device comprising a semiconductor substrate; a gate insulator film formed on a bottom surface and a side surface of a groove formed in the semiconductor substrate; a gate electrode having a lower portion buried in the groove on whose bottom surface and side surface the gate insulator film is formed, and an upper portion protruding from a surface of the semiconductor substrate; and a source region and a drain region formed on a surface region of the semiconductor substrate in such a way as to sandwich the gate electrode, whereby a thickness of the upper portion of the gate electrode protruding from the surface of the semiconductor substrate is equal to or greater than twice a thickness of the lower portion of the gate electrode buried in the groove.

According to this invention, there is provided a semiconductor device comprising a semiconductor substrate; a gate insulator film formed on a bottom surface and a side surface of a groove formed in the semiconductor substrate; a gate electrode having a lower portion buried in the groove on whose bottom surface and side surface the gate insulator film is formed, and an upper portion protruding from a surface of the semiconductor substrate; and a source region and a drain region formed on a surface region of the semiconductor substrate in such a way as to sandwich the gate electrode, wherein the semiconductor device satisfies an equation $$L+Xj-t_{OX}<H<3.125 \times L_{gate}+Xj-t_{OX}$$

where L is a channel length of a channel region formed along the groove, $t_{OX}$ is a thickness of the gate insulator film, H is a thickness of the gate electrode and $L_{gate}$ is a length of the gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 40A through 40J are cross-sectional views in a channel length direction illustrating a manufacturing process for a semiconductor device according to a first specific example of fourth embodiment;

FIGS. 42A through 42I are cross-sectional views in a channel length direction illustrating a manufacturing process for a semiconductor device according to a second specific example of the fourth embodiment;

FIGS. 43A through 43E are cross-sectional views in a channel width direction showing the manufacturing process for a semiconductor device according to the second specific example of the fourth embodiment;

FIGS. 60A through 60C are a plan view and cross-sectional views showing an MOS transistor with a groove type channel structure according to a sixteenth embodiment;

FIGS. 61A through 61C are a plan view and cross-sectional views showing an MOS transistor with a groove type channel structure according to a seventeenth embodiment;

DETAILED DESCRIPTION OF THE INVENTION

Figure 1A:
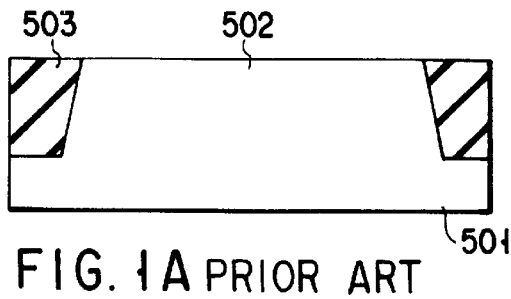
FIGS. 1A through 1I are cross-sectional views in a channel length direction showing a conventional process of manufacturing a semiconductor device using a dummy gate.
Figure 1F:
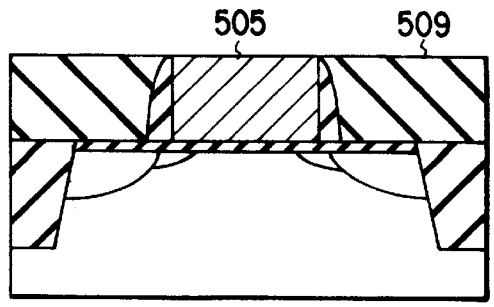
Figure 1B:
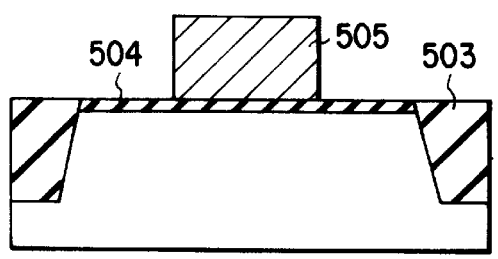
Figure 1G:
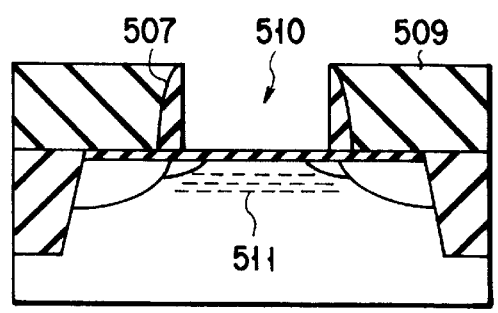
Figure 1C:
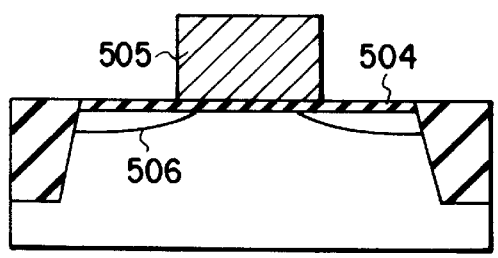
Figure 1H:
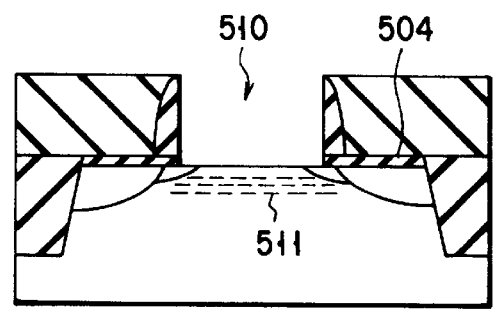
Figure 1D:
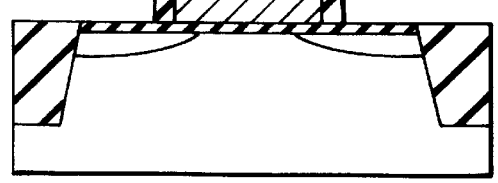

According to a first aspect of this invention, a method of manufacturing a semiconductor device comprising the steps of forming a first film and a second film on a semiconductor substrate; selectively removing top portions of the second film, the first film and the semiconductor substrate to form a first groove; burying a first insulator film in the first groove to form an isolation region; patterning the second film surrounded by the isolation region to form a dummy gate layer; doping the semiconductor substrate with an impurity using the dummy gate layer as a mask; forming a second insulator film on the semiconductor substrate surrounded by the dummy gate layer and the first insulator film; removing the dummy gate layer and the first film to form a second groove; forming a gate insulator film on the semiconductor substrate in the second groove; and forming a gate electrode on the gate insulator film in the second groove.

According to this method, exposure of the edge corners of the device region is suppressed, thus preventing the transistor characteristics from being deteriorated by the otherwise local concentration of an electric field on the edge corners. Further, as exposure of the substrate surface at the channel plane portion is suppressed, the roughness of the interface between the substrate and the gate insulator film is reduced, thus ensuring fast transistors.

In this case, the step of forming a wiring pattern to be connected to the gate electrode on the gate electrode and the first and second insulator films may be provided after the gate electrode forming step. Further, it is preferable to use a semiconductor film (silicon film), particularly, an amorphous silicon film, for at least part of the second film. The use of the silicon film can permit the dummy pattern to be removed with an excellent selectivity with respect to the silicon oxide film or the silicon nitride film or the like. Furthermore, the use of the amorphous silicon film can reduce a process variation at the time of processing the dummy pattern.

The dummy gate layer can take a multilayer structure, so that the upper layer of the lamination can be removed with the lower layer serving as a stopper at the time of removing the dummy gate layer. This facilitates removal of the dummy gate layer. Therefore, the first film can be formed thin to prevent a large dent from being formed at the edge portions of the isolation region at the time of removing the first film. It is thus possible to suppress exposure of the edge corners of the device region, thereby preventing the transistor characteristics from being deteriorated by the local concentration of an electric field on the edge corners.

According to a second aspect of this invention, a method of manufacturing a semiconductor device comprising the steps of forming a gate insulator film and a first conductive film on a semiconductor substrate; selectively removing top portions of the first conductive film, the gate insulator film and the semiconductor substrate to form a first groove; burying a first insulator film in the first groove to form an isolation region; forming a dummy film on the first conductive film and the isolation region; patterning the dummy film and the first conductive film to form an island-like layer; doping the semiconductor substrate with an impurity using the island-like layer as a mask; forming a second insulator film on the gate insulator film surrounded by the island-like layer and the first insulator film; removing the dummy film to form a second groove; and forming a second conductive film on the first conductive film in the second groove to form a gate electrode comprised of the first conductive film and the second conductive film.

According to this second aspect, exposure of the edge corners of the device region is suppressed, and the top surface of the dummy pattern can be flattened (dents on the device region can be eliminated), thus facilitating the subsequent steps and ensuring flattening of the gate line.

According to the first and second aspects, a sidewall insulator film higher than the surface of the semiconductor substrate may be formed on the side wall of the dummy gate layer or the island-like layer after the step of forming the dummy gate layer or after the step of forming the island-like layer. The formation of the sidewall insulator film which surrounds the device region can further suppress exposure of the edge corners of the device region at the time of removing the dummy gate layer or the dummy layer.

According to a third aspect of this invention, a method of manufacturing a semiconductor device comprising the steps of forming a first groove in a semiconductor substrate; burying a first insulator film in the first groove to form an isolation region; forming a first film and a second film on a surface of the semiconductor substrate surrounded by the isolation region; patterning the second film to form a dummy gate layer; doping the semiconductor substrate with an impurity using the dummy gate layer as a mask; forming a second insulator film on the first film surrounded by the dummy gate layer and the first insulator film; removing the dummy gate layer and the first film to form a second groove; forming a gate insulator film on the semiconductor substrate in the second groove; and forming a gate electrode on the gate insulator film in the second groove.

In this case, the dummy gate layer and the first film as well as the surface portion of the underlying semiconductor substrate can be removed in the step of forming the second groove. This can make the top surface of the removed semiconductor substrate (the top surface of the channel region lower than the top surface of the isolation region. As a result, exposure of the edge corners of the device region can be suppressed, thereby preventing the transistor characteristics from being deteriorated by the local concentration of an electric field on the edge corners.

A sidewall insulator film may be formed on the side wall of the dummy gate layer after the step of forming the dummy gate layer.

Various embodiments of the invention will be described below with reference to the accompanying drawings.

The first to fourth embodiments, which will be discussed shortly, relate to the manufacturing of a semiconductor device that suppresses the local concentration of an electric field on the edge corners of the device region.

First Embodiment

FIGS. 9A through 9I and FIGS. 10A through 10I are cross-sectional views showing a manufacturing process for a semiconductor device according to the first embodiment of the invention. FIGS. 9A–9I illustrate the cross-section of a transistor in a gate length direction, and FIGS. 10A–10I illustrate the cross-section of the transistor in a gate width direction.

Figure 9A:
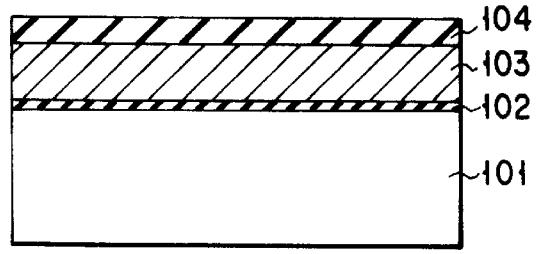
FIGS. 9A through 9I are cross-sectional views in a channel length direction showing a process of manufacturing a semiconductor device according to a first embodiment.
Figure 10A:
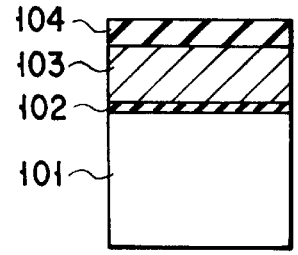
FIGS. 10A through 10I are cross-sectional views in a channel width direction depicting the manufacturing process for a semiconductor device according to the first embodiment.

First, an $SiO_2$ film 102 about 10 nm thick is formed on the surface of an Si substrate 101 by thermal oxidization or the like. Then, an amorphous Si film 103 and $Si_3N_4$ film 104 about 200 nm and 100 nm thick, respectively, are deposited on the $SiO_2$ film 102 by LPCVD. The amorphous Si film 103 may contain a donor such as phosphorus or arsenic (FIGS. 9A and 10A).

Figure 9B:
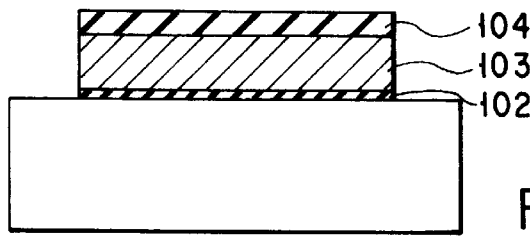
Figure 10B:
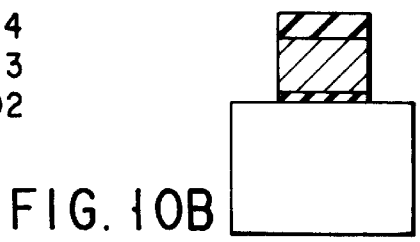

Next, the $SiO_2$ film, amorphous Si film 103 and $Si_3N_4$ film 104 are processed into an island-like pattern by, for example, lithography or RIE (FIGS. 9B and 10B).

Figure 9C:
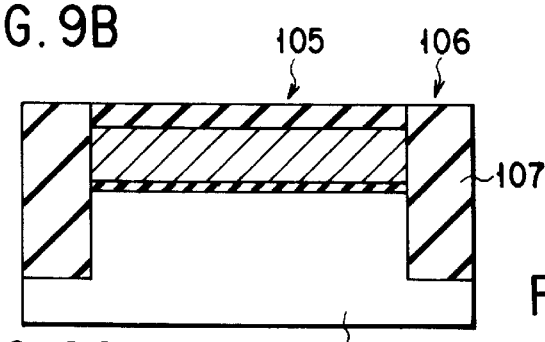
Figure 10C:
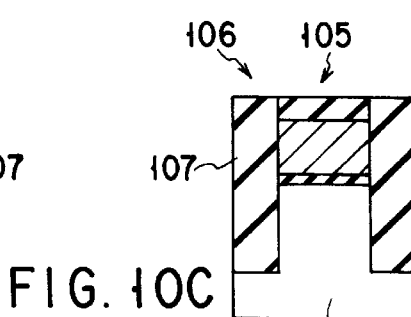

Then, the Si substrate 101 is etched by RIE, self-aligned with the previously formed island-like pattern forming islands 105 and a groove 106 for device isolation. Subsequently, an $SiO_2$ film (not shown) is formed on the surface of the groove by thermal oxidization. An $SiO_2$ film is buried in the groove 106 by, for example, LPCVD and CMP or the like, forming a buried isolation film 107. Alternatively, after thermal oxidization is performed or a thermal oxide film is separated by thin hydrofluorination or the like, a thin $Si_3N_4$ film (not shown) of about 10 nm thick may be deposited by LPCVD before formation of the buried isolation film 107. The $Si_3N_4$ film formed on the side walls of the groove 106 prevents the isolation edges from being exposed a dummy pattern is removed as will be discussed later. This improves the reliability of the device. As the channel width can be fixed, variation in the subsequent steps can be suppressed (FIGS. 9C and 10C).

Figure 9D:
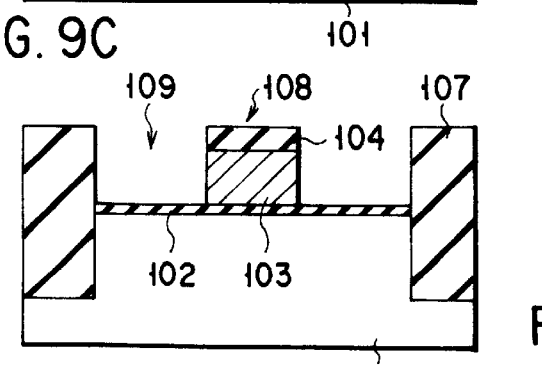
Figure 10D:
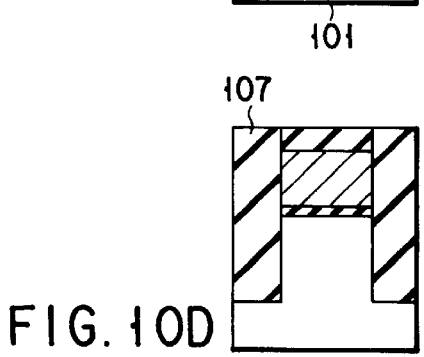

Then, the $Si_3N_4$ film 104 and the amorphous Si film 103 are removed in part by lithography and RIE or the like. A dummy gate electrode pattern 108 is thereby formed in a region reserved for a gate electrode, and grooves 109 are made on both sides of the pattern 108 (FIGS. 9D and 10D).

Figure 9E:
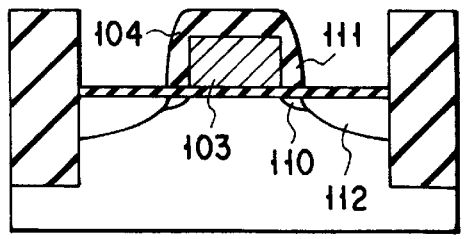
Figure 10E:
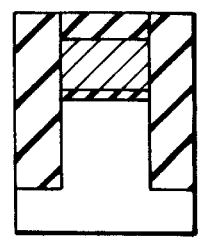

Next, with the dummy gate electrode pattern 108 used as a mask, ions of, for example, phosphorous are implanted at 70 KeV in a dose of approximately $4\times10^{13}$ cm$^{-2}$, forming an n$^-$ diffusion layer 110. Subsequently, an $Si_3N_4$ film is deposited on the entire surface. RIE is performed on the entire surface, forming a sidewall insulator film 111 about 20 nm thick on the side wall of the dummy gate electrode pattern 108. Then, with the dummy gate electrode pattern 108 and the sidewall insulator film 111 used as masks, ions of, for example, arsenic are implanted at 30 KeV in a dose of approximately $5\times10^{15}$ cm$^{-2}$. An n$^+$ diffusion layer 112, is thereby formed providing a so-called LDD structure (FIGS. 9E and 10E).

Figure 9F:
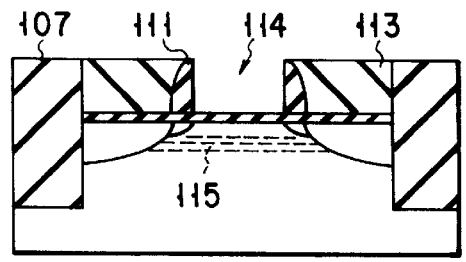
Figure 10F:
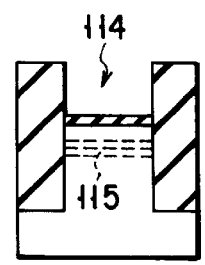

Next, a CVD-$SiO_2$ film, which will become an interlayer insulator film 113, is deposited on the entire surface, to a thickness of, for example, about 300 nm. The CVD-$SiO_2$ film is densified for approximately 30 minutes in the $N_2$ atmosphere at about 800° C. Then, the entire surface is made flat by CMP, exposing the surface of the amorphous Si film 103 of the dummy gate electrode pattern. The amorphous Si film 103 is selectively removed by means of RIE or by using a KOH solution or the like, thereby forming a groove 114. Then, a resist film (not shown) is formed on a desired region. With the resist film, the interlayer insulator film 113 ($SiO_2$ film) and the sidewall insulator film 111 used as masks, ions of an impurity are implanted into the channel region only. A channel impurity layer 115 is activated by a heat treatment at 800° C. for approximately 10 seconds using RTA, for example (FIGS. 9F and 10F).

Figure 9G:
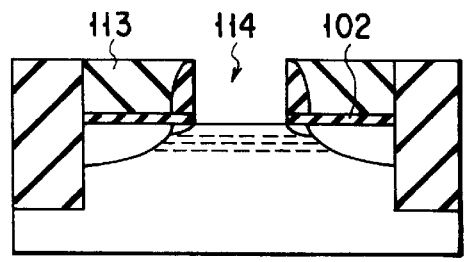
Figure 10G:
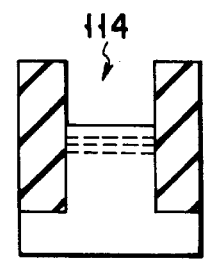

Then, the dummy insulator film 102 ($SiO_2$ film) is removed from the groove 114 (FIGS. 9G and 10G).

Figure 9H:
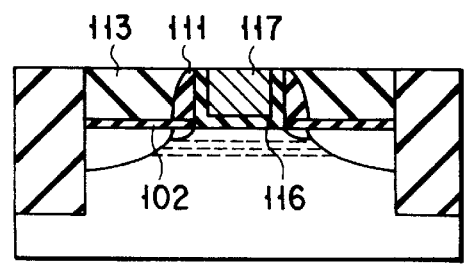
Figure 10H:
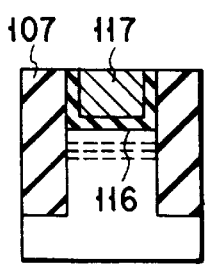

Subsequently, a high dielectric constant film of $Ta_2O_5$ or the like is deposited on the entire surface, to a thickness of about 20 nm, forming a gate insulator film 116. A metal film of, for example, Ru is deposited on the entire surface, providing a gate electrode 117. Thereafter, CMP is performed on the entire surface, burying the gate insulator film 116 and the gate electrode 117 in the groove 114 (FIGS. 9H and 10H).

Figure 9I:
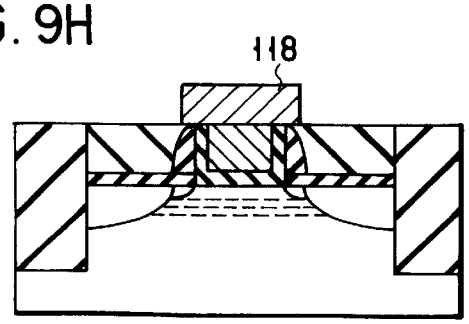
Figure 10I:
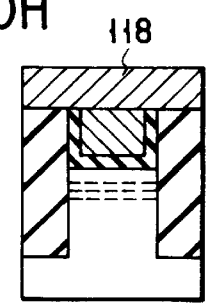

Next, a metal film, for example an Al film is deposited on the entire surface and is patterned into a wiring layer 118 (FIGS. 9I and 10I).

Thereafter, an $SiO_2$ film is deposited about 200 nm thick on the entire surface and used as an interlayer insulator film. Contact holes are made extending to the source/drain region and the gate electrode. Then, wiring patterning is performed and a passivation film is formed, providing the basic structure of a transistor.

In the above-described manufacturing method, the isolation edges of the channel region is exposed only once. Therefore a dent is hardly made between the device region on the Si substrate and the isolation film. This improves the reliability of the gate insulator film at the isolation edges. Since the surface of the silicon substrate is exposed only once even at the flat part of the channel, a high-speed transistor having a smooth interface between the silicon substrate and the gate insulator film can be provided.

Second Embodiment

A first example of the second embodiment will now be described with reference to FIGS. 11A through 11H, 12 and 13. FIGS. 11A–11H are cross-sectional views in the gate length direction (the cross section along line 11—11 in FIG. 13), showing a manufacturing process for a semiconductor device according to this specific example. FIG. 12 is a cross-sectional view in the gate width direction (the cross section along the line 12—12 in FIG. 13) and corresponds to FIG. 11H.

Figure 11A:
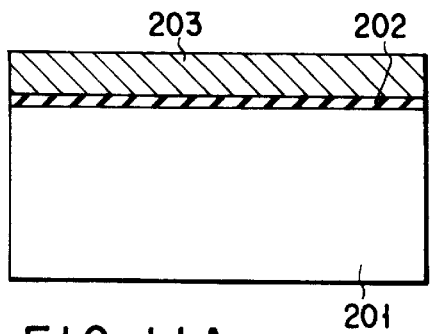
FIGS. 11A through 11H are cross-sectional views in a channel length direction showing a manufacturing process for a semiconductor device according to a first specific example of a second embodiment.
Figure 11E:
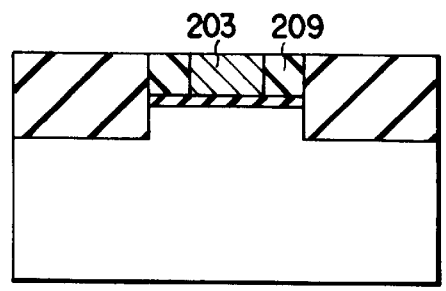
Figure 12:
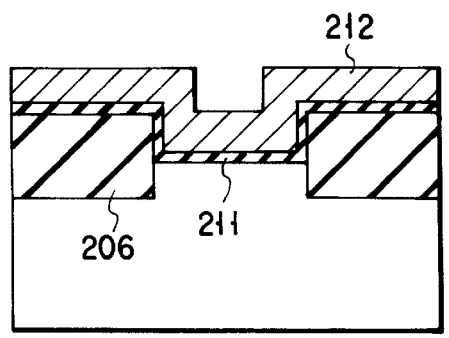
FIG. 12 is a cross-sectional view in a channel width direction corresponding to FIG. 11H.
Figure 13:
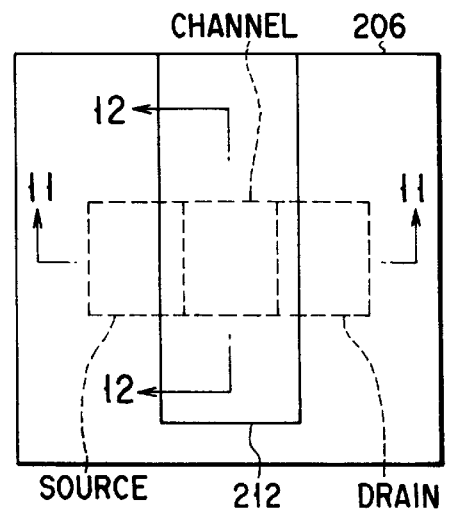
FIG. 13 is a plan view corresponding to FIG. 12.

First, an amorphous silicon film 203, which will be a dummy gate pattern, is deposited 100 nm thick on a buffer oxide film 202, which has been formed on a silicon substrate 201 (FIG. 11A).

Figure 11B:
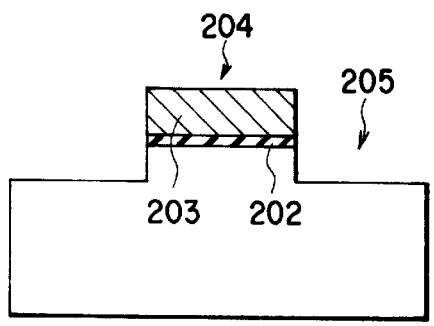

Next, a resist pattern (not shown) for forming a device region is formed. With the resist pattern used as a mask, the amorphous silicon film 203, buffer oxide film 202 and silicon substrate 201 are etched by RIE, forming lands 204 to be device regions and making a groove 205 to be an isolation region (FIG. 11B).

Next, a buried insulator film 206 is deposited on the entire surface. The resultant structure is made flat by CMP or the like at the top surface of the amorphous silicon film 203, thereby burying the isolation region. The amorphous silicon film 203 is not removed here. Hence, the corner portions of the device region are not exposed (FIG. 11C).

Then, a gate resist pattern (not shown) is formed. RIE or the like is performed with this resist pattern used as a mask, forming a dummy gate pattern 207 and a groove 208. With the dummy gate pattern 207 as a mask, ions of an impurity are implanted into the silicon substrate 201. A source/drain diffusion layer (not shown) of a transistor is thereby formed (FIG. 11D).

Figure 1E:
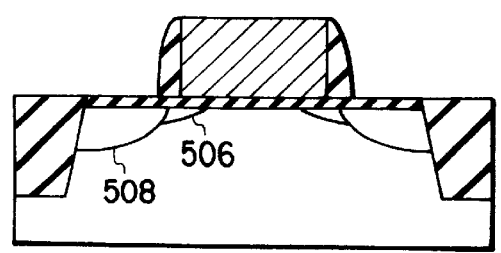
Figure 1I:
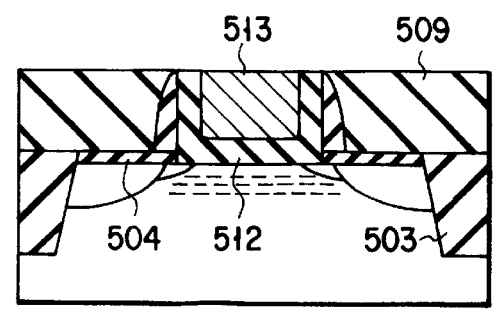
Figure 2A:
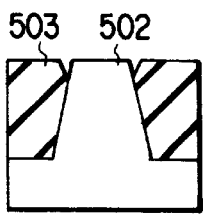
FIGS. 2A and 2B are cross-sectional views in a channel width direction showing the conventional manufacturing process for a semiconductor device using a dummy gate.
Figure 2B:
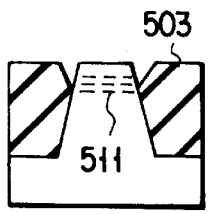
Figure 3A:
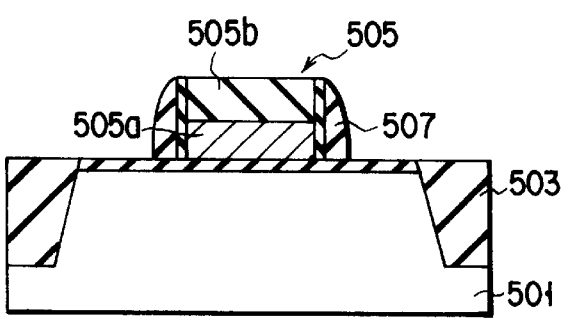
FIGS. 3A through 3C are cross-sectional views showing the conventional manufacturing process for a semiconductor device using a dummy gate.
Figure 3B:
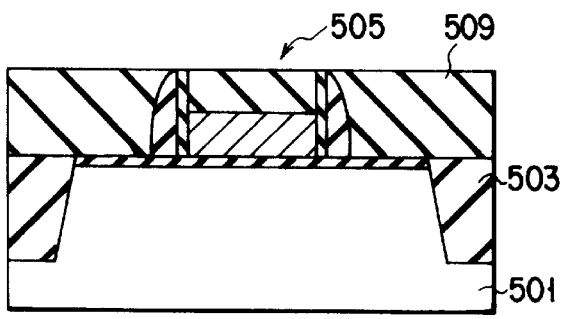
Figure 3C:
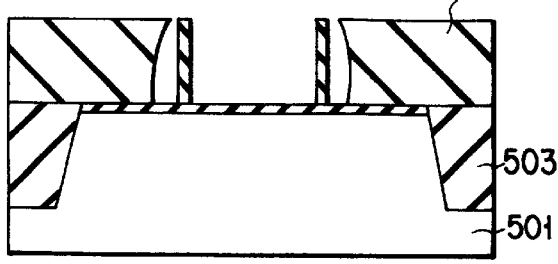
Figure 4A:
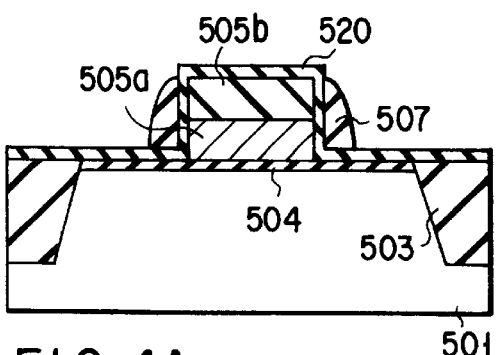
FIGS. 4A through 4D are cross-sectional views of the conventional manufacturing process for a semiconductor device using a dummy gate.
Figure 4B:
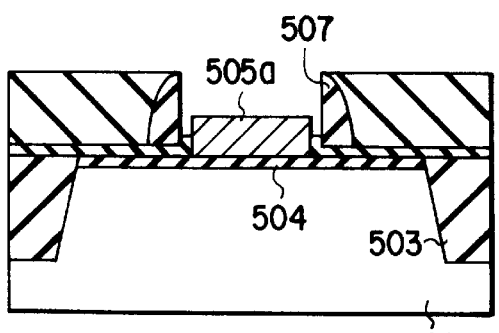
Figure 4C:
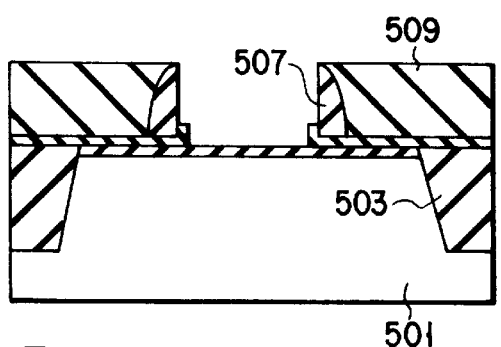
Figure 4D:
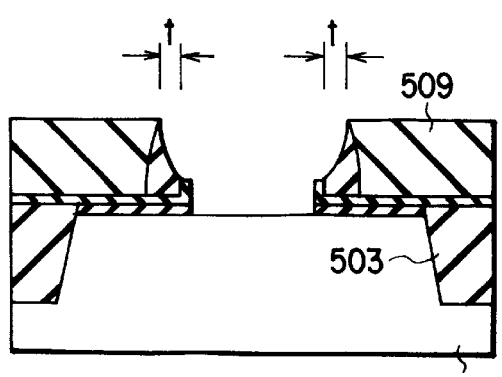
Figure 5A:
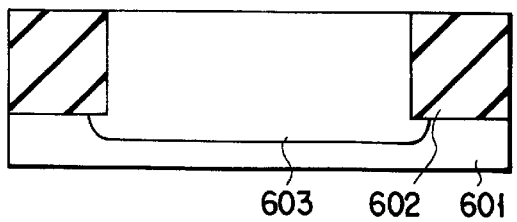
FIGS. 5A through 5D are cross-sectional views showing a conventional process of manufacturing a metal gate semiconductor device.
Figure 6A:
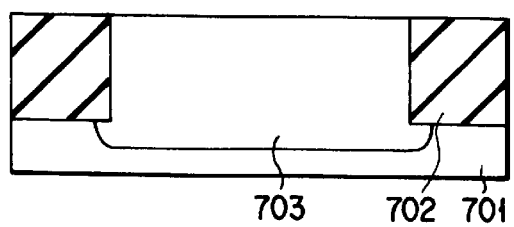
FIGS. 6A through 6D are cross-sectional views depicting a conventional process of manufacturing a polycrystalline silicon gate semiconductor device.
Figure 5B:
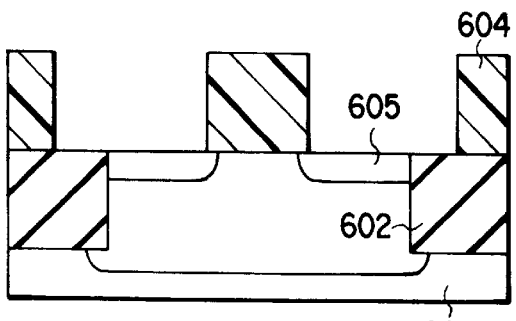
Figure 6B:
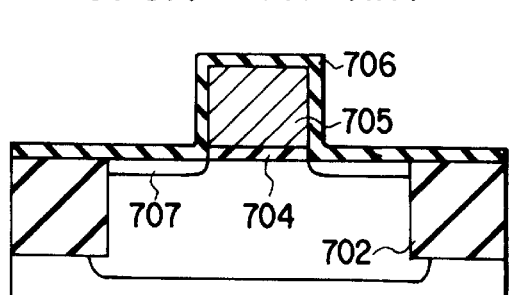
Figure 5C:
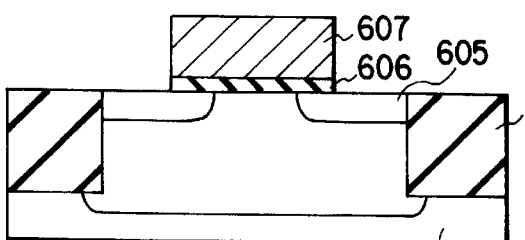
Figure 6C:
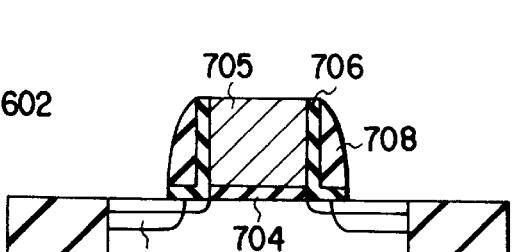
Figure 5D:
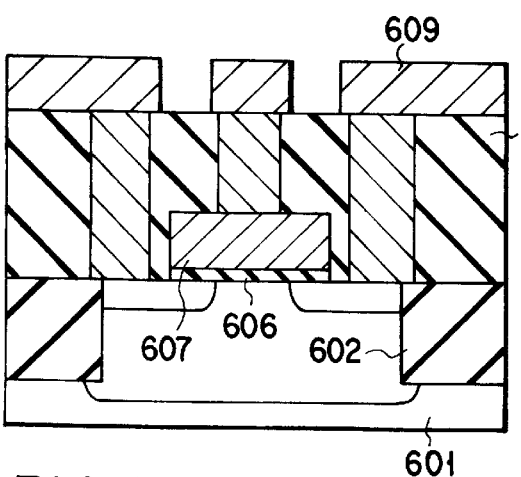
Figure 6D:
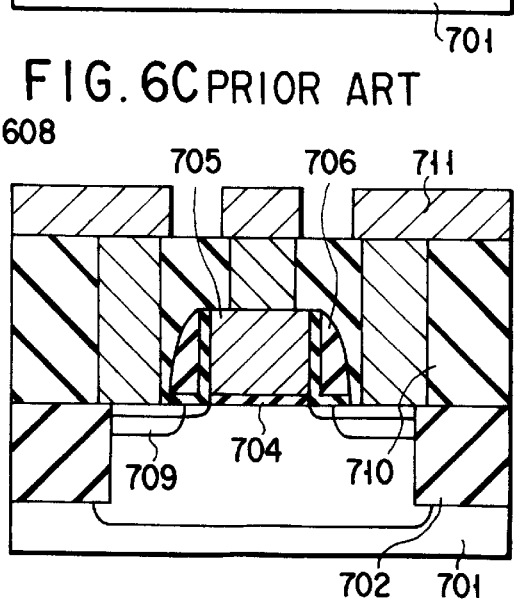
Figure 7A:
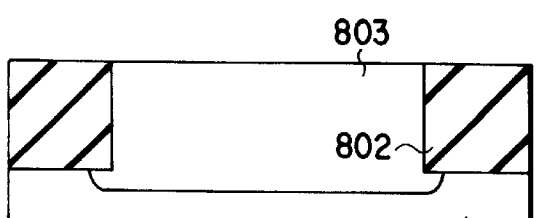
FIGS. 7A through 7H are cross-sectional views illustrating a conventional process of manufacturing a semiconductor device using a high-dielectric film as a gate oxide film.
Figure 7B:
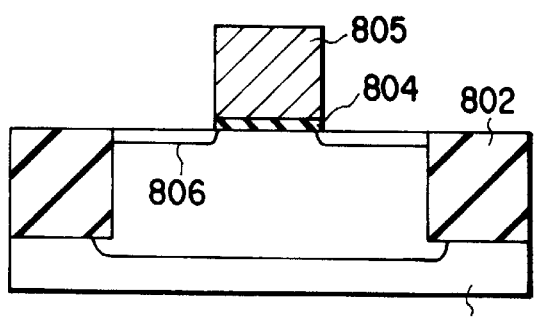
Figure 7C:
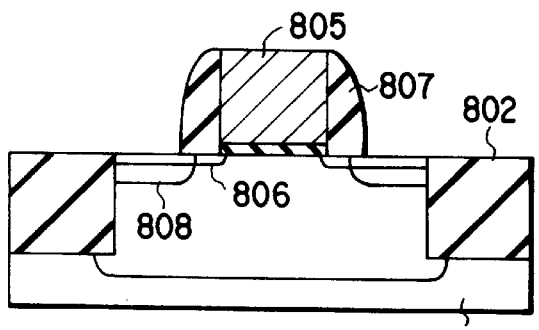
Figure 7D:
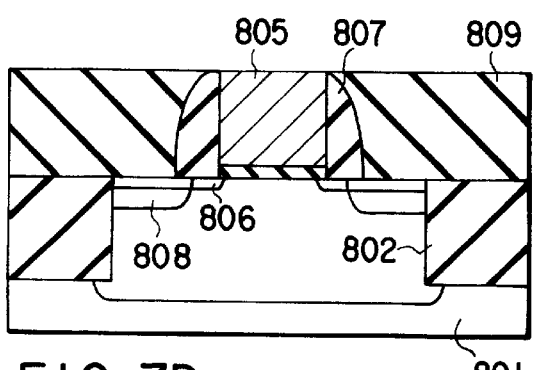
Figure 7E:
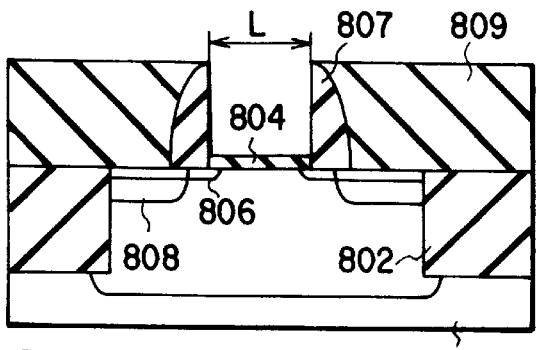
Figure 7F:
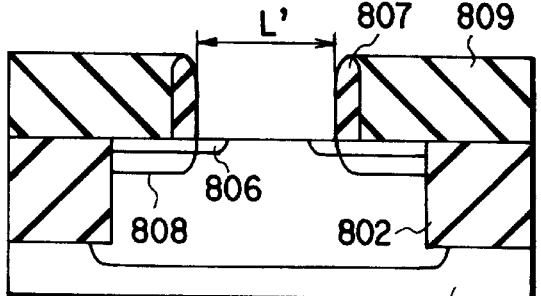
Figure 7G:
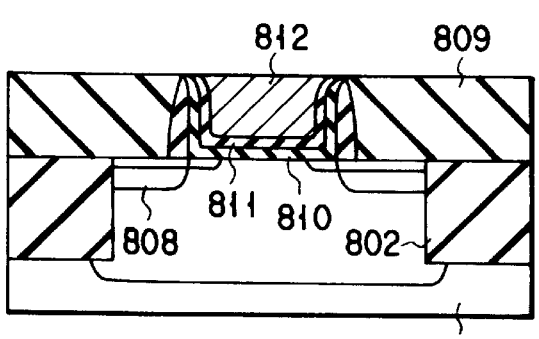
Figure 7H:
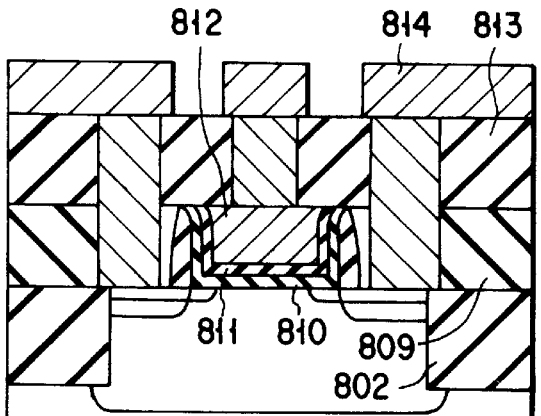
Figure 8:
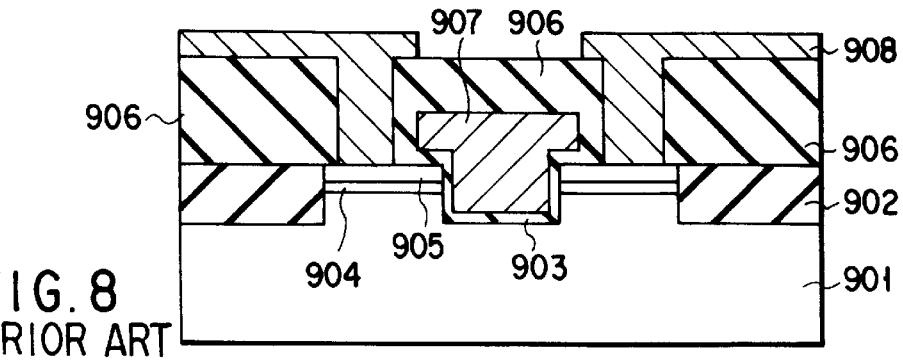
FIG. 8 is a cross-sectional view of an MOS transistor with a conventional groove type channel structure.

Next, a buried insulator film 209 is deposited. The resultant structure is polished by CMP to the top surface of the amorphous silicon film 203 which will becomes the dummy gate pattern. The groove 208 is filled with the film 209 (FIG. 1E).

Figure 11F:
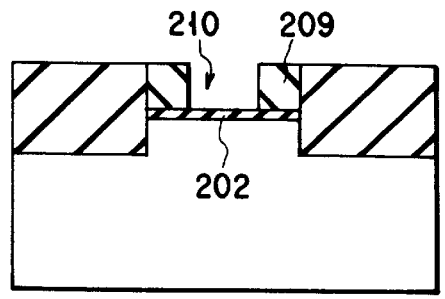
Figure 11C:
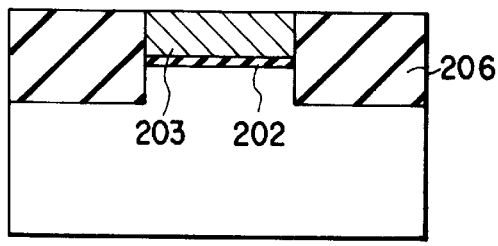
Figure 11G:
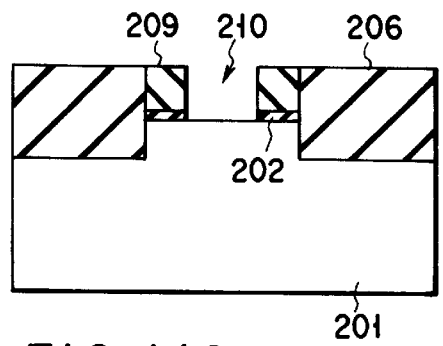
Figure 11D:
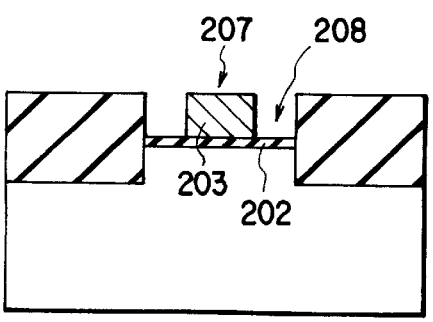

Then, the amorphous silicon film 203 to be the dummy gate pattern is removed by RIE, CDE or the like, forming a groove 210 (FIG. 11F). Ion implantation is performed only in the channel region as needed to control the impurity concentration. The buffer oxide film 202 exposed is removed by $NH_4F$ or the like (FIG. 11G).

Figure 11H:
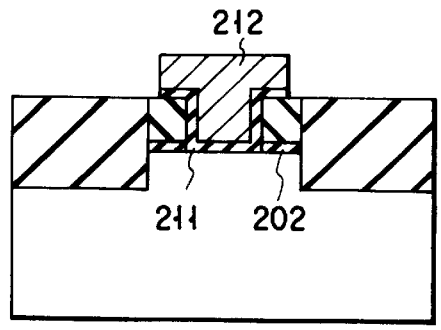

Then, a gate insulator film 211 is formed by thermally oxidizing the surface of the silicon substrate 201 or depositing gate insulator material by CVD or the like. Gate electrode material is deposited on the entire surface. This material is buried via the gate insulator film 211 in the portion where the dummy gate pattern had been formed. A gate wiring resist pattern (not shown) is formed and the gate electrode material is processed into a desired pattern, thus forming a gate line 212 (FIGS. 11H and 12).

Thereafter, an interlayer insulator film is deposited, and contact holes and wirings are formed as needed, as in the ordinary transistor manufacturing process.

Figure 15:
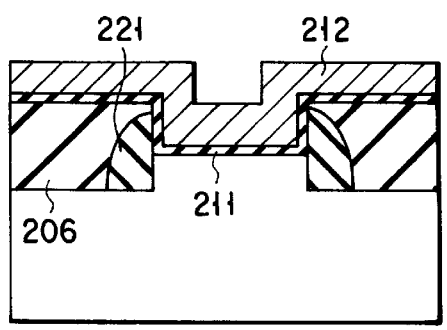
FIG. 15 is a cross-sectional view in a channel width direction corresponding to FIG. 14H.
Figure 16:
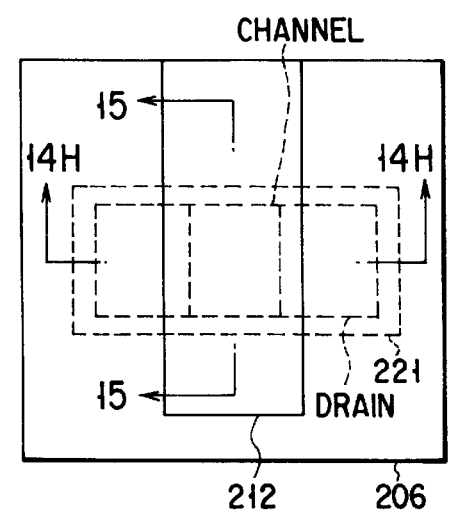
FIG. 16 is a plan view corresponding to FIG. 15.

A second example of the second embodiment will now be described with reference to FIGS. 14A through 14H, 15 and 16. FIGS. 14A–14H are cross-sectional views in the gate length direction (the cross section along the line 14H—14H in FIG. 16), showing a manufacturing process for a semiconductor device according to this specific example. FIG. 15 is a cross-sectional view in the gate width direction (the cross section along the line 15—15 in FIG. 16) and corresponds to FIG. 14H.

The second specific example is different from the first example only in which a sidewall insulator film is formed. The components similar or identical to those of the first example are designated at the same reference numerals and well not described in detail.

Figure 14A:
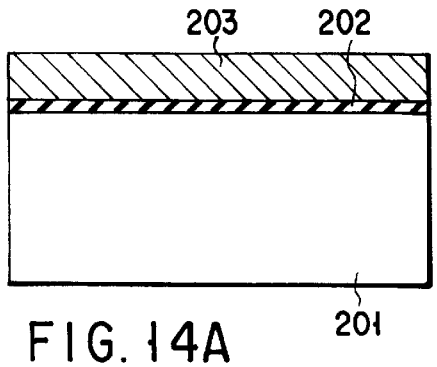
FIGS. 14A through 14H are cross-sectional views in a channel length direction depicting a manufacturing process for a semiconductor device according to a second specific example of the second embodiment.
Figure 14E:
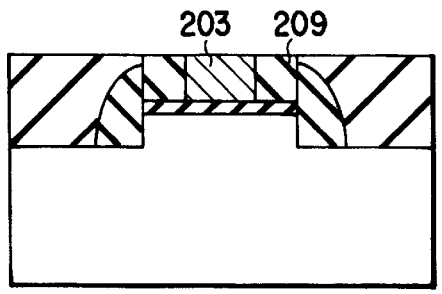
Figure 14B:
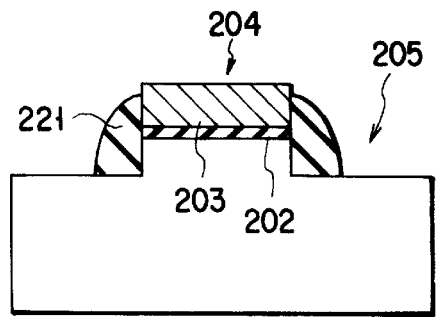

The step in FIG. 14A and the midway in the step in FIG. 14B are the same as the steps in FIGS. 11A and 11B described above in conjunction with the first specific example.

After the step shown in FIG. 11B, a silicon nitride film is deposited 100 nm thick. The film is etched back by RIE, forming a sidewall insulator film 221 that surrounds the land 204. The sidewall insulator film 221 is set higher than the top surface of the semiconductor substrate at the land portion and lower than the top surface of the amorphous silicon film 203 (FIG. 14B).

Figure 14F:
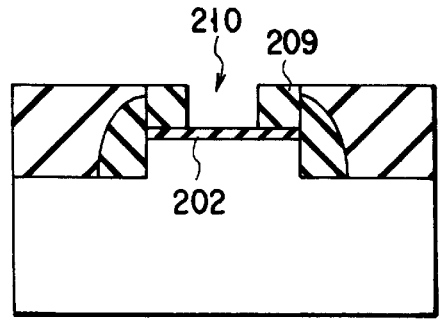
Figure 14C:
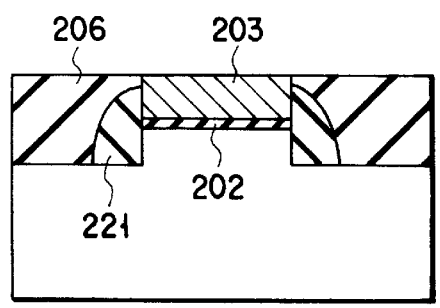
Figure 14G:
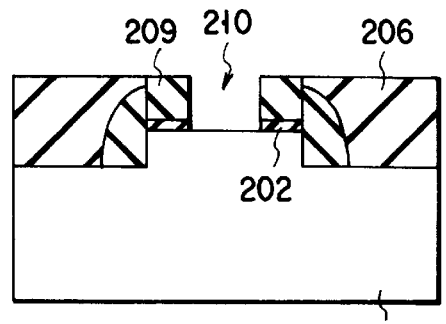
Figure 14D:
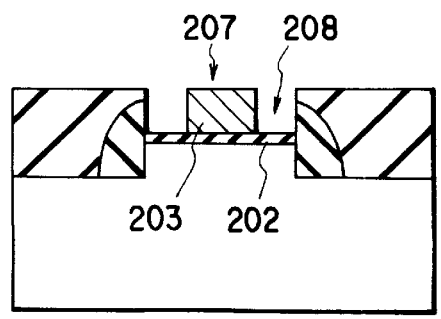
Figure 14H:
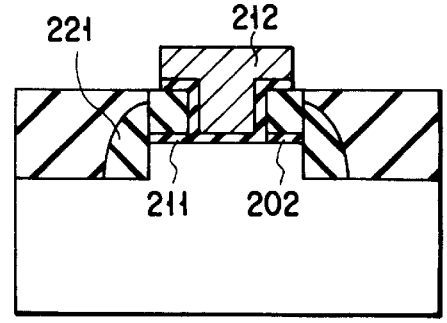

The subsequent steps are basically the same as those of the first specific example. The buried insulator film 206 is provided in the isolation region (FIG. 14C). Then, a dummy gate pattern 207 and a groove 208 are formed. With the dummy gate pattern 207 used as a mask, ion implantation is carried out, forming a source/drain diffusion layer (not shown) (FIG. 14D). Next, a buried insulator film 209 is deposited and is buried in the groove 208 by CMP (FIG. 14E). Then, the amorphous silicon film 203 is removed, making a groove 210 (FIG. 14F). The buffer oxide film 202 exposed is removed (FIG. 14G). Since the $Si_3N_4$ film serving as the sidewall insulator film 221 surrounds the isolation region, the corners of the device region are hardly exposed when the amorphous silicon film 203 and the buffer oxide film 202 are removed. Next, ion implantation is carried out only in the channel region as needed to control the impurity concentration. A gate insulator film 211 and a gate line 212 are formed (FIGS. 14H and 15). Thereafter, an interlayer insulator film is deposited. Contact holes and aluminum wirings are formed as needed, as in the ordinary transistor manufacturing process.

Figure 17A:
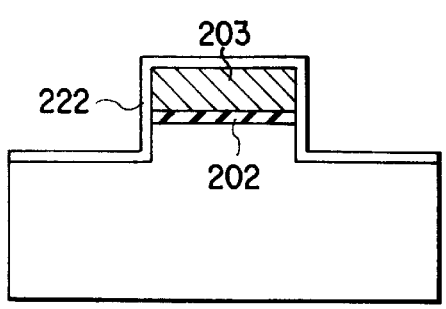
FIGS. 17A and 17B cross-sectional views in a channel length direction illustrating part of a manufacturing process for a semiconductor device according to a third specific example of the second embodiment.
Figure 17B:
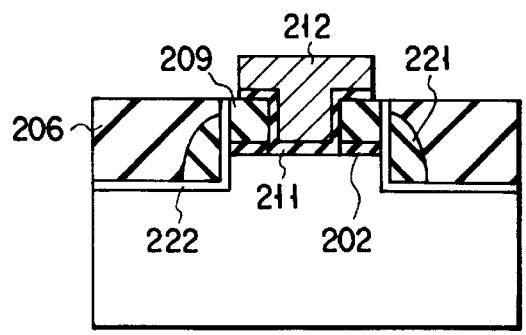

A third example of the second embodiment will be described below with reference to FIGS. 17A and 17B. FIGS. 17A and 17B are cross-sectional views in the gate length direction, showing part of a manufacturing process for a semiconductor device according to this specific example.

The third example is characterized in that an oxide film 222 is formed as shown in FIG. 17A before forming the sidewall $Si_3N_4$ film 221. The oxide film 222 improves the adhesion at the interface of the device region and prevents separation of the $Si_3N_4$ film. The other steps in are basically the same as those of the second specific example. The structure shown in FIG. 17B.

Figure 19:
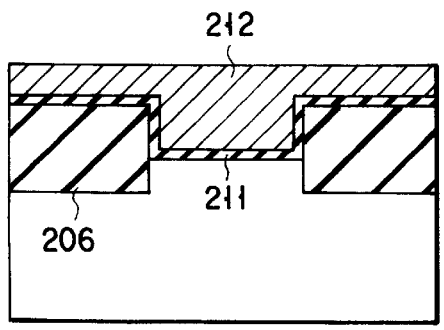
FIG. 19 is a cross-sectional view in a channel width direction corresponding to FIG. 18I.
Figure 20:
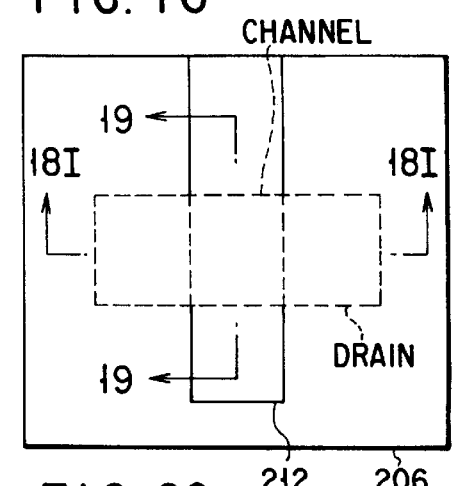
FIG. 20 is a plan view corresponding to FIG. 19.

A fourth example of the second embodiment will now be described with reference to FIGS. 18A through 18I, 19 and 20. FIGS. 18A–18I are cross-sectional views in the gate length direction (the cross section along the line 18—18 in FIG. 20), showing a manufacturing process for a semiconductor device according to this specific example. FIG. 19 is a cross-sectional view in the gate width direction (the cross section along the line 19—19 in FIG. 20) and corresponds to FIG. 18I.

Figure 18A:
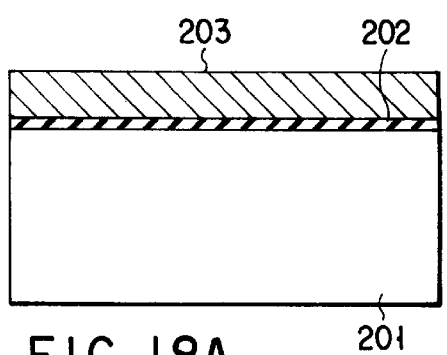
FIGS. 18A through 18I are cross-sectional views in a channel length direction showing a manufacturing process for a semiconductor device according to a fourth specific example of the second embodiment.

First, an amorphous silicon film 203, which will be a dummy gate pattern, is deposited 100 nm thick on a buffer oxide film 202 which has been formed on a silicon substrate 201 (FIG. 18A).

Figure 18D:
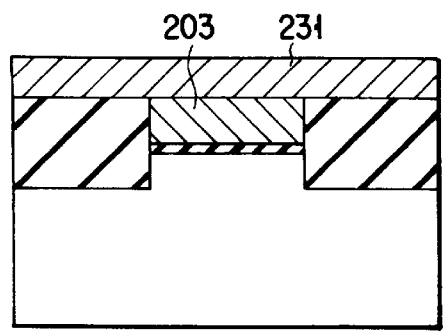
Figure 18B:
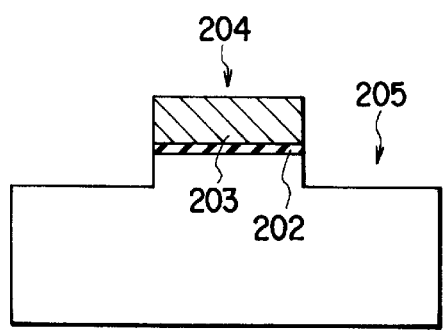

Next, a resist pattern (not shown) for forming a device region is formed. With the resist pattern used as a mask, the amorphous silicon film 203, buffer oxide film 202 and silicon substrate 201 are etched by RIE, forming islands 204 to be device regions and a groove 205 to be an isolation region (FIG. 18B).

Figure 18E:
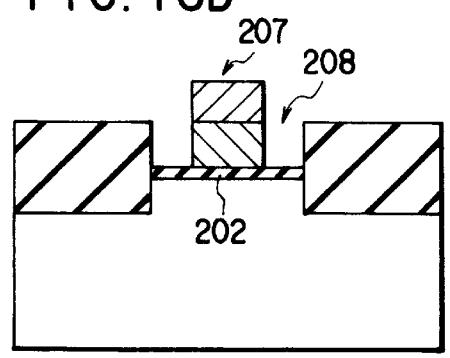
Figure 18C:
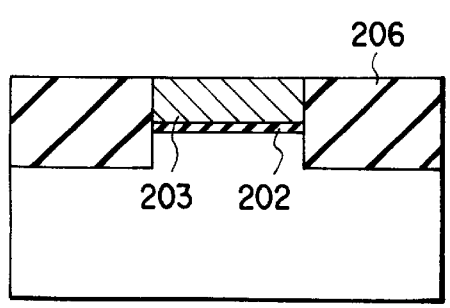

A buried insulator film 206 is deposited on the entire surface. The resultant structure is made flat to the top surface of the amorphous silicon film 203 by CMP or the like, thereby burying the isolation region. The amorphous silicon film 203 is not removed here. Hence, the corner portions of the device region are not exposed (FIG. 18C).

Then, an amorphous silicon film 231 is deposited on the entire surface. At this time, the amorphous silicon film 203 is adhered to the amorphous silicon film 231 (FIG. 18D).

A gate-line resist pattern (not shown) is formed. With this resist pattern used as a mask, RIE or the like is performed to etch the amorphous silicon films 203 and 231 simultaneously, forming a dummy gate pattern 207 and a groove 208. With the dummy gate pattern 207 as a mask, ions of an impurity are implanted into the silicon substrate 201, forming a source/drain diffusion layer (not shown) of a transistor (FIG. 18E).

Figure 18F:
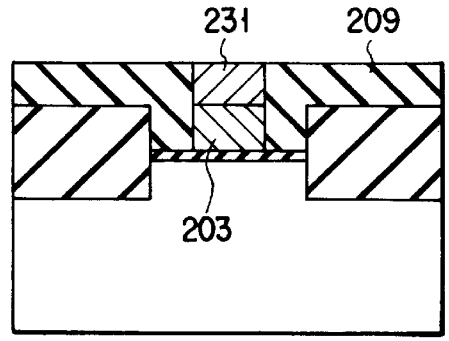

Next, a buried insulator film 209 is deposited. The resultant structure is polished by CMP to the top surface of the amorphous silicon film 231 which will become the dummy gate pattern (FIG. 18F).

Figure 18G:
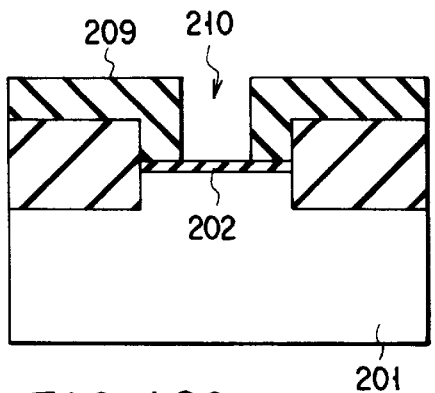

The amorphous silicon films 203 and 231, which will be the dummy gate pattern, are removed by RIE, CDE or the like, thereby making a groove 210. The amorphous silicon films 203 and 231 adhered together at this time are simultaneously removed (FIG. 18G).

Figure 18H:
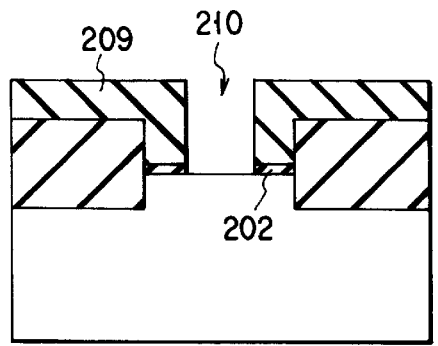

Then, ion implantation is performed only in the channel region, as needed, to control the impurity concentration. The exposed buffer oxide film 202 is removed using NH$_4$F or the like (FIG. 18H).

Figure 18I:
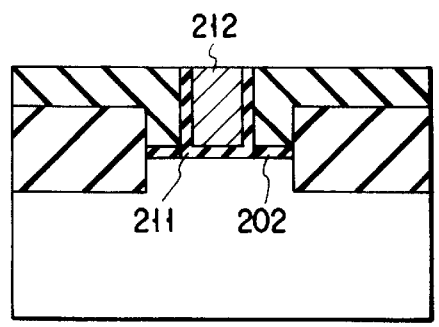

A gate insulator film 211 is formed by thermally oxidizing the surface of the silicon substrate 201 or depositing gate insulator material by CVD or the like. Then, a gate electrode material is deposited on the entire surface and is buried via the gate insulator film 211 in the portion where the dummy gate pattern has been formed. The gate electrode material is polished by CMP to the top surface of the buried oxide film 209, forming a gate line 212. The gate line 212 thus formed does not have a dent in the device region as described in the first specific example (see FIG. 12). The gate line 212 is flattened as shown in FIG. 19 (FIGS. 18I and 19).

Thereafter, an interlayer insulator film is deposited. Contact holes and aluminum wirings are formed, as needed, as in the ordinary transistor manufacturing process.

A fifth example of the second embodiment will now be described with reference to FIGS. 21A through 21I, 22 and 23. FIGS. 21A–21I are cross-sectional views in the gate length direction (the cross section along the line 21H—21H in FIG. 23), showing a manufacturing process for a semiconductor device according to this specific example. FIG. 22 is a cross-sectional view in the gate width direction (the cross section along the line 22—22 in FIG. 23) and corresponds to FIG. 21H.

The fifth example is different from the fourth specific example in that a sidewall insulator film is formed. The components which are the same as the corresponding components of the fourth specific example are designated at the same reference numerals and will not be described in detail.

Figure 21A:
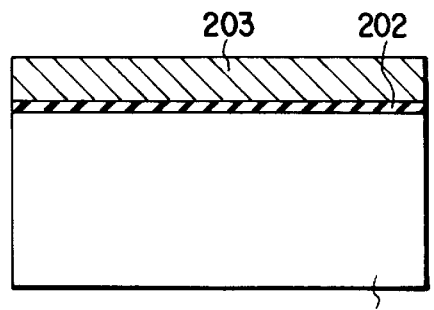
FIGS. 21A through 21I are cross-sectional views in a channel length direction depicting a manufacturing process for a semiconductor device according to a fifth specific example of the second embodiment.
Figure 21B:
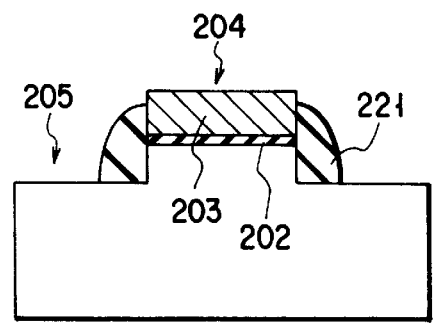
Figure 22:
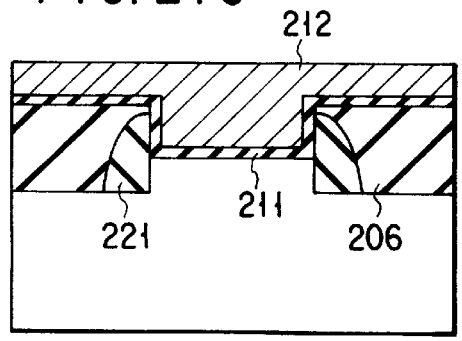
FIG. 22 is a cross-sectional view in a channel width direction corresponding to FIG. 21H.
Figure 23:
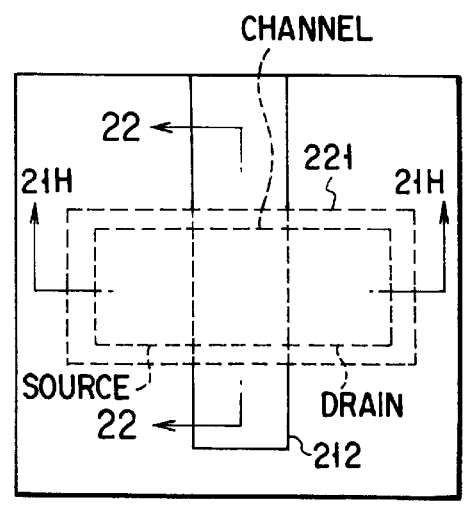
FIG. 23 is a plan view corresponding to FIG. 22.

The step in FIG. 21A and the midway in the step in FIG. 21B are the same as the steps in FIGS. 18A and 18B described above in conjunction with the fourth specific example.

After the step shown in FIG. 18B, a silicon nitride film is deposited 100 nm thick. This film is etched back by RIE, forming a sidewall insulator film 221 that surrounds the land 204. The sidewall insulator film 221 is higher than the top surface of the semiconductor substrate at the land portion and lower than the top surface of the amorphous silicon film 203 (FIG. 21B).

Figure 21C:
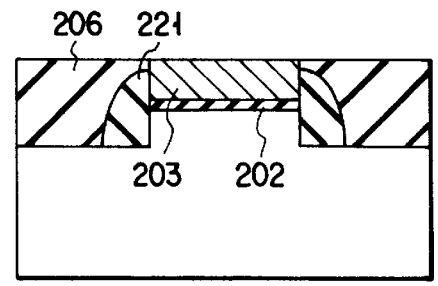
Figure 21D:
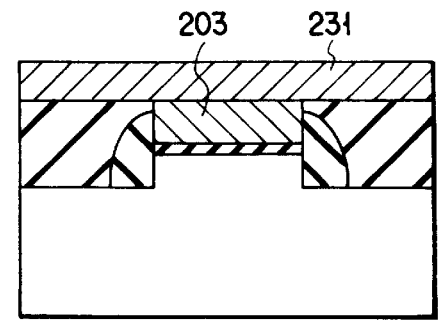
Figure 21E:
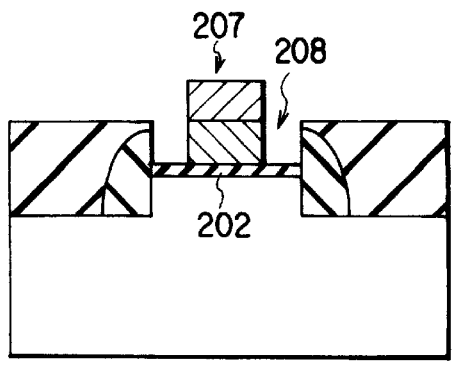
Figure 21F:
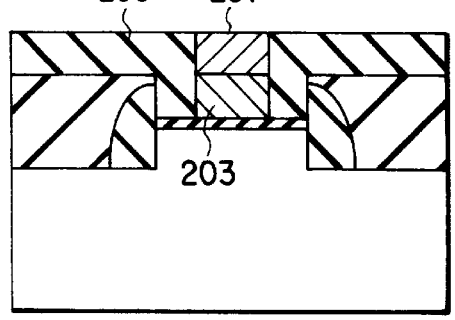
Figure 21G:
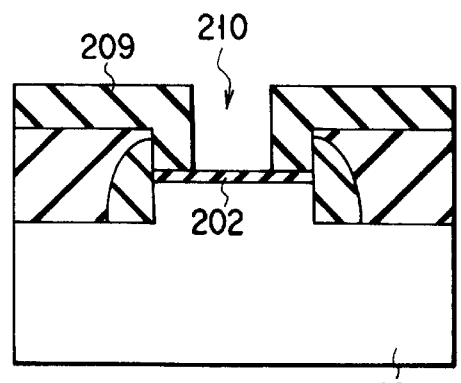
Figure 21H:
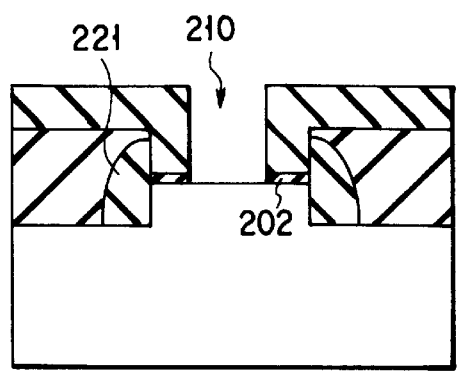
Figure 21I:
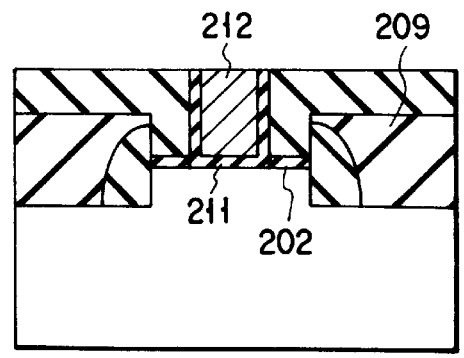

The subsequent steps are basically the same as those of the fourth specific example. The buried insulator film 206 is provided in the isolation region (FIG. 21C). An amorphous silicon film 231 is deposited (FIG. 21D). A dummy gate pattern 207 and a groove 208 are formed. With the dummy gate pattern 207 used as a mask, ion implantation is carried out, forming a source/drain diffusion layer (not shown) (FIG. 21E). After a buried insulator film 209 is formed (FIG. 21F), the amorphous silicon films 203 and 231 are removed, forming a groove 210 (FIG. 21G). Next, ion implantation is carried out only in the channel region, as needed, to control the impurity concentration. The buffer oxide film 202 exposed is removed (FIG. 21H). Since the Si$_3$N$_4$ film serving as the sidewall insulator film 221 surrounds the isolation region in this example, the corners of the device region are hardly exposed when the amorphous silicon film 203 and buffer oxide film 202 are removed. A gate insulator film 211 and a gate line 212 are formed (FIGS. 21I and 22). As in the fourth specific example, the gate line 212 made flat. An interlayer insulator film is deposited, and contact holes and aluminum wirings are formed, as needed, as in the ordinary transistor manufacturing process.

Figure 24A:
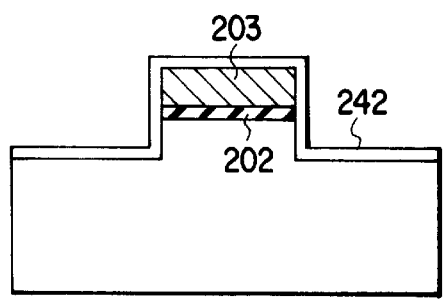
FIGS. 24A and 24B are cross-sectional views in a channel length direction depicting part of a manufacturing process for a semiconductor device according to a sixth specific example of the second embodiment.
Figure 24B:
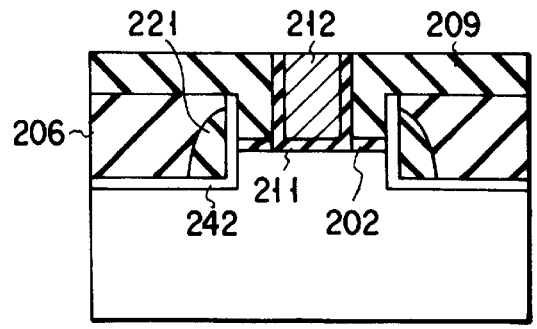

A sixth example of the second embodiment will be described below with reference to FIGS. 24A and 24B. FIGS. 24A and 24B are cross-sectional views in the gate length direction, showing part of a manufacturing process for a semiconductor device according to this specific example.

The sixth example is characterized in that an oxide film 242 is formed as shown in FIG. 24A before forming the sidewall Si$_3$N$_4$ film 221. The oxide film 242 improves the adhesion at the interface of the device region and prevents separation of the Si$_3$N$_4$ film. The other steps are basically the same as those of the fifth specific example. The structure shown in FIG. 24B will be finally obtained.

In the specific examples of the second embodiment, a flattening scheme is not limited to CMP but may be etchbacking by chemical dry etching. Further the source/drain region may be formed by vapor phase diffusion as well as ion implantation. Still further, the gate insulator film is not limited to have a single layer structure, but may have a lamination structure comprising, for example, a silicon insulator film and a high-dielectric film.

Third Embodiment

Figure 25A:
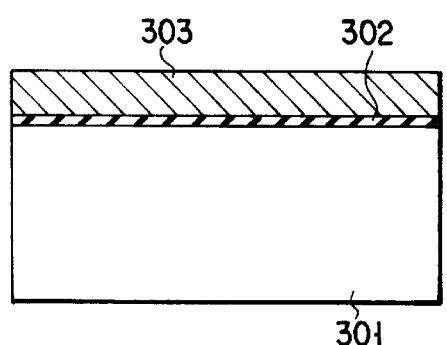
FIGS. 25A through 25H are cross-sectional views in a channel length direction illustrating a manufacturing process for a semiconductor device according to a first specific example of a third embodiment.
Figure 25D:
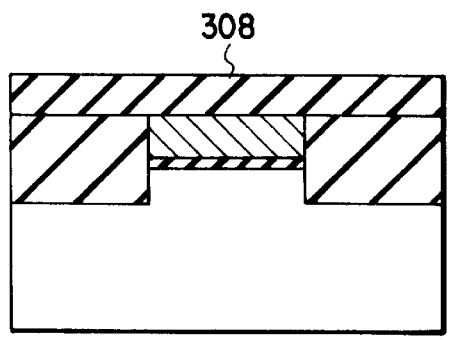
Figure 25B:
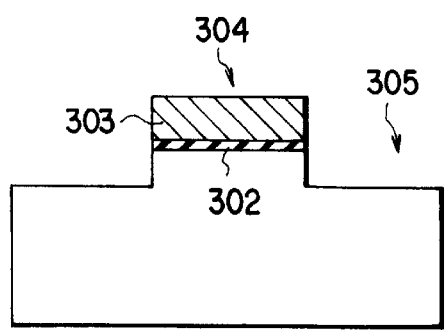
Figure 25E:
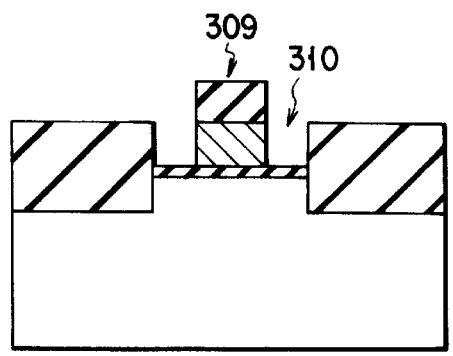
Figure 25C:
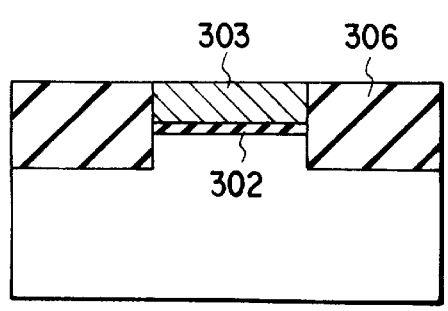
Figure 25F:
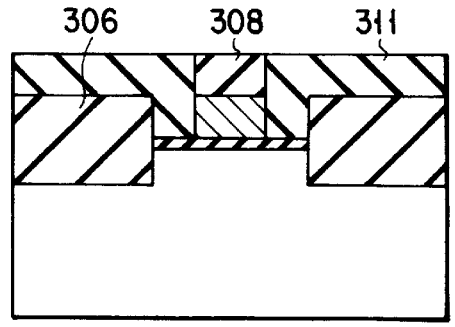

A first example of the third embodiment will now be described with reference to FIGS. 25A through 25H, 26 and 27. FIGS. 25A–25H are cross-sectional views in the gate length direction (the cross section along the line 25—25 in FIG. 27), showing a manufacturing process for a semiconductor device according to this specific example. FIG. 26 is a cross-sectional view in the gate width direction (the cross section along the line 26—26 in FIG. 27) and corresponds to FIG. 25H.

First, a silicon film 303 of polycrystalline silicon or amorphous silicon, which contains an impurity and which is to be part of a gate line, is deposited 100 nm thick on a gate insulator film 302 formed on a silicon substrate 301. Note that an impurity is implanted into the substrate, as needed, to control the substrate concentration, before the deposition of the gate electrode (FIG. 25A).

Next, a resist pattern (not shown) for forming a device region is formed. With the resist pattern used as a mask, the silicon film 303, gate insulator film 302 and silicon substrate 301 are etched by RIE, forming islands 304 and a groove 305. The resist pattern is removed. The portions around the islands are oxidized, as needed, to improve the surface condition (FIG. 25B).

A buried insulator film 306 is deposited on the entire surface. The resultant structure is made flat by CMP or the like at the top surface of the silicon film 303, thereby burying the isolation region. The silicon film 303 is not removed here. Hence, the corner portions of the device region are not exposed (FIG. 25C).

An $Si_3N_4$ film 308 is deposited on the entire surface. At this point, the silicon film 303 is adhered to the $Si_3N_4$ film 308 and the top of the $Si_3N_4$ film 308 is flat (FIG. 25D).

Then, a resist pattern (not shown) is formed. With this resist pattern used as a mask, the silicon film 303 and $Si_3N_4$ film 308 are simultaneously etched by RIE or the like, forming a gate pattern 309 and a groove 310. The resist pattern is removed. The side portions are oxidized, as needed, to ensure a good surface condition. With the gate pattern 309 used as a mask, impurity ions are implanted into the silicon substrate 301, forming a source/drain diffusion region (not shown) of a transistor (FIG. 25E).

A buried insulator film 311 is deposited on the entire surface. The resultant structure is polished by CMP to the top surface of the $Si_3N_4$ film 308. At this time, the buried insulator film 311 does not remain on the $Si_3N_4$ film 308 (FIG. 25F).

Figure 25G:
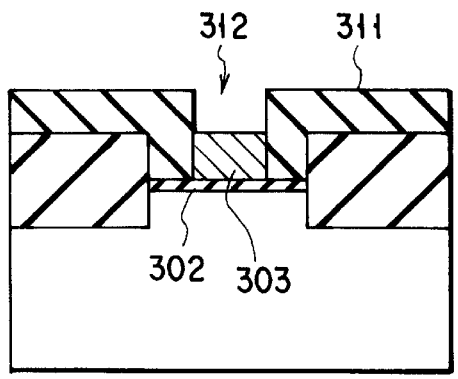
Figure 26:
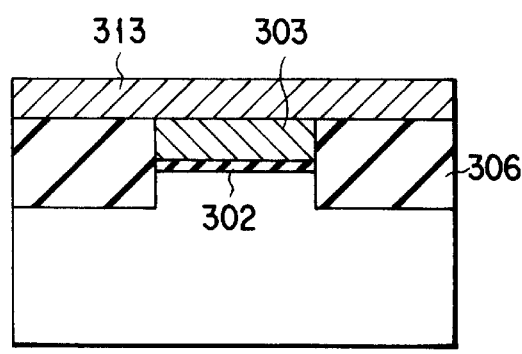
FIG. 26 is a cross-sectional view in a channel width direction corresponding to FIG. 25H.
Figure 27:
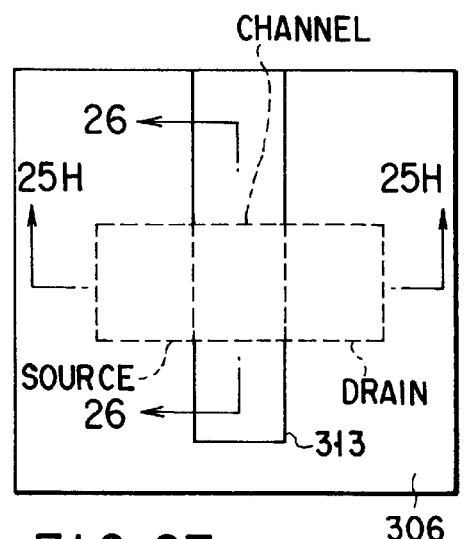
FIG. 27 is a plan view corresponding to FIG. 26.

The $Si_3N_4$ film 308 is removed by a hot phosphorous acid, exposing the top of the silicon film 303 and forming a groove 312 (FIG. 25G).

Figure 25H:
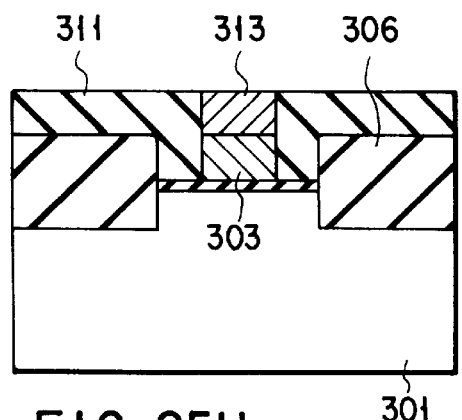

Next, the top surface of the silicon film 303 is washed, as needed, to improve the connection between the silicon film 303 and a gate line material to be buried later. A gate line material 313 is buried in the groove 312. The resultant structure is made flat by CMP or the like at the top of the buried oxide film 311. A gate line consisting of an electrode portion 303 and a wiring portion 313 is formed. At this time, the gate line has a flat top surface (the top surface of the wiring portion 313) (FIGS. 25H and 26).

Figure 28:
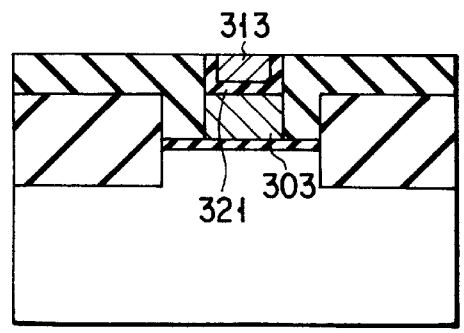
FIGS. 28 and 29 are a cross-sectional view and a plan view showing a modification of the manufacturing process for a semiconductor device according to the first specific example of the third embodiment.
Figure 29:
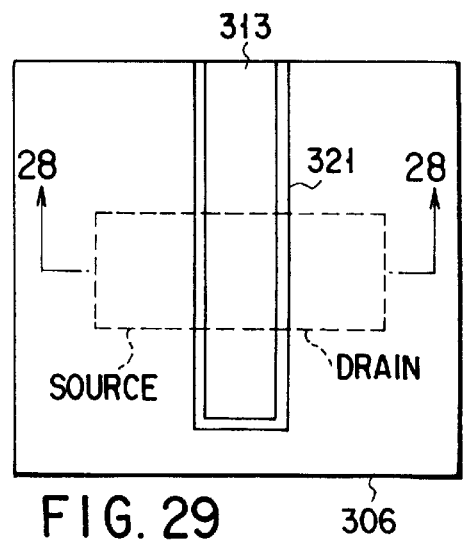

If the wiring member 313 is made of metal such as W, a barrier metal 321 may be provided as shown in FIGS. 28 and 29 in order to prevent reaction with a-Si or the like which is the material of the electrode portion 303.

The subsequent steps are the same as those of the ordinary transistor manufacturing process. That is, an interlayer insulator film is deposited, contact holes and aluminum wirings are formed as needed.

A second example of the third embodiment will now be described with reference to FIGS. 30A through 30D and 31. FIGS. 30A–30D are cross-sectional views in the gate length direction (the cross section along the line 30—30 in FIG. 31), showing a manufacturing process for a semiconductor device according to the second example.

The second example is different from the first specific example in that a sidewall insulator film is formed. To avoid the redundant description, like or same reference numerals are given to those components which are similar or identical to the corresponding components of the first specific example. The process up to some step is basically the same as the steps in FIGS. 25A–25E of the above-described first specific example and will not be described in detail.

Figure 30A:
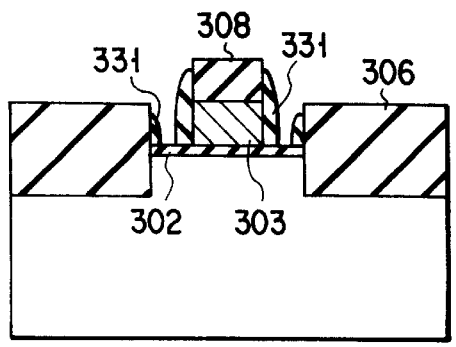
FIGS. 30A through 30D are cross-sectional views in a channel length direction illustrating a manufacturing process for a semiconductor device according to a second specific example of the third embodiment.
Figure 30B:
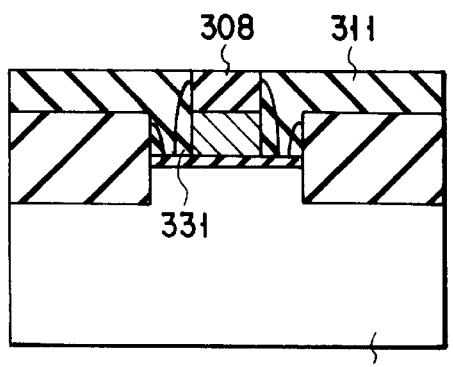
Figure 30C:
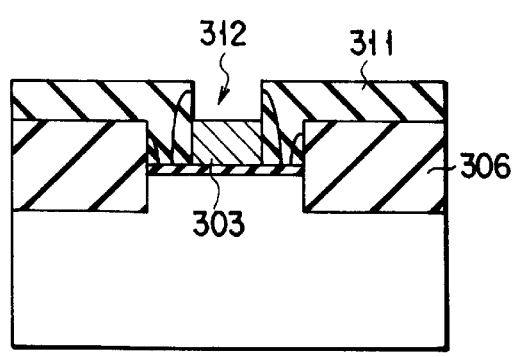

After a gate pattern 309 is formed in the step in FIG. 25E, a silicon oxide film is deposited 100 nm thick. The silicon oxide film is etched back by RIE, forming a sidewall insulator film 331 that surrounds the gate pattern. The impurity ions implanted again here control the substrate profile in the source/drain region (FIG. 30A).

Figure 30D:
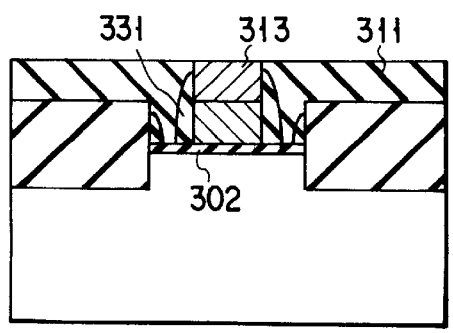
Figure 31:
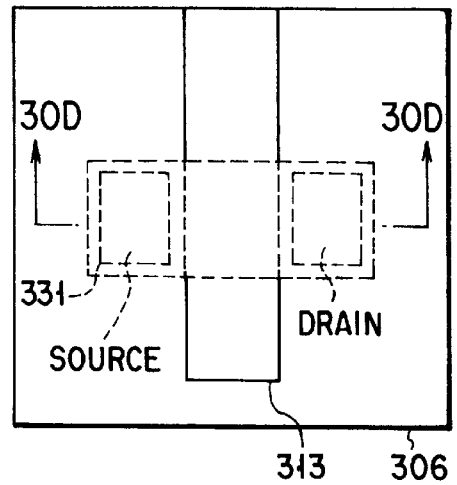
FIG. 31 is a cross-sectional view in a channel width direction corresponding to FIG. 25H.

The subsequent steps are basically the same as those of the first specific example. Through steps in FIGS. 30B and 30C, a structure as shown in FIG. 30D is obtained.

Figure 32:
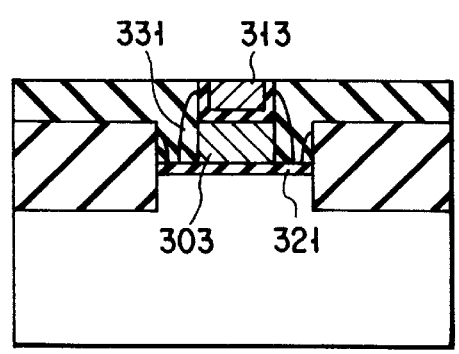
FIGS. 32 and 33 are a cross-sectional view and a plan view showing a modification of the manufacturing process for a semiconductor device according to the second specific example of the third embodiment.
Figure 33:
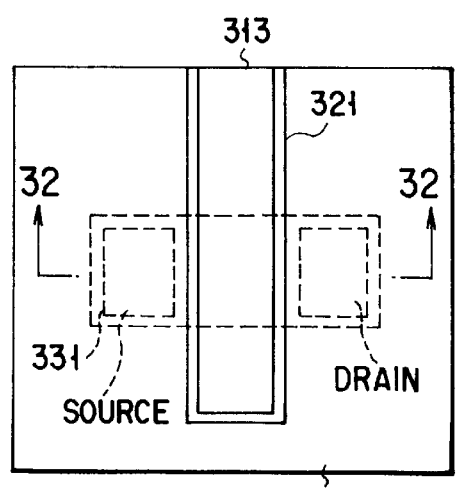

In this example, barrier metal 321 may be provided as shown in FIGS. 32 and 33 as in the first specific example (FIG. 28).

A third example of the third embodiment will now be described with reference to FIGS. 34A through 34H. FIGS. 34A–34H are cross-sectional views in the gate length direction (the cross section along the line 25—25 in FIG. 27), showing a manufacturing process for a semiconductor device according to this specific example.

Figure 34A:
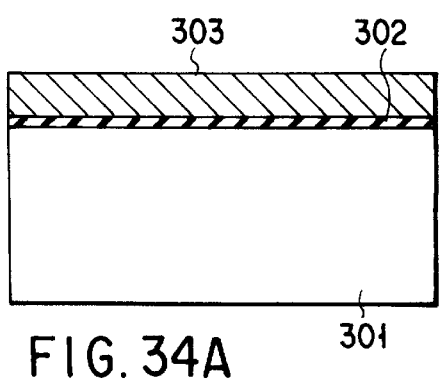
FIGS. 34A through 34H are cross-sectional views in a channel length direction depicting a manufacturing process for a semiconductor device according to a third specific example of the third embodiment.

First, a silicon film 303 of polycrystalline silicon or amorphous silicon, which contains an impurity and which is to be part of a gate line, is deposited 100 nm thick on a gate insulator film 302 formed on a silicon substrate 301. Note that an impurity is implanted into the substrate, as needed, to control the impurity concentration in the substrate before the deposition of the gate electrode (FIG. 34A).

Figure 34B:
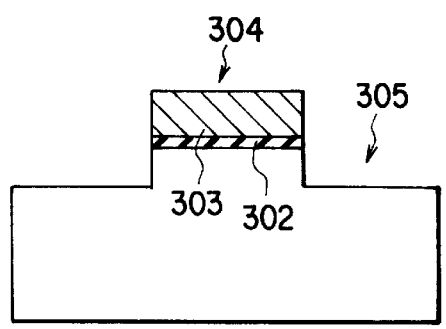

Next, a resist pattern (not shown) for forming a device region is formed. Which with the resist pattern used as a mask, the silicon film 303, gate insulator film 302 and silicon substrate 301 are etched by RIE, forming lands 304 and a groove 305. The resist pattern is removed, the portions around the formed lands are oxidized as needed to improve the surface condition (FIG. 34B).

Figure 34C:
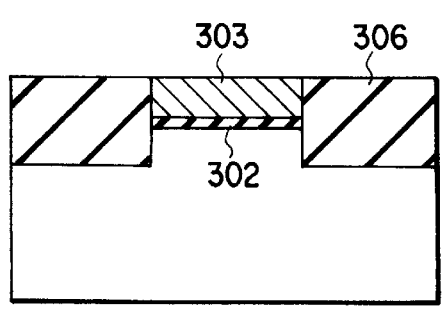

Next, a buried insulator film 306 is deposited on the entire surface. The top surface of the resultant structure is made flat by CMP or the like, thereby burying the isolation region. The silicon film 303 is not removed here, and the corner portions of the device region are not exposed (FIG. 34C).

Figure 34D:
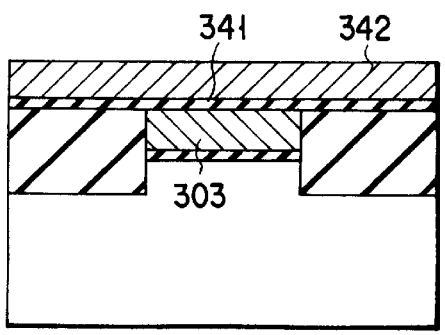

A buffer oxide film 341 and a silicon film 342 of polycrystalline silicon or amorphous silicon are formed. At this time, the silicon film 303 is adhered to the silicon film 342 via the buffer oxide film 341, and the top surface of the silicon film 342 is flat (FIG. 34D).

Figure 34E:
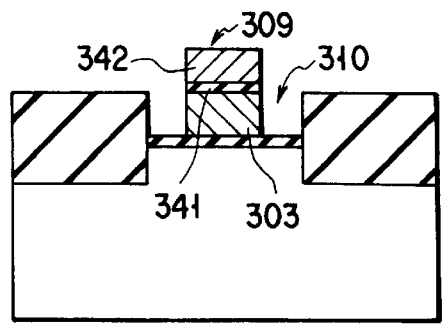

Then, a resist pattern (not shown) is formed. With this resist pattern used as a mask, the silicon film 342, buffer oxide film 341 and silicon film 303 are simultaneously etched by RIE or the like, forming a gate pattern 309 and a groove 310. The resist pattern, is removed, and the side portions are oxidized as needed to ensure a good surface condition. With the gate pattern 309 used as a mask, impurity ions are implanted into the silicon substrate 301, forming a source/drain diffusion region (not shown) of a transistor (FIG. 34E).

Figure 34F:
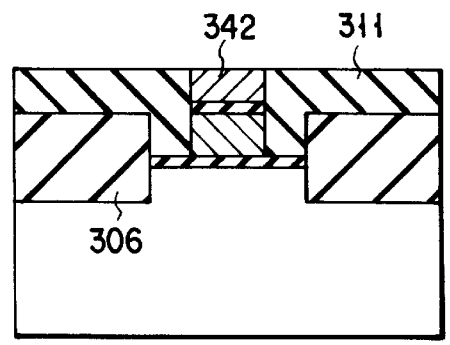

A buried insulator film 311 is deposited on the entire surface. The resultant structure is polished by CMP to the top surface of the silicon film 342. At this time, the buried insulator film 311 does not remain on the silicon film 342 (FIG. 34F).

Figure 34G:
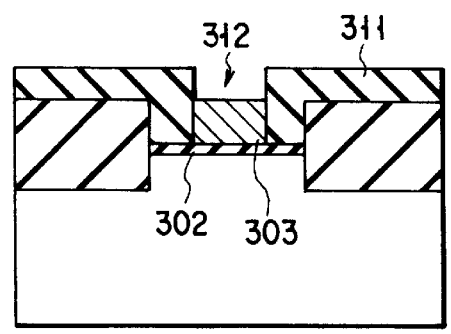

Then, the silicon film 342 is removed by CDE. The buffer oxide film 341 is removed by RIE, exposing the top of the silicon film 303 and forming a groove 312 (FIG. 34G).

Figure 34H:
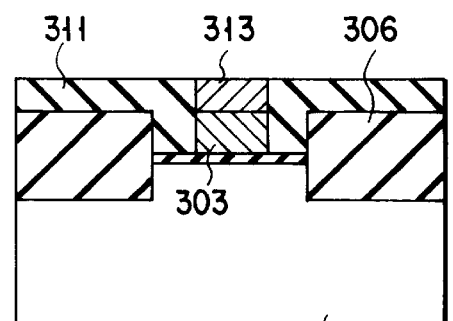

To improve the connection between the silicon film 303 and a gate line material to be buried later, the top surface of the silicon film 303 is washed as needed. A gate line material 313 is buried in the groove 312. The resultant structure is made flat at by CMP or the like the top of the buried oxide film 311. A gate line consisting of an electrode portion 303 and a wiring portion 313 is thereby formed. At this time, the gate line has a flat top surface (the top surface of the wiring portion 313) (FIG. 34H).

Figure 35:
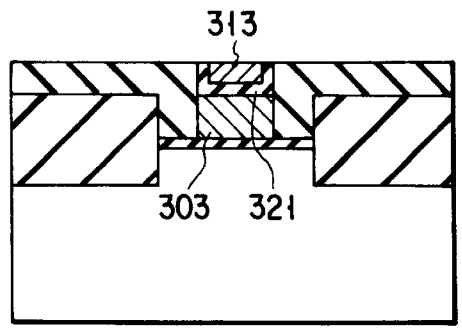
FIG. 35 is a cross-sectional view showing a modification of the manufacturing process for a semiconductor device according to the third specific example of the third embodiment.

If the wiring 313 is made of metal such as W, a barrier metal 321 may be provided as shown in FIGS. 35 and 29 in order to prevent reaction with a-Si or the like which is the material of the electrode portion 303.

The subsequent steps are the same as the steps of manufacturing the ordinary transistor manufacturing process. That is, an interlayer insulator film is deposited, and contact holes and aluminum wirings are formed as needed.

A fourth example of the third embodiment will now be described with reference to FIGS. 36A through 36D and 31.

FIGS. 36A–36D are cross-sectional views in the gate length direction (the cross section along the line 30—30 in FIG. 31), showing a manufacturing process for a semiconductor device according to the fourth example.

The fourth example is different from the third specific example in that a sidewall insulator film is formed. To avoid the redundant detailed description, like or same reference numerals are given to those components which are the same as the corresponding components of the third example. The process up to some step, which is basically the same as the steps in FIGS. 34A–34E of the third example, will not be described in detail.

Figure 36A:
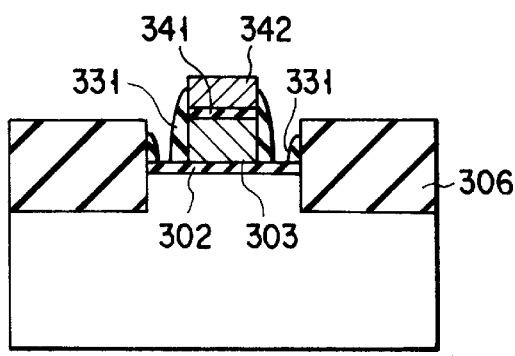
FIGS. 36A through 36D are cross-sectional views in a channel length direction illustrating a manufacturing process for a semiconductor device according to a fourth specific example of the third embodiment.
Figure 36C:
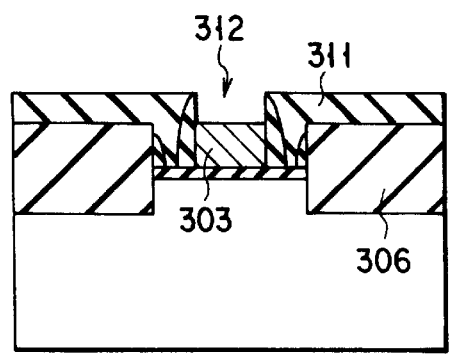
Figure 36B:
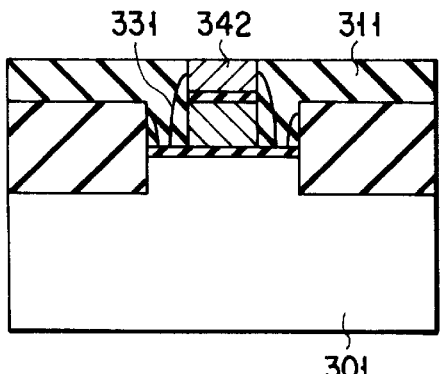

A gate pattern 309 is formed in the step of FIG. 34E. A silicon oxide film is deposited 100 nm thick and is etched back by RIE, forming a sidewall insulator film 331 that surrounds the gate pattern. The implanting impurity ions again control the impurity concentration profile in the source/drain region (FIG. 36A).

Figure 36D:
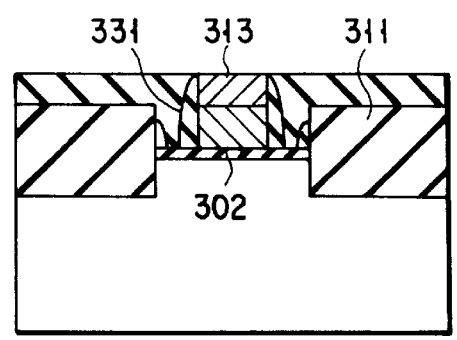

The subsequent steps are basically the same as those of the first example. Through steps in FIGS. 36B and 36C, the structure shown in FIG. 36D is obtained.

Figure 37:
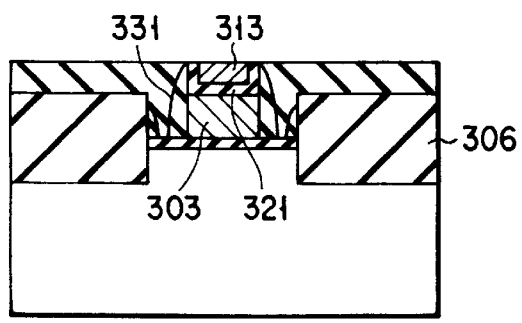
FIGS. 37 and 38 are cross-sectional views showing a modification of the manufacturing process for a semiconductor device according to the fourth specific example of the third embodiment.

In this example, a barrier metal 321 may be provided as shown in FIGS. 37 and 33 in the same manner as illustrated in FIG. 29 of the first specific example.

Figure 38:
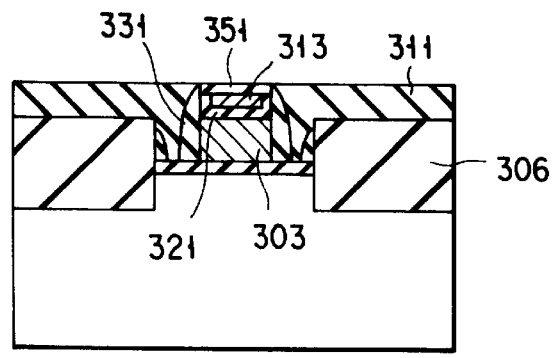

The fourth example is effective also in forming contact holes in the source and drain in a self-aligning manner. In this case, the top surface of the buried gate line should be etched back and a silicon nitride film 351 should be buried there. The top surface of the structure should be made flat as shown in FIG. 38.

Figure 39A:
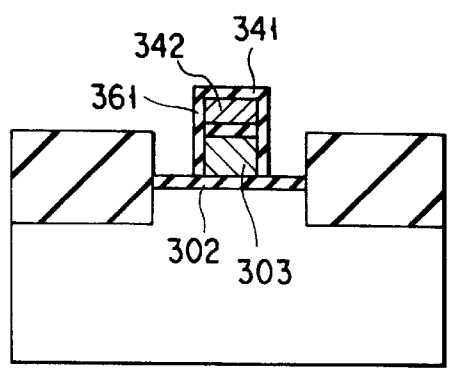
FIGS. 39A and 39B are cross-sectional views in a channel length direction depicting a manufacturing process for a semiconductor device according to a fifth specific example of the third embodiment.
Figure 39B:
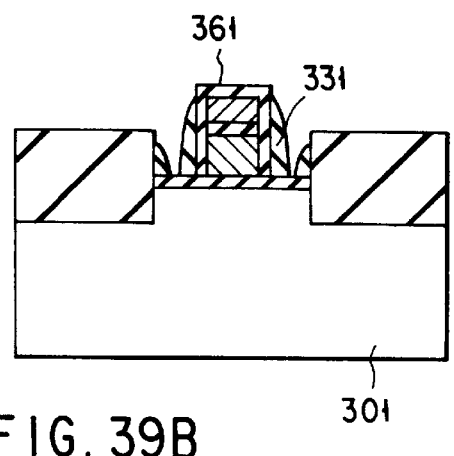

A fifth example of the third embodiment will be described below with reference to FIGS. 39A and 39B. FIGS. 39A and 39B are cross-sectional views in the gate length direction (the cross section along the line 30—30 in FIG. 31), showing a manufacturing process for a semiconductor device according to this specific example.

The fifth example is different from the fourth specific example in that the area around a gate pattern is oxidized, forming an oxide film 361, immediately before the formation of the sidewall insulator film (FIG. 39B). The other steps are basically the same as those of the fourth example.

In the individual specific examples of the third embodiment, the flattening scheme is not limited to CMP, but may be etch-backing by chemical dry etching. Further, the source/drain region may be formed by vapor phase diffusion as well as ion implantation.

The silicon film 303, which will become part of the gate electrode, may be formed by depositing an impurity-free silicon film and implanting impurity ions after the formation of the groove 312. In this case, patterning can be carried out, as needed, to locally change the type and dose of the impurity, thus permitting the threshold value to be controlled.

Fourth Embodiment

A first example of the fourth embodiment will now be described with reference to FIGS. 40A through 40J and 41A through 41E. FIGS. 40A–40J are cross-sectional views in the gate length direction, showing a manufacturing process for a semiconductor device according to this specific example. FIGS. 41A–41E are cross-sectional views in the gate width direction. Although the diagrams show an NMOS structure, a PMOS can likewise be formed.

Figure 40A:
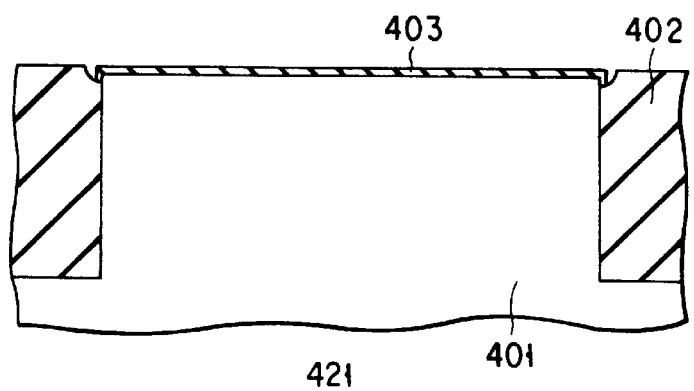
Figure 41A:
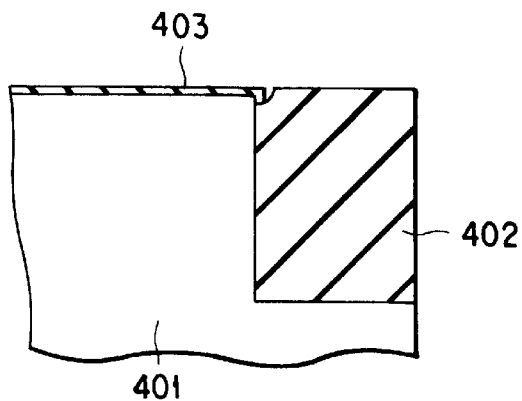
FIGS. 41A through 41E are cross-sectional views in a channel width direction showing the manufacturing process for a semiconductor device according to the first specific example of the fourth embodiment.

First, an Si substrate is prepared. A trench is formed by RIE about 200 nm deep in an isolation region. Subsequently, TEOS is deposited and is buried. The TEOS layer is made flat by CMP, thus forming islands 401 comprised of the Si substrate and an isolation region of an STI structure. The substrate surface is oxidized to a thickness of 5 nm, forming a dummy gate oxide film 403. Note that a P type well (peak concentration of approximately $1\times10^{18}$ cm$^{-3}$) has been prepared in the NMOS region of the substrate (FIGS. 40A and 41A).

Figure 40B:
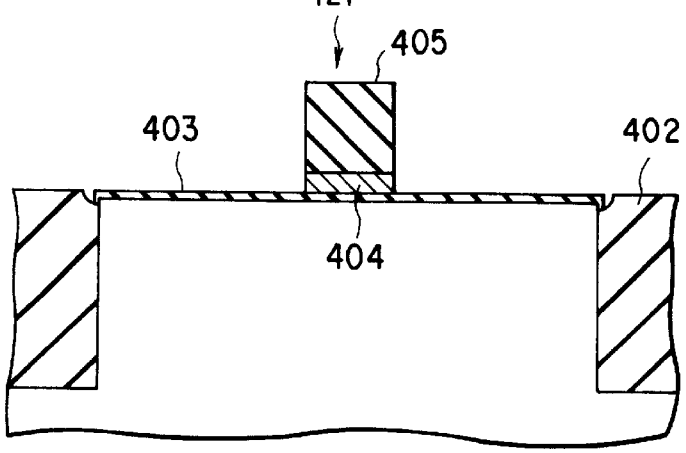
Figure 41D:
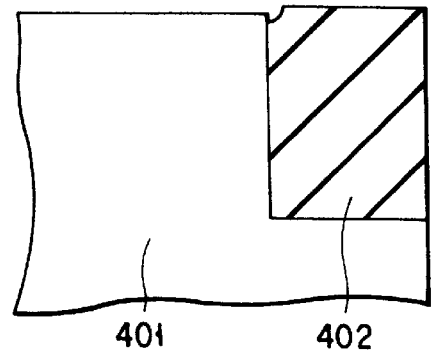
Figure 41B:
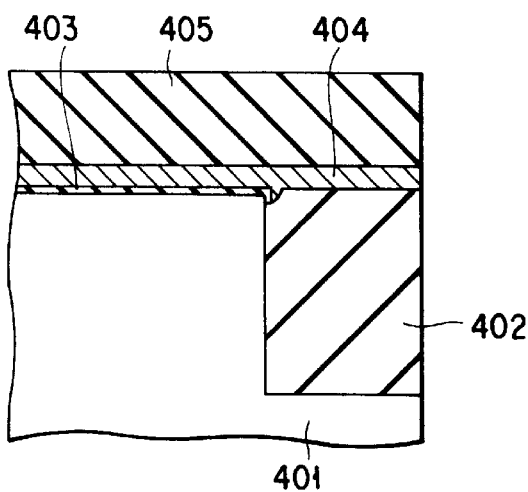

Next, an amorphous silicon (a-Si) film 404 is deposited about 20 nm by LPCVD, and a silicon nitride ($Si_3N_4$) film 405 about 100 nm by LPCVD. A resist (not shown) is coated on the structure and is patterned into a dummy gate pattern, by photolithography or EB (electron beam) patterning. The $Si_3N_4$ film 405 and a-Si film 404 are processed by RIE, forming a dummy gate 421 (FIGS. 40B and 41B).

Since the dummy gate 421 has a double-layer structure, RIE is performed easily because the a-Si film 404 serves as a stopper at the time of etching the $Si_3N_4$ film 405. This prevents the silicon substrate from being over-etched. Further, the $Si_3N_4$ film 405 can be etched for a sufficiently long time, leading to the advantage that no $Si_3N_4$ residual exists at the step portions on the STI edges. While the a-Si film 404 is crystallized in a high-temperature step of depositing the $Si_3N_4$ film 405, the grain size can be reduced by making the a-Si film thinner. It is therefore possible to reduce the roughness on the side portions which is originated from the grains, facilitating size control on the gate length.

Figure 40C:
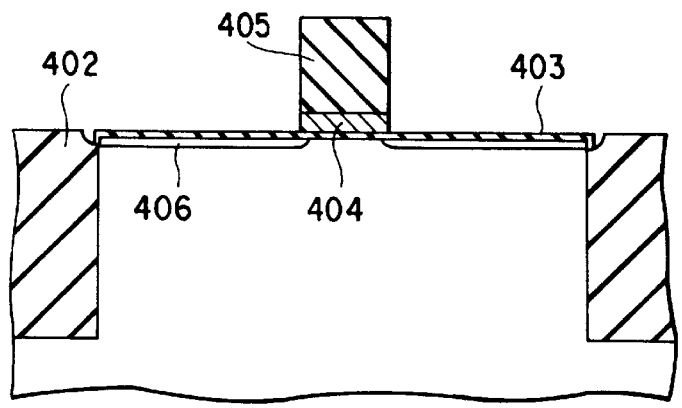

In forming an LDD structure, an impurity for forming an n$^-$ layer 406 is doped by ion implantation, solid phase diffusion or vapor phase diffusion. The resultant impurity concentration of the n$^-$ layer 406 is approximately $1\times10^{20}$ cm$^{-3}$ (FIG. 40C).

Figure 40D:
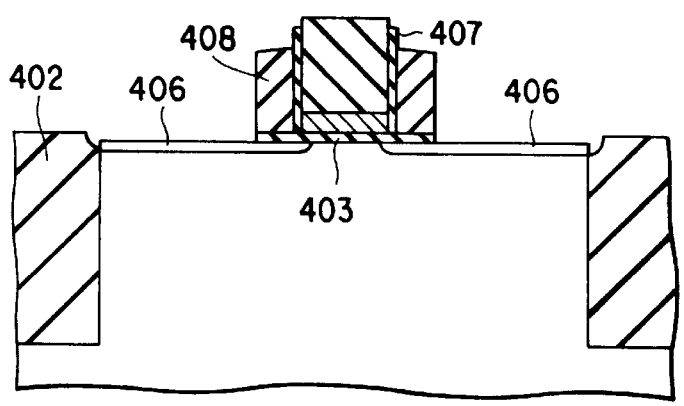

Next, a silicon nitride film is formed on the gate side wall. Specifically, a silicon oxide film 407 and a silicon nitride film 408 are deposited by LPCVD, respectively about 5 nm and 40 nm thick, RIE is performed on the entire surface, leaving the silicon nitride film 408 only on the side wall of the dummy gate (FIG. 40D).

Figure 40E:
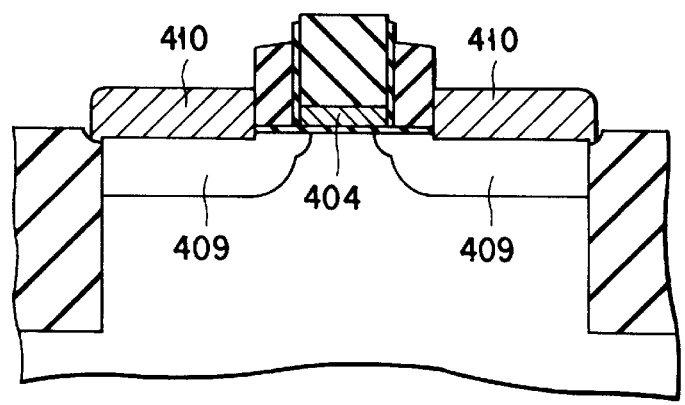

Then, a source/drain forming step is performed. An elevated source/drain is formed by selective epitaxial growth, and cobalt silicide 410 is adhered there. An n$^+$ layer 409 can be formed by ion implantation or solid phase diffusion from the elevated source/drain in such a manner that the impurity concentration becomes approximately $1\times10^{21}$ cm$^{-3}$ (FIG. 40E).

Figure 40F:
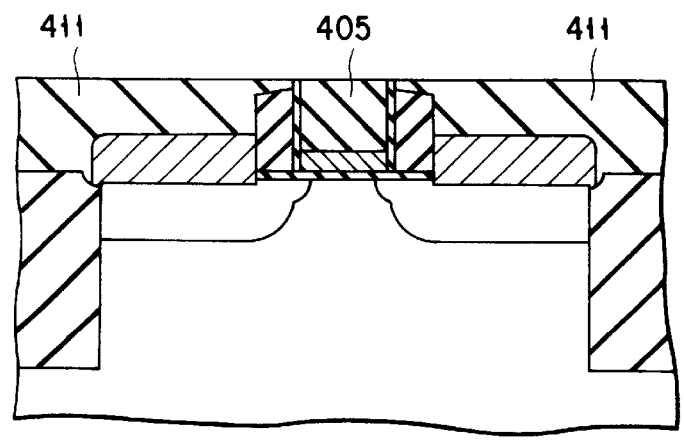
Figure 41E:
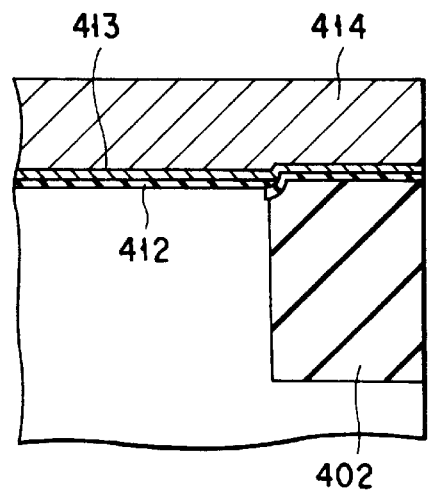
Figure 41C:
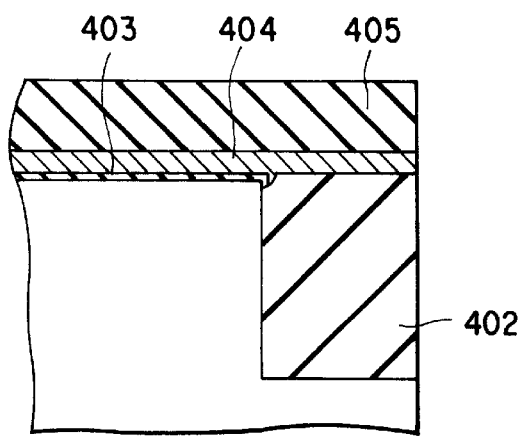

Then, an interlayer insulator film 411 is formed on the source/drain and isolation region. The film is formed by first depositing TEOS about 150 nm thick and then carrying out etch-back by CMP, making the film surface flat. At this time, the $Si_3N_4$ film 405 serves as a stopper for CMP (FIGS. 40F and 41C).

A dummy gate 421 and a dummy oxide film 403 are removed, forming a groove 422. The $Si_3N_4$ film 405 which constitutes the dummy gate can be removed by hot phosphorous acid, and an a-Si film 404 can be removed by CDE or RIE. Hot phosphorous acid can selectively remove only the $Si_3N_4$ film. The a-Si film, 20 nm in thickness, is thin and can thus be removed by short etching time. It is therefore unnecessary to form a thick etching stopper film on the base and is possible to make the dummy oxide film 403 thinner. With the dummy oxide film 403 being thin, a small amount of hydrofluoric-acid suffices to remove the dummy oxide film 403. No deep dents will be formed in edge portions of the STI 402. The small amount of hydrofluoric-acid used does not widen the groove for burying the gate (gate length)

and does facilitate size control on the gate length. The etching stops here, because the $Si_3N_4$ film 408 is formed on the side of the dummy gate in the present structure. As a result, the groove would not be widened. If the wet etching is performed excessively, however, the oxide film 403 underlying the $Si_3N_4$ film 408 may be corroded from the side. Once corrosion occurs, it is hard to form a gate insulator film later (FIGS. 40G and 41D).

Next, a gate insulator film 412 with an effective thickness of 3 to 4 nm is formed. A metal gate 414 is buried via a barrier metal 413 (reaction preventing film) having a thickness of approximately 5 to 10 nm. In this example, an SiON film is used as the gate insulator film, TiN or tungsten nitride is used for the barrier metal, and W (tungsten) is used as metal gate material. A high-dielectric film or a ferroelectric film, such as a $Ta_2O_5$ film or (Ba, Sr) $Tio_3$ film, may be used as the gate insulator film. In this case, the gate electrode material should be selected in accordance with the type of the gate insulator film to be used. More precisely, Al, Ru, TiN or the like can be used (FIGS. 40H and 41E).

Then, the surface portion of the metal gate 414 is recessed by about 30 nm by CDE or RIE, and an $Si_3N_4$ film 415 is buried there by CVD and CMP. The process up to this step allows a silicon nitride film to cover the top and the sides of the metal gate 414 (FIG. 40I).

Thereafter, TEOS as an interlayer insulator film 416 is deposited approximately 150 nm thick. Contact holes are formed above the source/drain. A metal wiring 418 of Al or Cu is formed via a barrier metal 417 of Ti/TiN or the like (FIG. 40J).

According to the above-described process, the flatness of the gate at the STI edge is improved, and thus improving the transistor characteristics. That is, the formation of the parasitic transistors at the STI edges is suppressed, the sub threshold characteristics is hump-free, and the gate breakdown voltage is improved.

A second example of the fourth embodiment will be discussed below with reference to FIGS. 42A through 42I and 43A through 43E. FIGS. 42A–42I are cross-sectional views in the gate length direction, showing a manufacturing process for a semiconductor device according to this specific example. FIGS. 43A–43H are cross-sectional views in the gate width direction. Although the diagrams show an NMOS structure, a PMOS can likewise be formed.

Figure 42A:
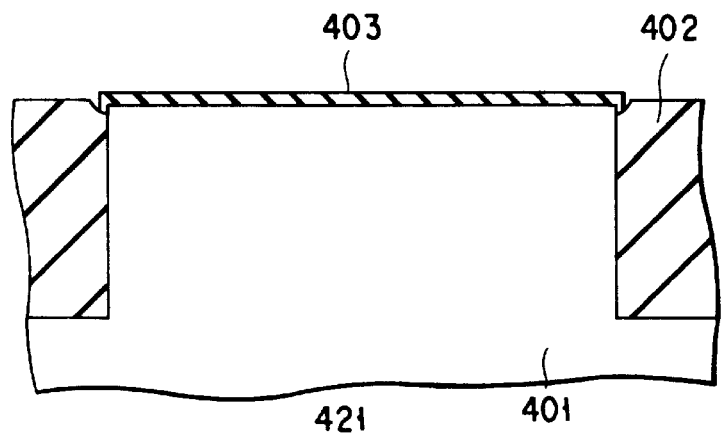

First, an Si substrate is prepared. A trench is formed about 200 nm deep by RIE in an isolation region of the substrate. Subsequently, TEOS is deposited and then buried. The resultant TEOS layer is made flat by CMP, thus forming islands 401 comprised of the Si substrate and an isolation region of an STI structure. The substrate surface is oxidized to a thickness of 15 nm, forming a dummy gate oxide film 403. The dummy gate oxide film 403 should be made thicker than that of the first specific example so that it can serve as an etching stopper later at the time the dummy gate is formed by RIE. A P type well (peak concentration of approximately $1\times10^{18}$ cm$^{-3}$) should be prepared in the NMOS region in the substrate (FIGS. 42A and 43A).

Figure 42B:
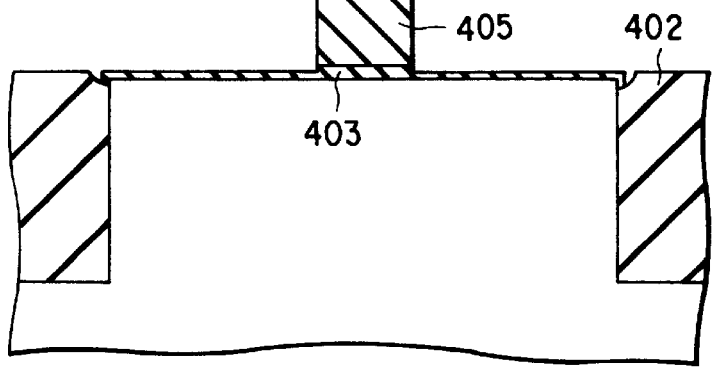

Next, an $Si_3N_4$ film 405 is deposited approximately 120 nm by LPCVD. Then, a resist (not shown) is coated on the structure and is processed into a dummy gate pattern by photolithography or EB (electron beam) patterning. The $Si_3N_4$ film 405 is processed by RIE, forming a dummy gate 421. Because the $Si_3N_4$ film is amorphous, unlike in the case of etching polysilicon, there will not arise a problem of roughness on sides of the film otherwise caused by the grains. It is therefore easy to control the gate length (FIGS. 42B and 43B).

Figure 42C:
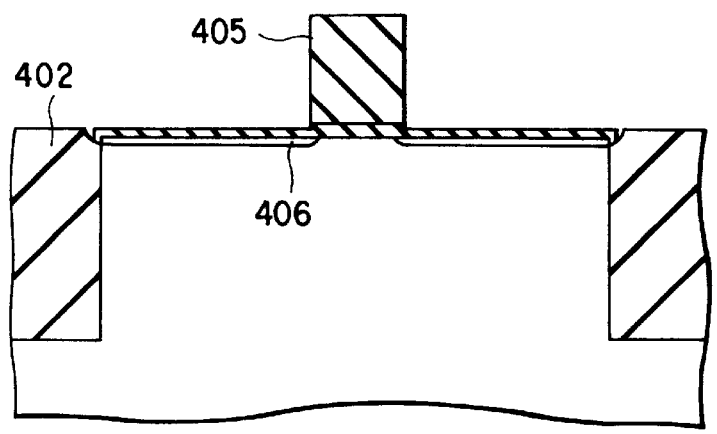

To form an LDD structure, an impurity for forming an n$^-$ layer 406 is applied by ion implantation, solid phase diffusion or vapor phase diffusion. The impurity is doped in such a way that the impurity concentration of the n$^-$ layer 406 finally becomes approximately $1\times10^{20}$ cm$^{-3}$ (FIG. 42C).

Figure 42D:
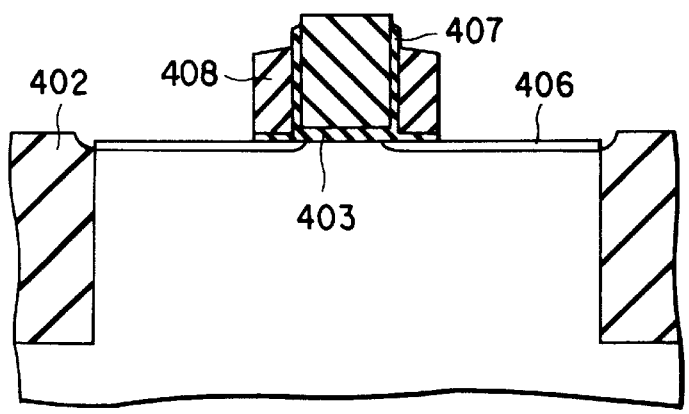

Next, a silicon nitride film is formed on the gate side wall. Specifically, a silicon oxide film 407 and a silicon nitride film 408 are deposited by LPCVD, respectively about 5 nm and 40 nm thick. RIE is performed on the entire surface, leaving the silicon nitride film 408 only on the side wall of the dummy gate (FIG. 42D).

Figure 42E:
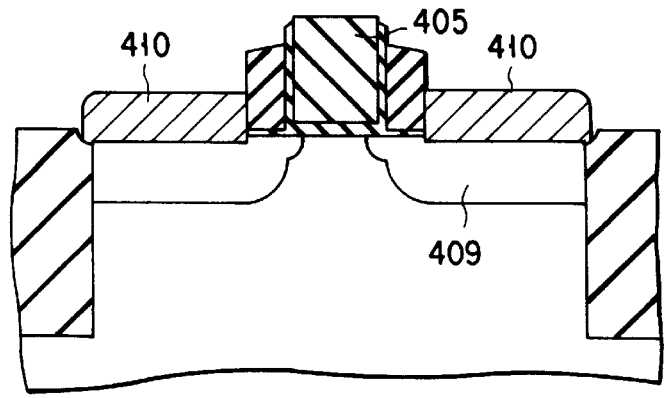

Then, an elevated source/drain is formed by selective epitaxial growth and cobalt silicide 410 is adhered there. An n$^+$ layer 409 can be formed by ion implantation or solid phase diffusion from the elevated source/drain in such a manner that the impurity concentration becomes approximately $1\times10^{21}$ cm$^{-3}$ (FIG. 42E).

Figure 42F:
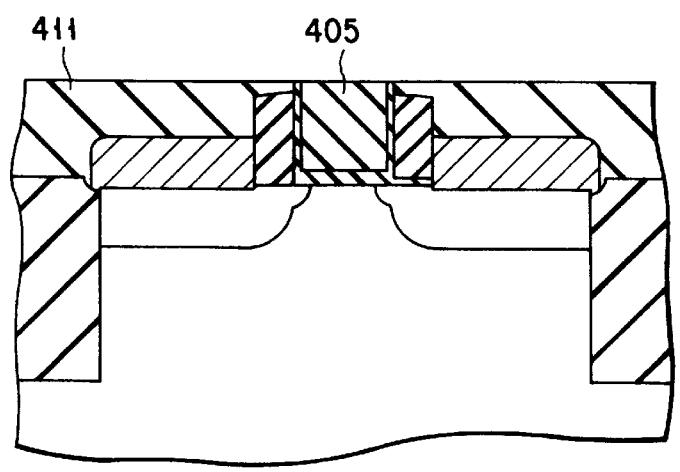

Then, an interlayer insulator film 411 is formed on the source/drain and isolation region. The film is formed by first depositing TEOS about 150 nm thick and then carrying out etch-back by CMP, making the film surface flat. At this time, the $Si_3N_4$ film 405 serves as a stopper for CMP (FIGS. 42F and 43C).

Figure 42G:
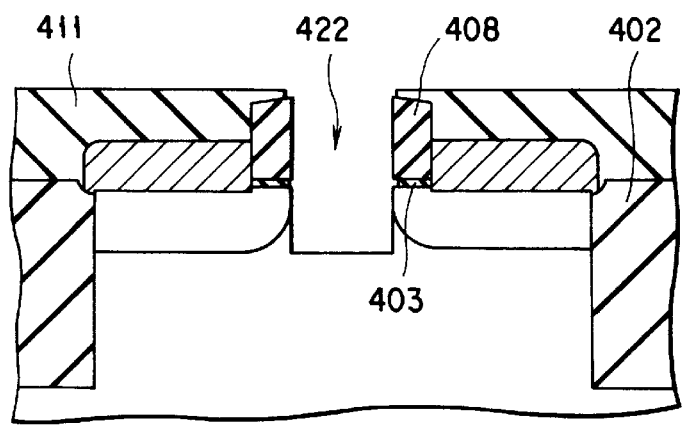

Next, a dummy gate 421 and a dummy oxide film 403 are removed, forming a groove 422. The $Si_3N_4$ film 405 which constitutes the dummy gate is removed by applying hot phosphorous acid, and the dummy oxide film 403 by applying hydrofluoric acid. As the $Si_3N_4$ film 408 is formed on the side walls of the dummy gate, wet etching stops there and the groove will not be widened. During the hydrofluoric-acid wet etching, the portions near the edges of the STI 402 are dented, exposing the edge corners of silicon which becomes the device region. Accordingly, the silicon substrate 401 is recessed about 60 nm by RIE. As a result, surface of the silicon substrate 401 at the channel region become lower than the TEOS surface of the STI region 402, preventing the edge corners of the silicon substrate 401 from being exposed (FIGS. 42G and 43D).

Figure 42H:
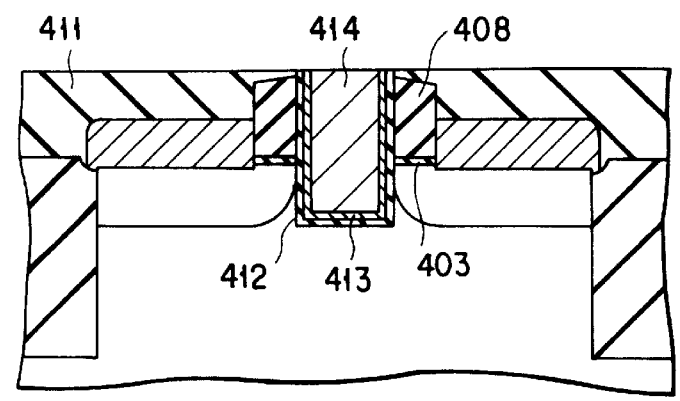

Thereafter, a gate insulator film 412 having an effective thickness of 3 to 4 nm is formed. A metal gate line 414 is buried via a barrier metal 413 with a thickness of approximately 5 to 10 nm. In this example, an SiON film is used as the gate insulator film, TiN or tungsten nitride is used for the barrier metal, and tungsten is used as a metal gate material. A high-dielectric film or a ferroelectric film, such as a $Ta_2O_5$ film or (Ba, Sr) $TiO_3$ film may be used as the gate insulator film. The gate electrode material should be selected in accordance with the type of the gate insulator film to be used. The material may be Al, Ru, TiN or the like (FIGS. 42H and 43E).

The surface portion of the metal gate 414 is recessed by about 30 nm by CDE or RIE. An $Si_3N_4$ film 415 is buried there by CVD and CMP. The process up to this step allows a silicon nitride film to cover the top and the sides of the metal gate 414 (FIG. 42I).

The subsequent steps are the same as those of the first specific example. That is, a TEOS film, or an interlayer insulator film 416, is deposited approximately 150 nm thick. Contact holes are formed above the source/drain. A metal wiring of Al or Cu is formed on a barrier metal 417 of Ti/TiN or the like.

The above-described process hardly have drop of the gate at the STI edge portions. Rather, the gate is lifted at the transitional region, from the device region to the isolation region. The transistor characteristics are thereby improved. In other words, the formation of the parasitic transistors at the STI edges is suppressed, the sub threshold characteristics is hump-free, and the gate breakdown voltage is improved.

As apparent from the foregoing, the first to fourth embodiments can suppress exposure of the edge corners of the device region and can thus prevent the transistor characteristics from being impaired by local concentration of an electric field on the edge corners.

Fifth to eighth embodiments which will be described below relate to examples where a dummy gate side wall is used.

Fifth Embodiment

Figure 44A:
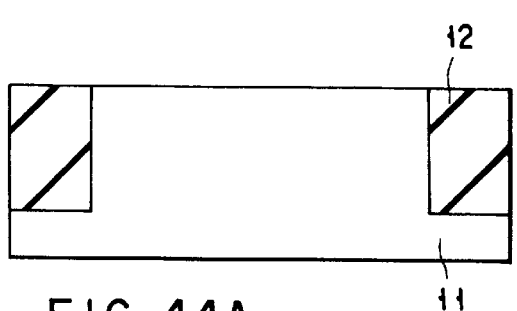
FIGS. 44A through 44N are cross-sectional views showing a process of manufacturing a semiconductor device according to a fifth embodiment.
Figure 44B:
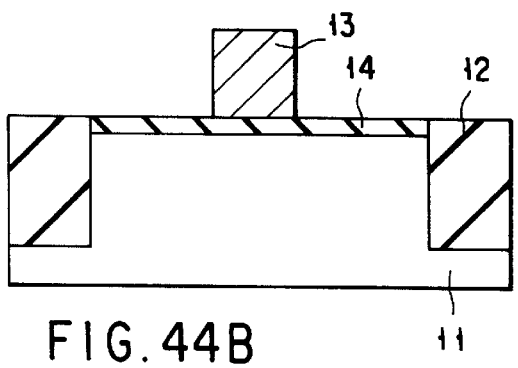
Figure 44C:
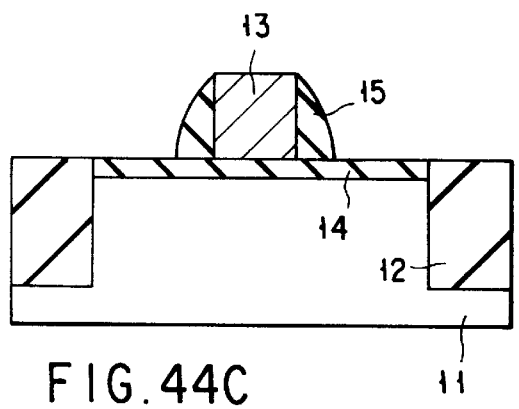
Figure 44D:
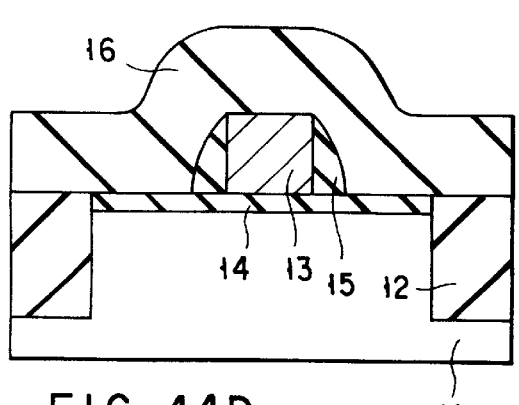
Figure 44E:
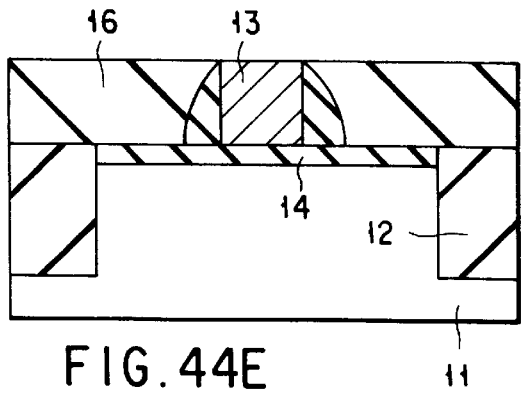
Figure 44F:
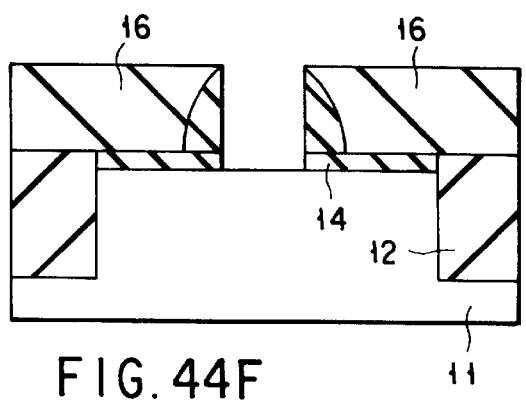
Figure 44G:
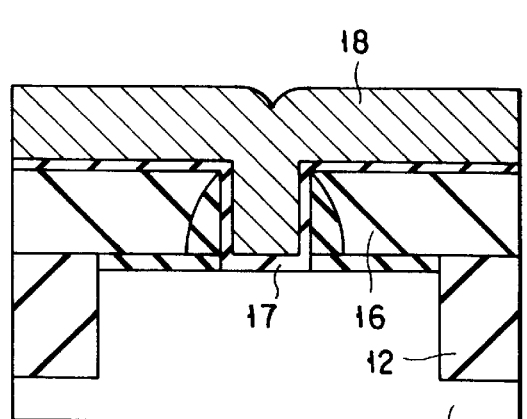
Figure 44H:
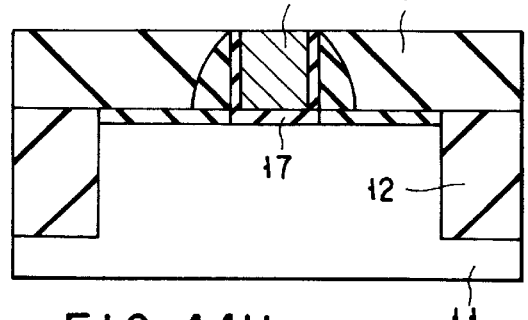
Figure 44I:
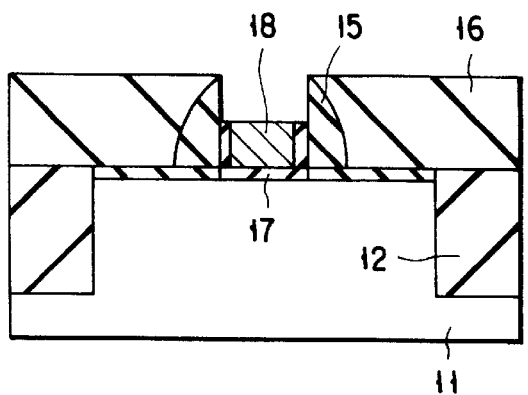
Figure 44L:
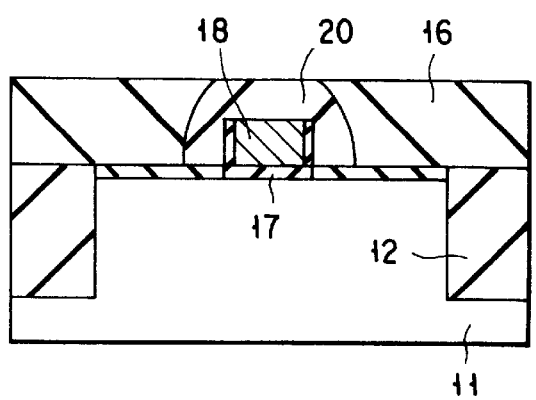
Figure 44J:
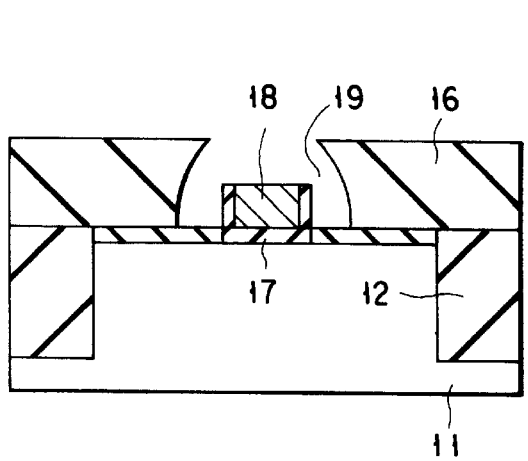
Figure 44M:
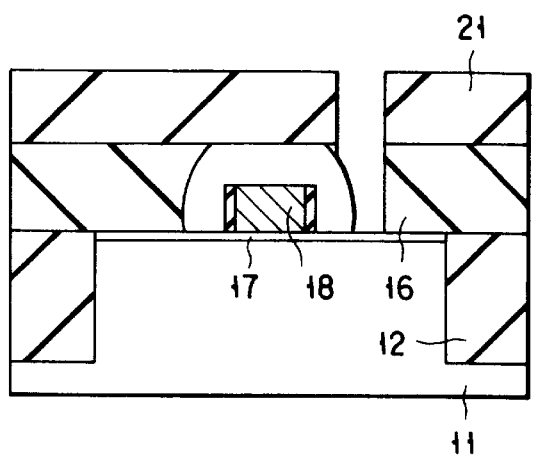
Figure 44K:
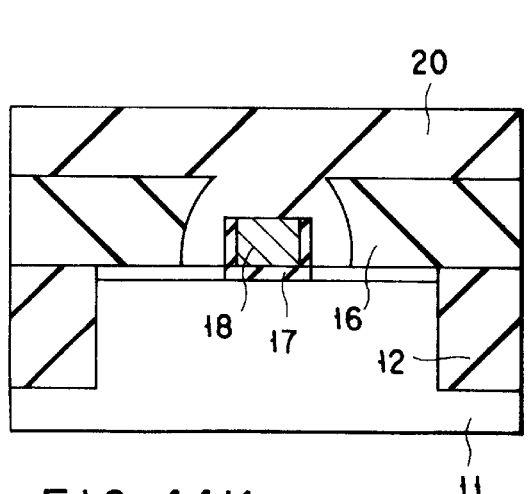
Figure 44N:
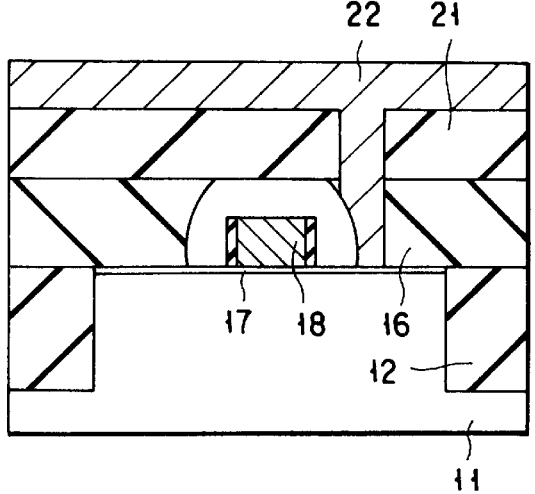

FIGS. 44A through 44N are cross-sectional views, explaining a process of manufacturing a semiconductor device according to the fifth embodiment.

First, a shallow trench-type device isolation (STI) region 12 is formed in a silicon substrate 11 of by a known scheme. The STI region 12 forms a device region isolated from other regions (FIG. 44A).

This step is carried out as follows. A silicon nitride film to be a mask is deposited on the silicon substrate 11 on a buffer oxide film, and a resist pattern for the transfer purpose is formed. The silicon nitride film is patterned by RIE, forming a device region pattern. With the silicon nitride film used as a mask, the silicon substrate 11 is etched at the isolation region, forming a trench. After removing the resist, an insulator film such as a silicon oxide film is deposited on the entire surface. Planarization is conducted using CMP or the like, at the top of the silicon nitride film serving as a mask. Then, the silicon nitride film and buffer oxide film are removed, forming an isolation region, which is the insulator film buried in the trench, and also forming a device region which is isolated from other regions by the isolation region.

Next, a silicon nitride film, for example, is deposited on the device region on a buffer oxide film 14 such as a silicon oxide film. The silicon nitride film is etched by RIE or the like, with a resist pattern used as a mask, thereby forming a dummy gate 13 (FIG. 44B). Before or after the dummy gate 13 is formed, ion implantation of an impurity may be carried out to control the impurity profile of the channel region and the diffusion region.

Polycrystalline or amorphous silicon is deposited on the entire surface, forming a dummy side wall 15 on the sides of the dummy gate 13 by RIE (FIG. 44C). Thereafter, ion implantation is performed, forming a source and drain.

An interlayer insulator film 16 is deposited on the entire surface (FIG. 44D). Planarization is implemented at the top of the dummy gate 13 by using CMP or the like (FIG. 44E). The dummy gate 13 and the buffer oxide film 14 are removed (FIG. 44F). A new gate insulator film 17 is formed, and a gate electrode 18 is deposited (FIG. 44G). If the gate electrode 18 is made of metal, a reaction preventing layer will be formed between the gate insulator film 17 and the gate electrode 18.

The gate electrode 18 is planarized (FIG. 44H). The top surface of the gate electrode 18 is etched a little, exposing the dummy side wall 15 is exposed sufficiently (FIG. 44I).

In this case, the dummy side wall 15 may be exposed at the time of planarizing the gate electrode 18. If so, it may not be necessary to etch the top surface of the gate electrode 18.

Next, the exposed dummy side wall 15 is removed by etching with, for example, KOH, forming a cavity 19. The cavity 19 serves as a mold for later forming a new side wall (FIG. 44J).

A material 20 having a high insulation property and high selectivity with respect to RIE for forming contact holes or RIE for an interlayer insulator film is supplied into the cavity 19 (FIG. 44K). The material 20 may be $Si_3N_4$. An organic material having an insulation property may be used instead in order to form a side wall with a lower dielectric constant.

The side wall material that has come out of the cavity 19 is removed by, for example, CMP and at the same time planarization is conducted. The side wall 20 is thereby formed (FIG. 44L).

Thereafter, a transistor is completed through a well-known transistor manufacturing process. That is, after an interlayer insulator film 21 is deposited, and contact holes for contacts to the source/drain region are formed by RIE with a resist pattern used as a mask (FIG. 44M).

Because of the presence of the side wall 20 in this embodiment, contact holes for the source/drain are not directly open to the top surface of the gate electrode, even if patterning is slightly misaligned at the time of forming the resist pattern. The gate electrode is therefore prevented from being short-circuited with the source/drain region.

Thereafter, contact holes for the gate electrode tolerant to misalignment are made. A reaction preventing layer is formed in the contact holes to the gate electrode and the source/drain region. Al, for example, is filled in the contact holes. Then, a separate resist pattern is formed. The Al layer is etched with this resist pattern used as a mask, forming a first layer of wirings 22 (FIG. 44N).

Sixth Embodiment

FIGS. 45A through 45K are cross-sectional views showing a process of manufacturing a semiconductor device according to the sixth embodiment.

The sixth embodiment is different from the fifth embodiment in that the dummy gate has a double-layer structure comprising a polycrystalline or amorphous silicon film and a silicon nitride film.

Figure 45A:
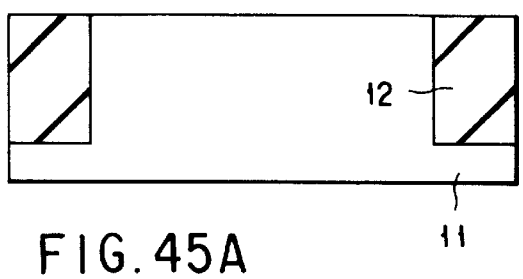
FIGS. 45A through 45K are cross-sectional views depicting a process of manufacturing a semiconductor device according to a sixth embodiment.

As in the fifth embodiment, a shallow trench type device isolation (STI) region 12 is formed on a silicon substrate 11 by a known scheme. The STI region 12 forms a device region isolated from other regions (FIG. 45A). Next, a dummy gate layer comprising, for example, a polycrystalline or amorphous silicon film and a silicon nitride film is deposited on the device region on a buffer layer 14 such as a silicon oxide film. With a resist pattern used as a mask, the dummy gate layer is etched by RIE or the like, forming a dummy gate 13 which comprises an amorphous silicon film 23 and a silicon nitride film 24 (FIG. 45B). Before or after the dummy gate 13 is formed, ion implantation of an impurity may be carried out to control the impurity profile of the channel region and the diffusion region.

Figure 45E:
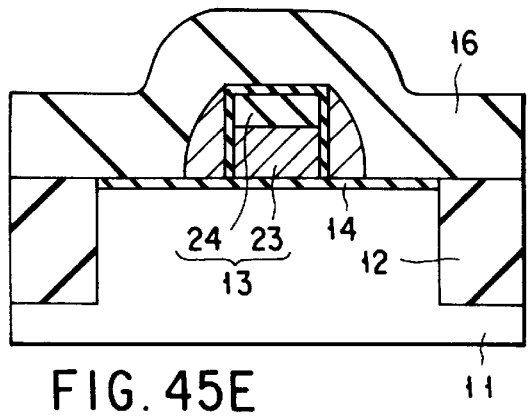
Figure 45B:
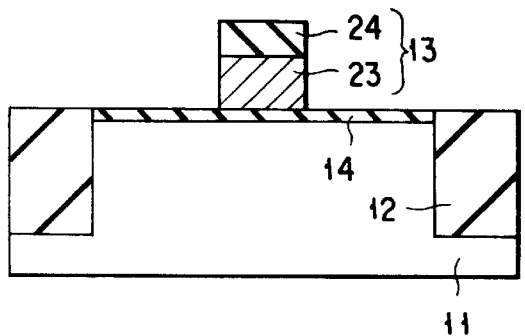
Figure 45F:
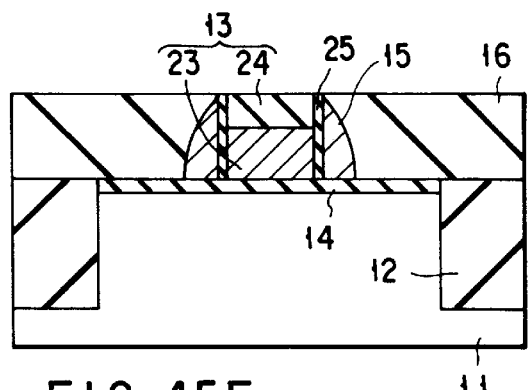
Figure 45C:
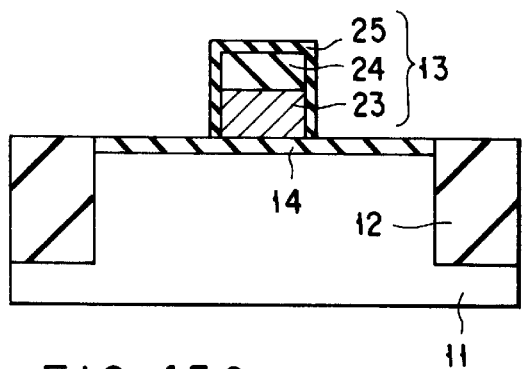
Figure 45G:
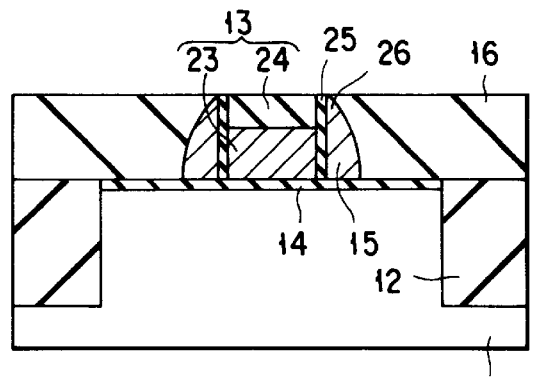
Figure 45D:
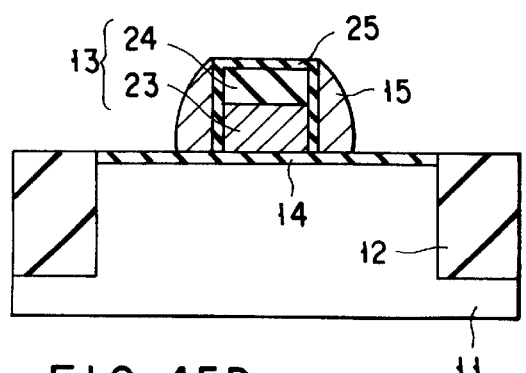
Figure 45H:
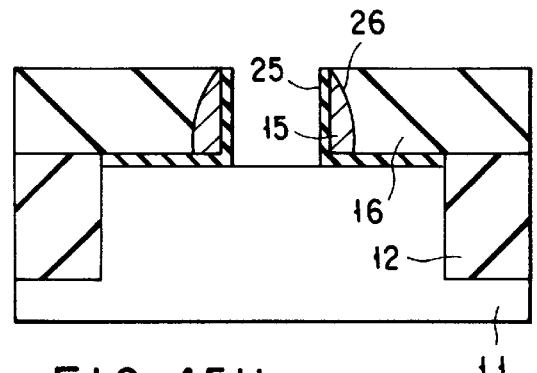
Figure 46A:
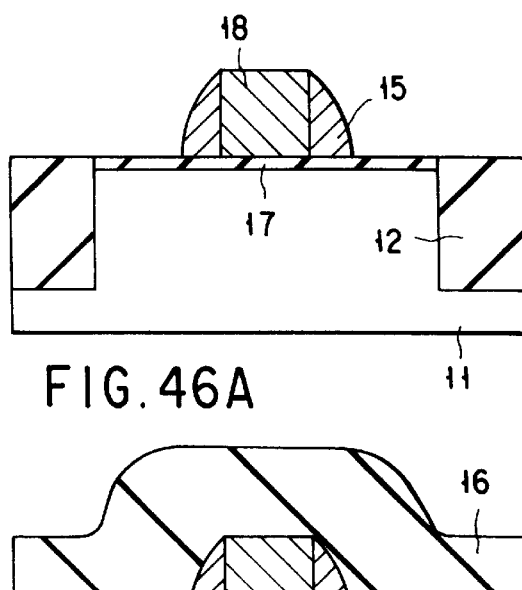
FIGS. 46A through 46G are cross-sectional views showing a process manufacturing a semiconductor device according to a seventh embodiment.

Then, a thin silicon oxide film 25 is deposited on the entire surface (FIG. 45C). Polycrystalline or amorphous silicon is deposited on the resultant surface. A dummy side wall 15 is formed on the sides of the dummy gate by RIE (FIG. 45D). Thereafter, ion implantation is performed, forming a source and drain.

An interlayer insulator film 16 is deposited on the entire surface (FIG. 45E). Planarization is performed at the top of the dummy gate 13 by using CMP or the like (FIG. 45F). If the dummy side wall 15 is exposed, the exposed portion of the dummy side wall 15 is oxidized, forming an oxide film 26 that covers the dummy side wall 15 (FIG. 45G).

Next, the dummy gate 13 and buffer oxide film 14 are removed. Even if the dummy side wall 15 is comprised of amorphous silicon, the dummy side wall 15 is covered with an oxide film. This makes it possible to remove the dummy gate 13 only (FIG. 44H).

Figure 45I:
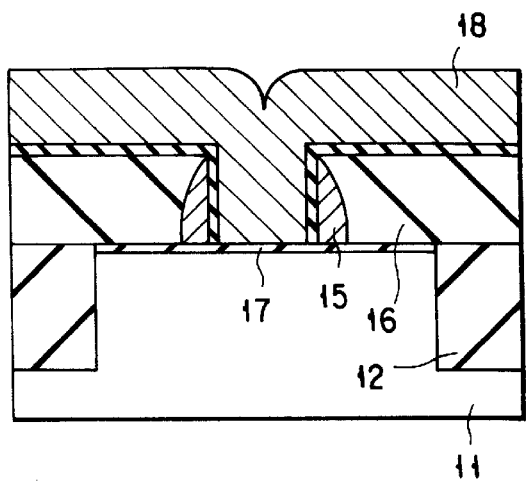
Figure 45J:
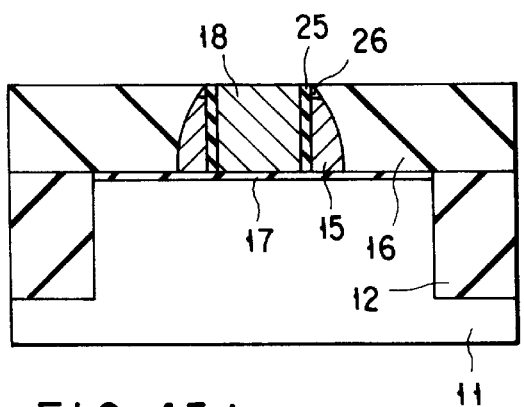
Figure 45K:
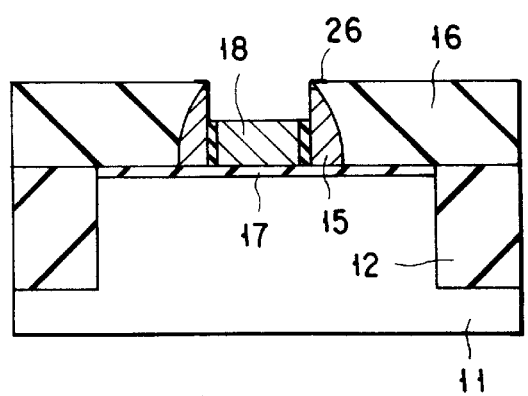

The subsequent steps are the same as those of the fifth embodiment. Specifically, a new gate insulator film and a gate electrode are deposited (FIG. 45I). The gate electrode is planarized (FIG. 45J). The top surface of the gate electrode 18 is etched slightly, exposing the dummy side wall 15 sufficiently (FIG. 45K). Then, the dummy side wall exposed is removed by etching with, for example, KOH, forming a cavity. Material with a high insulation property and high selectivity with respect to RIE for forming contact holes or RIE for an oxide film is supplied into this cavity. Thereafter, the side wall material that has been pushed out of the cavity is removed by using, for example, CMP. At the same time, planarization is carried out, forming of the side wall.

Seventh Embodiment

FIGS. 46A through 46G are cross-sectional views showing a process of manufacturing a semiconductor device according to the seventh embodiment.

First, a shallow trench type device isolation (STI) region 12 is formed on a silicon substrate 11 by a known scheme. The STI region 12 forms a device region isolated from other regions. Then, impurities may be ion-implanted to control a channel profile.

Next, a silicon nitride film 17 used as a gate insulator film is formed on the device region. Phosphorus-containing, conductive polycrystalline silicon is deposited. Gate patterning is performed, and etching with RIE or the like is carried out, forming the gate electrode 18. Ion implantation of an impurity may be carried out at this stage to control the impurity profile of the diffusion region.

Figure 46B:
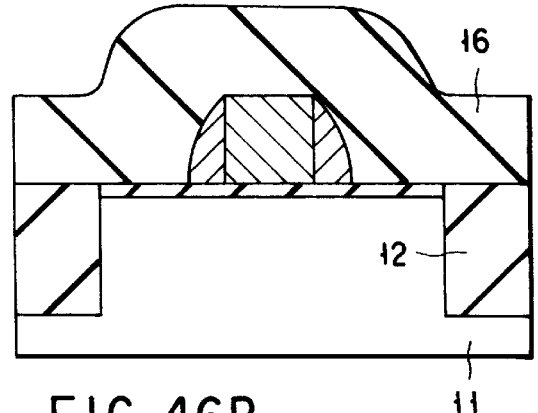
Figure 46C:
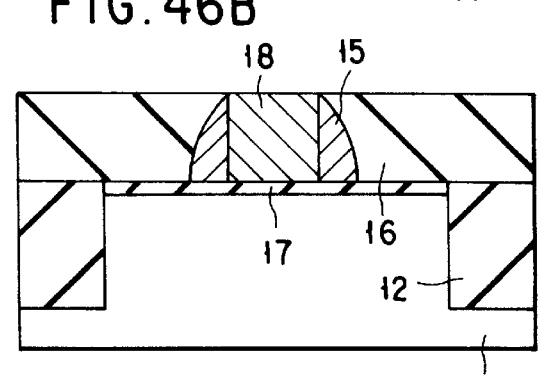

Then, a silicon nitride film is deposited. Etching with RIE is conducted, forming a side wall 15 on the sides of the gate electrode 18 (FIG. 446A). Thereafter, ion implantation is carried out to form source and drain regions. An interlayer insulator film 16 is deposited (FIG. 46B). Planarization is implemented by CMP or the like, exposing the top surface of the gate electrode 18 (FIG. 46C).

Figure 46D:
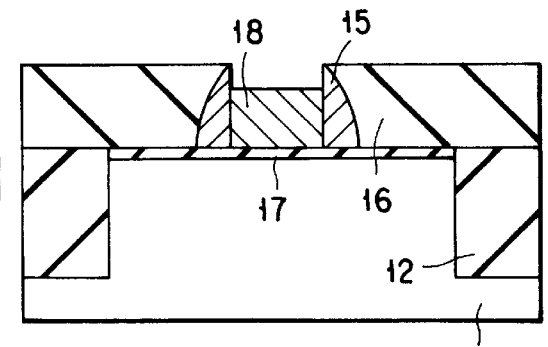
Figure 46E:
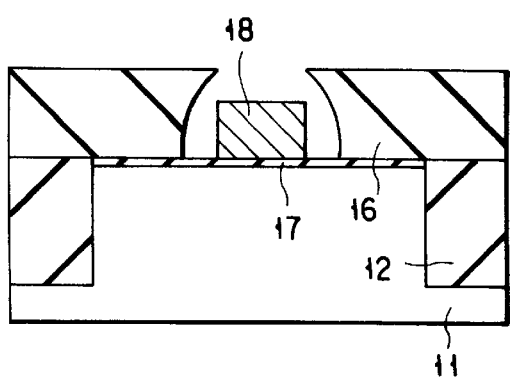

The gate electrode 18 is etched back (FIG. 46D). The exposed silicon nitride side wall 15 is removed by, for example, a hot phosphorous acid treatment, forming a cavity 19 which serves as a mold for forming a new sidewall (FIG. 46E).

Figure 46F:
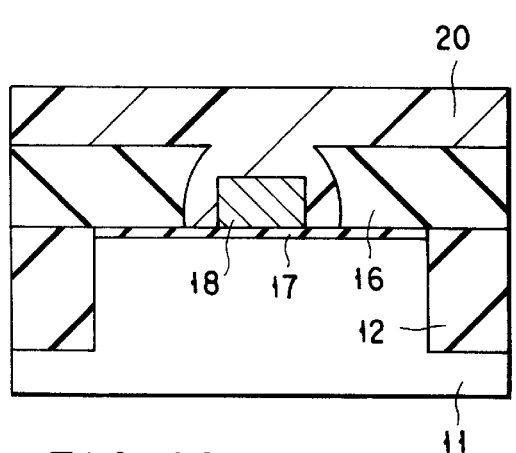
Figure 46G:
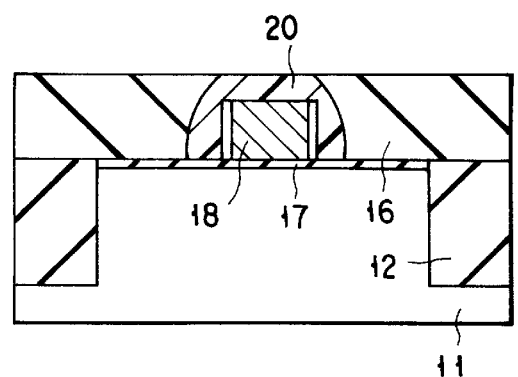

Insulative organic material 20, a material for the side wall, which has a high etch selectivity with respect to a silicon oxide film and has a lower dielectric constant than a silicon nitride film, is supplied into the cavity 19 (FIG. 46F). The side wall material that has come out of the cavity 19 is removed by using, for example, CMP. Simultaneously, planarization is conducted, forming burying of the side wall 20 (FIG. 46G).

Thereafter, a transistor is completed through a known transistor process. Specifically, an interlayer insulator film is deposited. Contact holes for forming contacts to the source/drain are formed by RIE, with a resist pattern used as a mask. Because of the presence of the side wall formed in this embodiment, contact holes for the source/drain are not directly open to the top surface of the gate electrode, even if patterning is slightly misaligned. The gate electrode is therefore prevented from being short-circuited with the source/drain region.

Contact holes for the gate are made, a reaction preventing layer is formed in the contact holes to the gate electrode and the source/drain region, and then Al, for example, is buried in the contact holes. With a resist pattern used as a mask, an Al layer is etched, forming a first layer of wirings.

Eighth Embodiment

The eighth embodiment is concerned with the formation of wirings.

Polycrystalline silicon is deposited on an interlayer insulator film deposited on a lower-layer wiring. The polycrystalline silicon film is etched with a resist pattern used as a mask, forming a dummy wiring. A silicon nitride film is deposited and etched to form a dummy side wall on the sides of the dummy wiring.

Then, an interlayer insulator film is deposited. Planarization by CMP or the like is carried out, exposing the top surface portion of the dummy wiring. The dummy wiring is removed, forming a groove. Wiring material (e.g., aluminum, tungsten, copper or the like) is deposited and planarization is carried out by CMP or the like, burying the wiring material in the groove.

Further, the top portion of the buried wiring is etched back by dry etching, exposing the dummy side wall. The dummy side wall is removed by, for example, hot phosphorous acid treatment, forming a cavity. A side wall material is deposited in the cavity. Then, insulative organic material, which is material of the side wall, and which has a high etch selectivity with respect to a silicon oxide film and has a lower dielectric constant than a silicon nitride film, is supplied into the cavity. The side wall material that has come out of the cavity is removed by using, for example, CMP. At the same time planarization is conducted, completely burying the side wall.

In the above-described fifth to eighth embodiments, the material for the side wall is not limited to an organic material. It may be any insulative material which has a high etch selectivity with a silicon oxide film or an interlayer insulator film. The insulative material, having a low dielectric constant is particularly preferable from the viewpoint of the electric characteristics like a high-frequency characteristic. The dummy side wall may be removed by dry etching as well as wet etching.

In a case of directly forming a side wall on the dummy gate by RIE in the machine process, the margin for RIE for forming the side wall or CMP for planarization becomes considerably narrow. According to the methods of the fifth and sixth embodiments, the use of the dummy side wall can permit a wider margin against a variation in RIE for forming the side wall or CMP for planarization. This helps to improve the yield of products. Further, the methods of the fifth to eighth embodiments, in which damascene gate transistors, conventional transistors, and side walls are formed, can use a low-dielectric film, such as an organic insulator film, on the side walls. Since the methods do not comprise the high temperature step such as activation of the diffusion region after the side wall is formed. This reduces the parasitic capacitance to ensure a high-frequency operation.

Ninth and tenth embodiments to be discussed below are concerned with cases where $Ta_2O_5$ is used for the gate liner.

Ninth Embodiment

FIGS. 47A through 47J are cross-sectional views showing a process of manufacturing a semiconductor device according to the ninth embodiment.

Figure 47A:
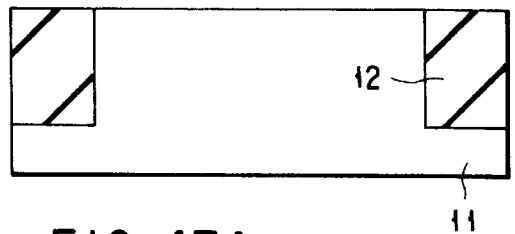
FIGS. 47A through 47J are cross-sectional views illustrating a press of manufacturing a semiconductor device according to a ninth embodiment.

First, a shallow trench type device isolation (STI) region 12 is formed on a silicon substrate 11 by a known scheme. The STI region 12 forms a device region isolated from other regions (FIG. 47A).

Figure 47B:
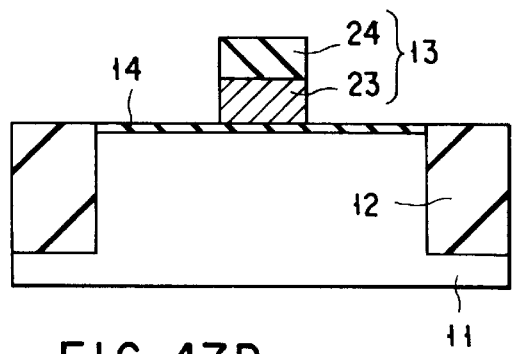

Next, a silicon oxide film 14 used as a buffer layer, for example, is formed. An amorphous silicon or polycrystalline silicon film to be a dummy gate is deposited. A silicon nitride film is deposited thereon, forming a dummy gate layer. With a resist pattern used as a mask, the dummy gate layer is etched by RIE or the like, thus forming a dummy gate 13 comprised of an amorphous silicon film 23 and a silicon nitride film 24 (FIG. 47B). Ion implantation of an impurity may be carried out before or after the dummy gate is formed, in order to control the impurity profiles of the channel region and diffusion region.

Figure 47C:
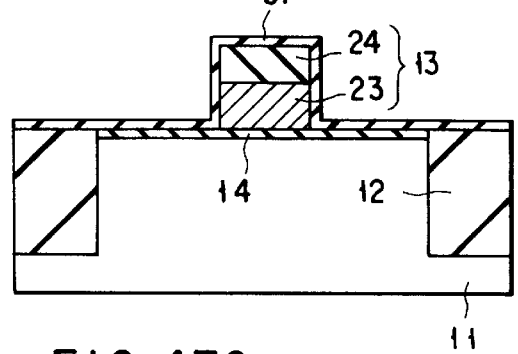
Figure 47D:
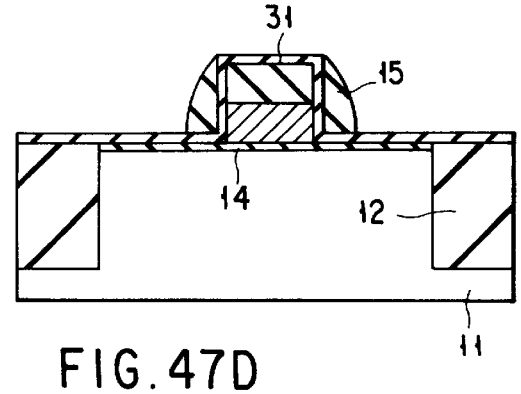
Figure 47E:
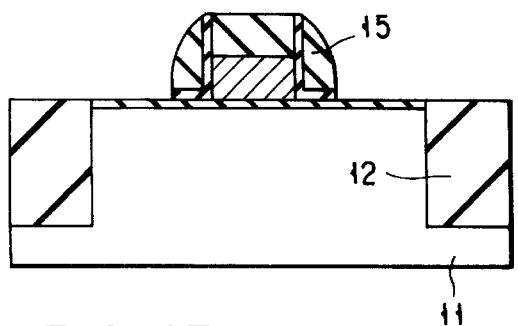

Tantalum oxide is deposited 10 nm thick on the entire surface to form a liner 31 for the gate (dummy gate) (FIG. 47C). An oxide film, for example, is deposited. Etching by RIE or the like is conducted, forming a side wall 15 on the sides of the dummy gate 13 (FIG. 47D). That part of an tantalum oxide film 31 at a portion which is not covered with the side wall 15 is removed by dry etching (FIG. 47E). In this case, it is ascertained that tantalum film can be removed in an ordinal etching condition.

Figure 47H:
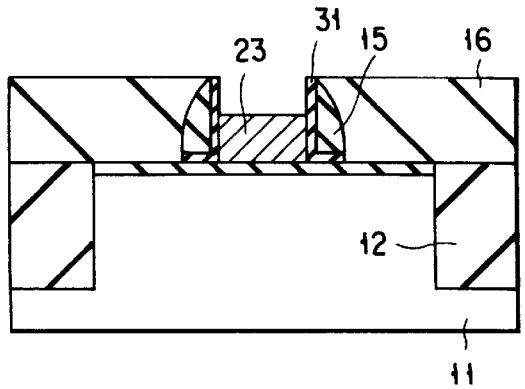
Figure 47F:
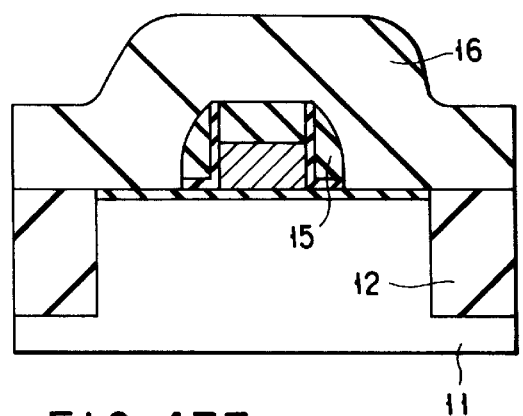
Figure 47I:
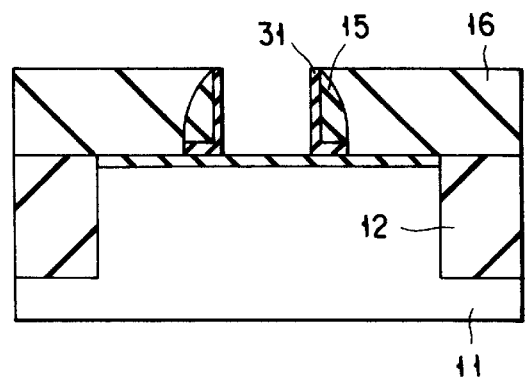
Figure 47G:
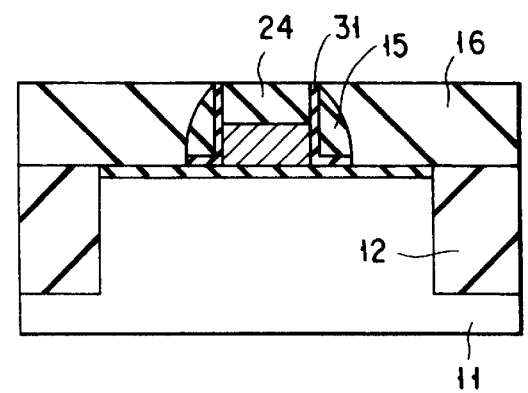

Further, ion implantation is carried out, forming a source/drain region. An interlayer insulator film 16 is deposited on the entire surface, burying the dummy gate (FIG. 47F). Planarization is carried out by CMP or the like (FIG. 47G). At this time, the top surface of the dummy gate 13 is exposed. A silicon nitride film 24 on the upper layer of the dummy gate 13 is removed by hot phosphorous acid treatment (FIG. 47H). The polycrystalline or amorphous silicon film 23, below the lower layer of the dummy gate 13 is removed by KOH or a mixed acid (FIG. 47I).

Figure 47J:
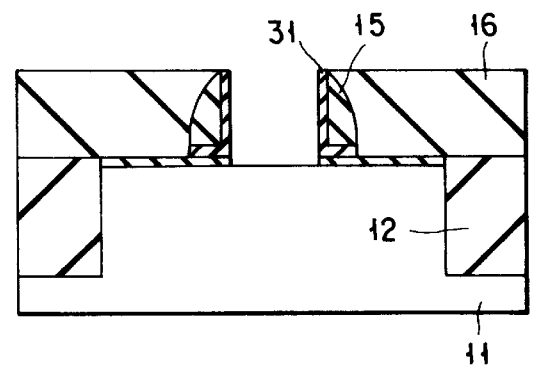

Finally, the silicon oxide film formed as a buffer is removed by hydrofluoric acid, thereby forming, a groove 32, in which the gate will be formed (FIG. 47J). Although tantalum oxide is also etched by hydrofluoric acid, it may be contemplated that tantalum oxide is hardly etched due to the etching rate of ⅟₂₅ to the silicon oxide film.

The subsequent steps are the same as those of the ordinary process of forming the damascene gate. That is, the silicon substrate 11 is oxidized or an insulator film is deposited, forming a gate insulator film (tantalum oxide may be used for the insulator film). If necessary, a reaction preventing layer is formed, and an electrode material is deposited on the entire surface. Planarization by CMP or the like permits the gate electrode to be formed in the groove after the dummy gate has been removed from the groove.

Tenth Embodiment

Figure 48A:
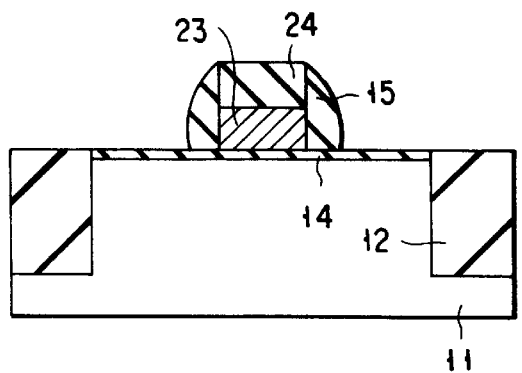
FIGS. 48A through 48C are cross-sectional views showing a process of manufacturing a semiconductor device according to a tenth embodiment.
Figure 48B:
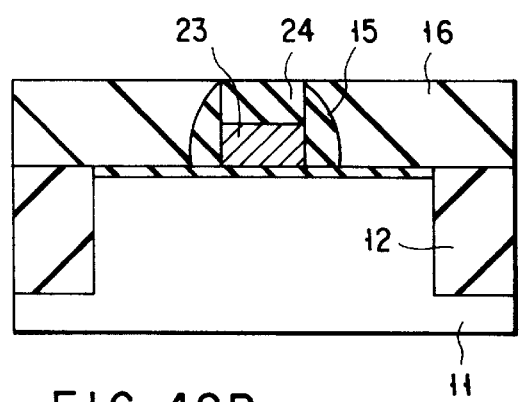
Figure 48C:
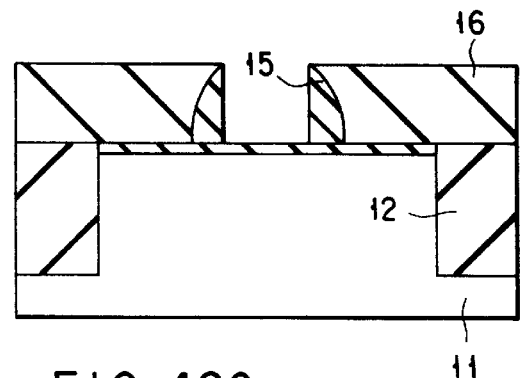

The tenth embodiment is different from the ninth embodiment in that a gate liner is directly formed on the sides of the dummy gate as a side wall. In other words, the gate liner is deposited after the dummy gate is formed on the device region isolated by the STI region as in the ninth embodiment. In this embodiment, the gate liner formed as a side wall, becomes thick after formation. It is therefore desirable to use a film with a lower dielectric constant than tantalum oxide. For example, yttrium oxide is used. After the deposition, a side wall 15 is formed on the sides of the dummy gate 13 by anisotropic etching (FIG. 48A).

With the dummy gate 13 and the side wall 15 used as masks, ion implantation is carried out, forming a source/drain region. An interlayer insulator film 16 is deposited, burying the dummy gate 13. Planarization by CMP or the like is carried out, exposing the top surface of the dummy gate 13. The exposed dummy gate 13 is removed, forming a groove 32, in which the gate is to be formed. If the dummy gate 13 is comprised of, for example, the silicon nitride film 24 and the amorphous silicon film 23, it is removed by a hot phosphorous acid treatment and a mixed-acid treatment as in the ninth embodiment.

Then, a hydrofluoric-acid treatment is executed, removing the silicon oxide film 14 formed as a buffer. However, the side wall 15 will not be etched out because yttrium oxide is not solutable to hydrofluoric acid.

The subsequent steps are the same as those of the ordinary process of forming the damascene gate. That is, the silicon substrate 11 is oxidized or an insulator film is deposited, forming a gate insulator film (tantalum oxide may be used for the insulator film). If necessary, a reaction preventing layer is formed and an electrode material is deposited on the entire surface. Planarization by CMP or the like permits the gate electrode to be formed in the groove from which the dummy gate has been removed.

In the ninth and tenth embodiments, the material for the liner is not limited to tantalum oxide. Niobium oxide, yttrium oxide or cerium oxide may be used as well. Further, tantalum oxide, niobium oxide or cerium oxide may be used as material of the side wall. Furthermore, the dummy gate may have a multilayer structure as well as a single layer structure.

According to the transistors produced by the ninth and tenth embodiments, a groove, in which the gate will be formed later, does not become unnecessarily wide at the time of removing the dummy gate. This is very advantageous for miniaturization. For example, the minimum gate line size does not become narrower than the designed size. Therefore, the capacitance between wirings which may become a bottleneck in ensuring the high-frequency operation. The gate line has the size as designed with respect to the source/drain contact. Hence, it is unnecessary to include the widened portion of the gate line in the patterning margin for the contact. This helps to enhance the integration density. To suppress widening of the upper portion of the gate by the prior art, the gate should generally be thin, inevitably increasing the gate line resistance. In these embodiments, the finished gate need not be thin to reduce the gate line resistance, reducing the power consumption and influence on the dielectric characteristic.

Eleventh Embodiment

A manufacturing method of manufacturing a semiconductor device according to the eleventh embodiment will now be discussed with reference to FIGS. 49A through 49I.

Figure 49A:
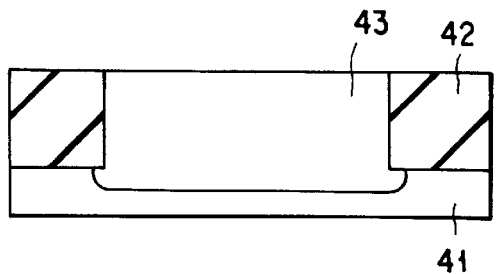
FIGS. 49A through 49I are cross-sectional views depicting a process of manufacturing a semiconductor device according to an eleventh embodiment.
Figure 49B:
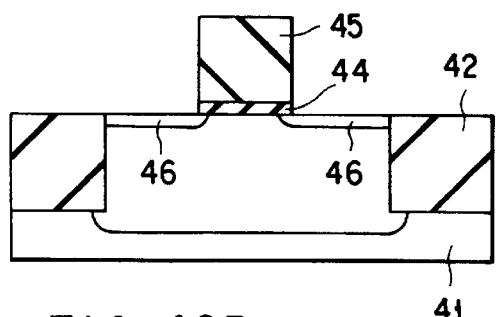

A device isolation insulator film 42 and a p-type diffusion layer 43 are formed on a silicon substrate 41 (FIG. 49A). Then, the surface of the silicon substrate 41 is oxidized by thermal oxidization, forming a silicon oxide film 44. A silicon nitride film 45 is deposited approximately 200 nm thick on the silicon oxide film 44. The silicon nitride film 45 is patterned, forming a dummy gate electrode 45. With this dummy gate electrode 45 used a mask, ions of an n-type impurity like arsenic are implanted. The impurity is activated by a heat treatment at 750° C. or higher, forming an n⁻ type LDD diffusion layer 46 (FIG. 49B).

Then, a silicon oxide film 47 about 10 nm thick is deposited on the entire surface, a silicon nitride film 48 about 10 nm thick is deposited, covering the dummy gate electrode. A silicon oxide film 49 about 50 nm thick is deposited. Anisotropic etching is carried out forming a silicon oxide side wall 49.

Figure 49C:
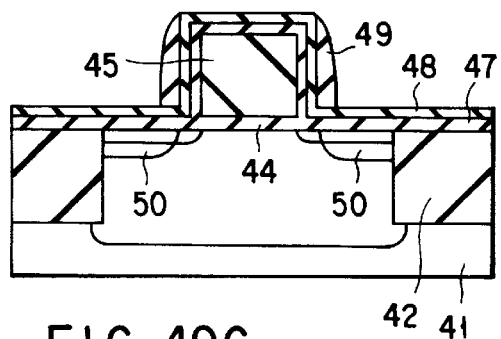

With the dummy gate electrode 45 and the insulator films 47, 48 and 49 on the sides thereof used as masks, ion injection and activation of impurity are implemented again by a heat treatment at 900° C. or higher, forming an n⁺ impurity diffusion layer (source/drain region) 50 (FIG. 49C).

Figure 49D:
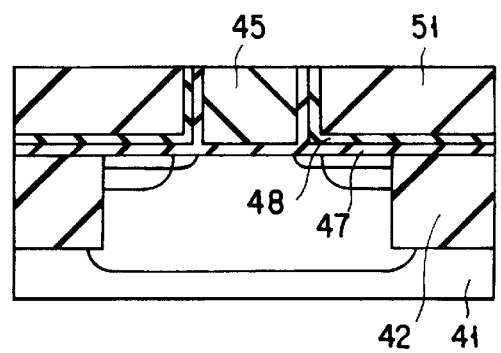

Next, a silicon oxide film 51 is deposited on the entire surface, polished and made flat, by using the silicon nitride film 48 or 45 as a stopper. As shown in the drawing the silicon nitride film 48 located above the dummy gate electrode 45 is removed when the silicon oxide film 51 is polished, and polishing is stopped at the dummy gate electrode 45. If polishing is stopped at the silicon nitride film 48, substantially the same results will be obtained by performing the following steps (FIG. 49D).

Figure 49E:
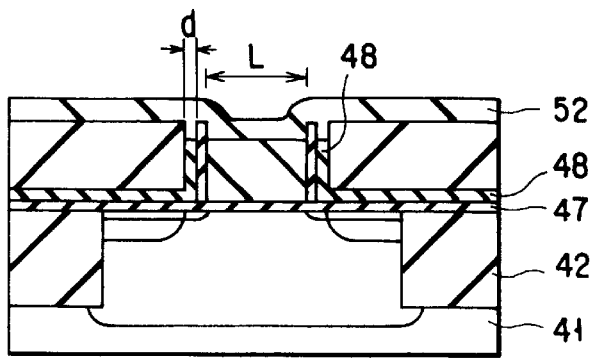

The dummy gate 45 and the silicon nitride film 48, both exposed, are etched about 50 nm by means of hot phosphoric acid treatment or the like, thereby forming two grooves having widths L and d. A silicon oxide film 52 about 10 nm thick is deposited on the entire surface. At this time, the thickness of this silicon oxide film 52 must be equal to or less than at least half the width (L) of the dummy gate electrode and must be equal to or more than half the thickness d of the silicon nitride film 48 (FIG. 49E). That is, the thickness of the silicon oxide film 52 should be so set that the groove on the silicon nitride film 48 is buried but the groove on the dummy gate 45 is not.

Figure 49F:
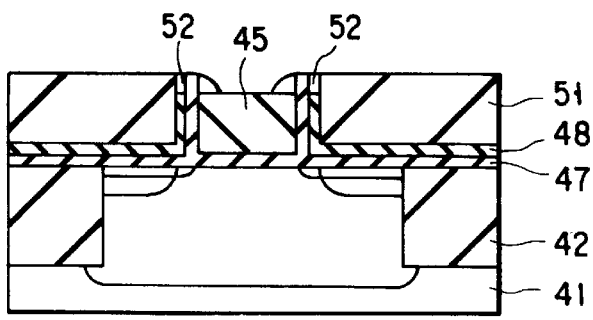

Next, the silicon oxide film 52 is etched back by anisotropic etching, exposing the upper portion of the dummy gate electrode 45. Since the silicon nitride film 48 is covered with the silicon oxide film 52, then the silicon nitride film 48 is not exposed (FIG. 49F).

Figure 49G:
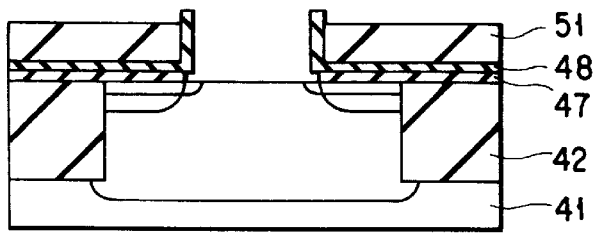

Thereafter, the silicon nitride film of the dummy gate 45, now exposed, is removed by a hot phosphoric acid treatment or the like, forming a groove in the region where the gate electrode is to be formed. The silicon oxide film 47 remaining in the groove and the silicon oxide film 52 remaining in the etch-back step, are removed by etching with hydrofluoric acid or the like, exposing the surface of the silicon substrate 41 (FIG. 49G).

Figure 49H:
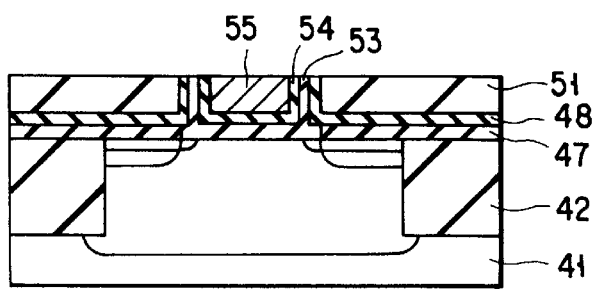

A high-dielectric insulator film 53, such as a tantalum oxide film, is deposited on the entire surface. A titanium nitride film 54 used as a diffusion barrier layer and an aluminum layer 55 used as the gate electrode are deposited. The aluminum film 55, titanium nitride film 54, tantalum oxide film 53 located outside the groove are removed by CMP or the like (FIG. 49H).

Figure 49I:
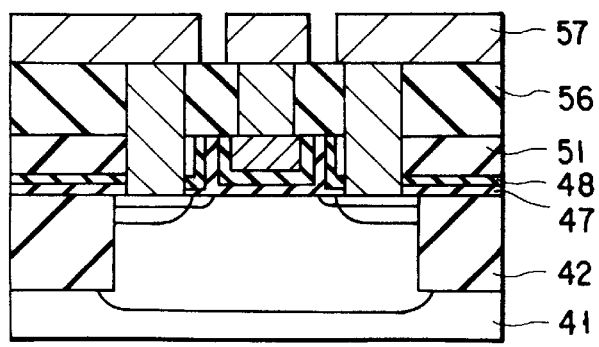

A silicon oxide film 56 is deposited on the entire surface. Contact holes are made and a metal wiring layer 57 is formed, providing a transistor (FIG. 49I).

As apparent from the above, the method of this embodiment can form a gate electrode having a very low resistance, without the problems concerning miniaturization which has been discussed earlier with reference to FIGS. 5A–5D and 7A–7H. Hence, the parasitic-resistance oriented deterioration of the device performance is prevented.

Twelfth Embodiment

A manufacturing method of manufacturing a semiconductor device according to the twelfth embodiment will now be discussed with reference to FIGS. 50A through 50I.

Figure 50A:
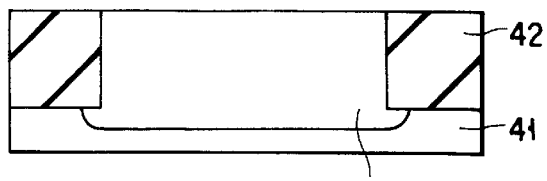
FIGS. 50A through 50I are cross-sectional views illustrating a process of manufacturing a semiconductor device according to a twelfth embodiment.
Figure 50B:
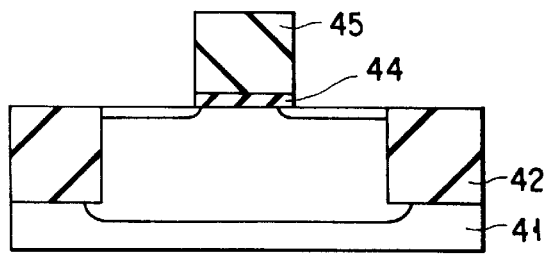

A device isolation insulator film 42 and a p-type diffusion layer 43 are formed on a silicon substrate 41 (FIG. 50A). Then, the surface of the silicon substrate 41 is oxidized by thermal oxidization, forming a silicon oxide film 44. On the film 44 a silicon nitride film 45 is deposited approximately 250 nm thick and patterned, forming a dummy gate electrode 45. With this dummy gate electrode 45 used a mask, ions of an n-type impurity like arsenic are implanted and the impurity is activated by a heat treatment at 750° C. or higher, forming an $n^-$ type LDD diffusion layer 46 (FIG. 50B).

Then, a silicon oxide film 47 about 10 nm thick is deposited on the entire surface. A silicon nitride film 48 about 10 nm thick is deposited, covering the dummy gate electrode. A silicon oxide film 49 of approximately 50 nm in thickness is deposited. Anisotropic etching is carried out to form a silicon oxide side wall 49.

Figure 50C:
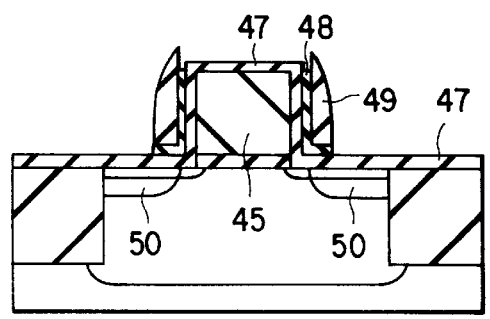

The exposed silicon nitride film 48 is removed by anisotropic etching. With the dummy gate electrode 45 and the insulator films 47, 48 and 49 on the sides thereof used as masks, ion injection and activation of the impurity are implemented by a heat treatment at 900° C. or higher, forming an $n^+$ impurity diffusion layer (source/drain region) 50 (FIG. 50C).

Figure 50D:
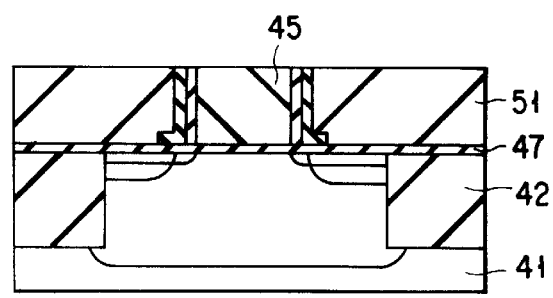

Next, a silicon oxide film 51 is deposited on the entire surface and is polished and made flat by using the silicon nitride film 45 as a stopper (FIG. 50D).

Figure 50E:
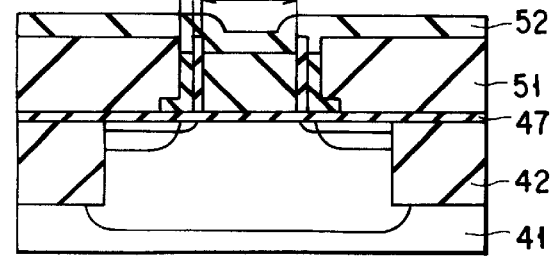

The exposed the dummy gate 45 and the silicon nitride film 48, both exposed, are etched about 50 nm by a hot phosphoric acid treatment or the like, thereby forming grooves having different widths. A silicon oxide film 52 about 10 nm thick is deposited on the entire surface. At this time, the thickness of this silicon oxide film 52 must be equal to or less than at least half the width (L) of the dummy gate electrode and must be equal to or more than half the thickness d of the silicon nitride film 48 (FIG. 50E).

Figure 50F:
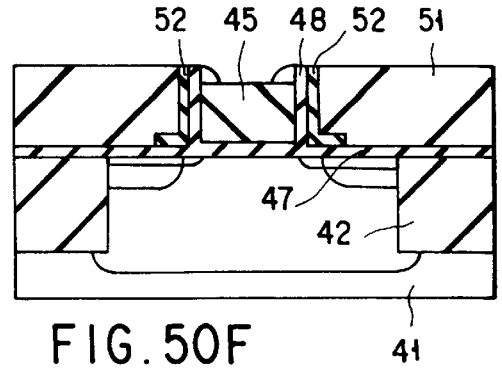

Next, the silicon oxide film 52 is etched back by anisotropic etching, exposing the upper portion of the dummy gate electrode 45. Since the silicon nitride film 48 is covered with the silicon oxide film 52, then the silicon nitride film 48 is not exposed (FIG. 50F).

Figure 50G:
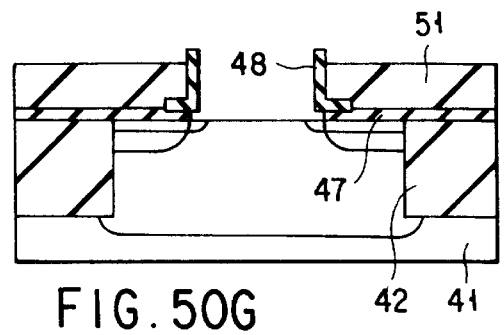

The exposed silicon nitride film of the dummy gate 45, now exposed, is removed by hot phosphoric acid treatment or the like, forming a groove in the region in which the gate electrode is to be formed. The silicon oxide film 47 remaining in the groove and the silicon oxide film 52 remaining in the etch-back step are removed by etching with hydrofluoric acid or the like, exposing the surface of the silicon substrate 41 (FIG. 50G).

Figure 50H:
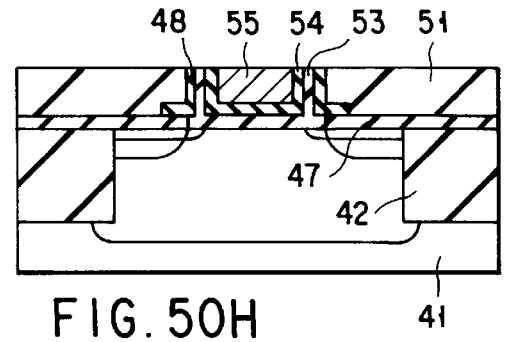

A high-dielectric insulator film 53, such as a tantalum oxide film, is deposited on the entire surface. A titanium nitride film 54 used as a diffusion barrier layer and an aluminum layer 55 used as the gate electrode are deposited. The aluminum film 55, titanium nitride film 54, tantalum oxide film 53 located outside the groove are removed by CMP or the like (FIG. 50H).

Figure 50I:
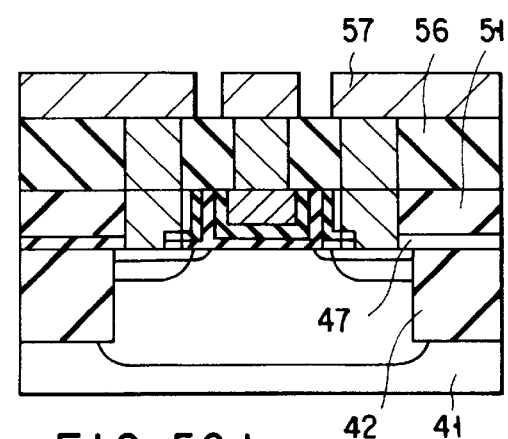

A silicon oxide film 56 is deposited on the entire surface. Contact holes are made, and a metal wiring layer 57 is formed, providing a transistor (FIG. 50I).

As apparent from the above, the method of this embodiment, like that of the eleventh embodiment, can reliably form a low-resistance gate electrode, without the aforementioned problems concerning miniaturization. The parasitic-resistance oriented deterioration of the device performance can therefore be suppressed. Further, the shallow diffusion layer 46 along the gate electrode is covered with the silicon nitride film 48. With the use of a silicon oxide film etching scheme which has a high etch selectivity with respect to a silicon nitride film at the time of forming a contact opening, the metal wiring layer 57 is prevented from contacting the shallow diffusion layer portion to increase the junction leak current, even if the position of the contact opening is misaligned. This can permit the device area to be designed smaller.

In short, according to the eleventh and twelfth embodiments, the material durable in a heat treatment that is needed to activate the impurity in the source/drain region need not be used as the material for the gate electrode or the material for the gate insulator film, without impairing the workability of the gate electrode for miniaturization. This broadens a selection range for the materials and can permit the use of a low-resistance material for the gate electrode and a high-dielectric material for the gate insulator film. As a result, the parasitic resistance of the device decreases, and the driving performance is improved.

Thirteenth Embodiment

Figure 51A:
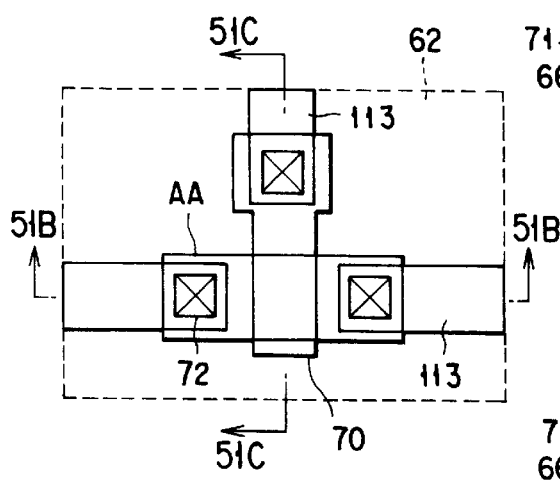
FIGS. 51A through 51C are a plan view and cross-sectional views depicting an MOS transistor with a groove type channel structure according to a thirteenth embodiment.
Figure 51B:
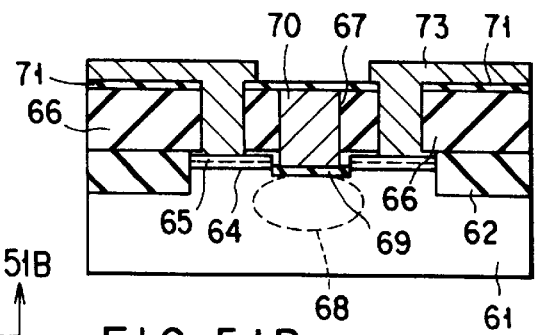
Figure 51C:
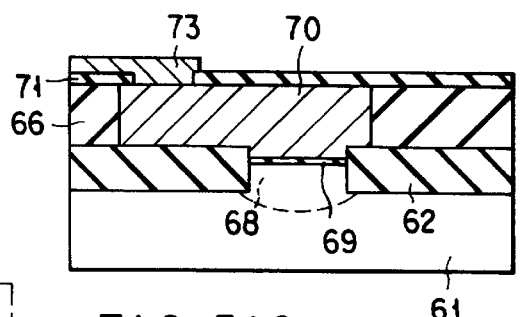

FIGS. 51A through 51C are diagrams depicting an MOS transistor with a groove type channel structure according to the thirteenth embodiment. FIG. 51A is a plan view, FIG. 51B is a cross-sectional view along the line 51B—51B in the plan view, and FIG. 51C is a cross-sectional view along the line 51C—51C in the plan view. Although the following description of the embodiment relates to an n channel MOS transistor, one should read the description while reversing the conductivity types for a p channel MOS transistor.

In the drawing, "61" indicates a p-type silicon substrate on whose surface a trench type device isolation insulator film 62 is formed. An interlayer insulator film 66 is formed on the silicon substrate 61. The impurity concentration of the silicon substrate 61 is approximately $5\times10^{15}$ cm$^{-3}$ in the device forming region (AA: Active Area).

A recess 67 is formed, extending to the underlying silicon substrate 61 from the interlayer insulator film 66 of the device forming region defined by the device isolation insulator film 62. The recess 67 penetrates the interlayer insulator film 66 and reaches a midway of the silicon substrate 61.

A gate electrode 70 is buried in the recess 67 via a gate insulator film 69, which is a thermal oxide film approximately 4.0 nm thick.

The gate insulator film 69 is provided at the interface between the silicon substrate 61 and the gate electrode 70. Therefore, the gate insulator film 69 covers the bottom and side walls of the gate electrode 70 buried in the silicon substrate 61.

The gate electrode 70 is comprised of, for example, a polysilicon film or a metal film of TiN, W, Ru, Al or the stacked metal film such as W/TiN. The gate electrode 70 is about 0.1 to 0.15 μm wide in the channel direction. A channel ion implantation region 68 with an impurity concentration of about $5\times10^{17}$ cm$^{-3}$ is formed selectively in the channel region below the bottom of the recess 77, in order to adjust the threshold voltage.

An n-type source/drain diffusion layer 64 with a low impurity concentration and an overlying n-type source/drain diffusion layer 65 with a high impurity concentration are formed self-aligned with the gate electrode 70.

The diffusion depth of the source/drain diffusion layer 64, from the surface of the silicon substrate 61, and the impurity concentration are respectively about 0.2 μm and about $5\times10^{19}$ cm$^{-3}$. The diffusion depth and the impurity concentration of the source/drain diffusion layer 65 are respectively about 0.15 μm and about $5\times10^{20}$ cm$^{-3}$.

Contact holes 72 extending to a gate electrode 110 and the source/drain diffusion layer 65 are formed in the interlayer insulator films 66 and 71. A wiring 73 extends though the contact holes 72 and contacts the gate electrode 70 and the n-type source/drain diffusion layer 65.

The interlayer insulator films 66 and 71 are, for example, SiO$_2$ films, and the wiring 73 is, for example, an Al film.

In the MOS transistor of a groove type channel structure, the gate electrode 70 is buried through the gate insulator film 69 in the recess 67 made in the interlayer insulator film 66 and reaching a midway of the silicon substrate 61, and the source/drain diffusion layers 64 and 65 are so formed as to sandwich the recess 77. Therefore, the gate electrode 70 does not extend above the source/drain diffusion layers 64 or 65. This embodiment can therefore implement miniaturization of MOS transistors of a groove type channel structure.

The bottom surfaces of the source/drain diffusion layers 64 and 65 are located above the channel at the bottom of the recess 67. In other words, the junction depth of the source/drain diffusion layers 64 and 65 is substantially of a negative value. The serves to suppress the short channel effect even if miniaturization is implemented.

If the junction of the source/drain diffusion layers 64 and 65 is made deeper, while maintaining a negative value, the resistances of the source/drain diffusion layers 64 and 65 can be reduced.

Even if the height of the gate electrode 70 is increased to lower the resistance of the gate electrode 70, the step formed by the gate electrode 70 can be repressed because part of the gate electrode 70 is buried in the silicon substrate 61.

A manufacturing method of manufacturing an MOS transistor with a groove type channel structure according to this embodiment will now be described. FIGS. 52A through 57B are plan views and cross-sectional views showing the method. FIGS. 52A, 53A, 54A, 55A, 56A and 57A are plan views, and FIGS. 52B, 53B, 54B, 55B, 56B and 57B are cross-sectional views, respectively taken along the lines 52B—52B, 53B—53B, 54B—54B, 55B—55B, 56B—56B and 57B—57B in the plan views.

Figure 52A:
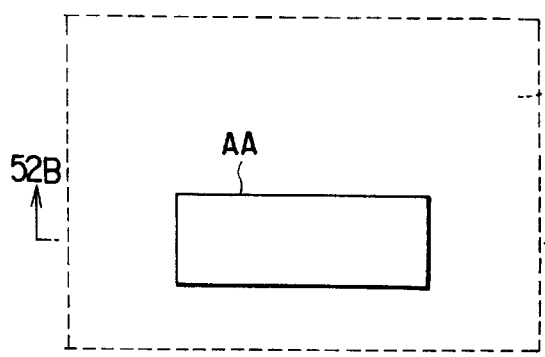
FIGS. 52A, 52B, 53A, 53B, 54A, 54B, 55A, 55B, 56A, 56B, 57A and 57B are plan views and cross-sectional views showing a process of manufacturing the MOS transistor with a groove type channel structure according to the thirteenth embodiment.
Figure 52B:
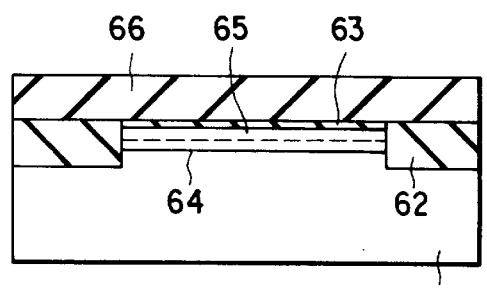

As shown in FIGS. 52A and 52B, a p-type silicon substrate 61 with an impurity concentration of approximately $5\times10^{15}$ cm$^{-3}$ is prepared. Alternatively, a so-called epitaxial substrate may be used which is obtained by epitaxially growing a p- or n-type silicon layer of about 1 μm thick on the surface of a p-type silicon substrate.

To provide a so-called CMOS structure in which n-channel and p-channel MOS transistors are formed on the same substrate, a p-type well is formed in the n-channel transistor forming region of the (100) plane of the silicon substrate 61 and an n-type well in a p-channel transistor forming region. Although the following description relates to an n-channel MOS transistor, one should read the description while reversing the conductivity types for a p-channel MOS transistor.

As illustrated in FIGS. 52A and 52B, a trench is formed approximately 0.35 μm deep in the surface of the silicon substrate 61 by using, for example, reactive ion etching (RIE). The device isolation insulator film 62 of SiO$_2$ or the like is buried in the trench to ensure device isolation called STI (Shallow Trench Isolation).

As shown in FIGS. 52A and 52B, an SiO$_2$ film 63 about 8.0 nm thick is formed. A photoresist pattern (not shown) is formed on this SiO$_2$ film 63. With the pattern used as a mask, ion implantation is performed in the desired region, thus forming the n-type diffusion layer 64 with a low impurity concentration. The layer 64 will be a lightly doped source/drain diffusion layer (LDD). The conditions of the ion implantation are: an acceleration voltage of approximately 70 KeV and a dose of about $4\times10^{13}$ cm$^{-2}$ for the implantation of, for example, phosphorous (P$^+$) ions.

Subsequently, with the same resist pattern used as a mask, ion implantation is carried out, forming the n-type diffusion layer 65 with a high impurity concentration on the lightly doped n-type diffusion layer 64. The layer 65 will be a source/drain diffusion layer with a high impurity concentration. The conditions of this ion implantation are: an acceleration voltage of approximately 80 KeV and a dose of about $5 \times 10^{15}$ cm$^{-2}$ for the implantation of, for example, arsenic (As) ions. Then, the photoresist pattern is removed.

Although the source/drain diffusion layer of an LDD structure is formed to suppress an electric field of the drain substrate in this embodiment, only a source/drain diffusion layer with a low impurity concentration or a high impurity concentration may be formed (single source/drain type).

Next, the interlayer insulator film 66 of SiO$_2$ having a thickness of about 200 nm is formed on the entire surface by, for example, CVD. Densification is performed for about 30 minutes at, for example, about 800° C. in the N$_2$ atmosphere.

This heat treatment also activates the impurities in the n-type diffusion layers 64 and 65. The depths (Xj) of the n-type diffusion layers 64 and 65 may be reduced by lowering the densifying temperature to about 750° C. and by performing an RTA (Rapid Thermal Anneal) at 950° C. for about ten seconds to activate the impurities in the n-type diffusion layers 64 and 65.

Figure 53A:
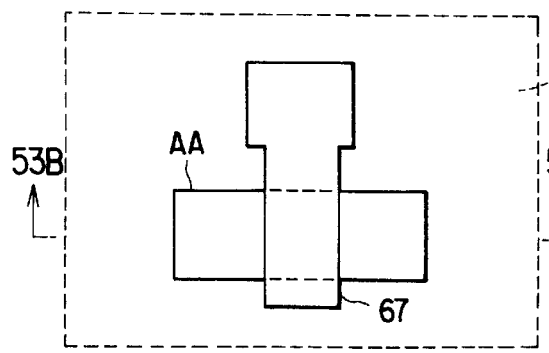
Figure 53B:
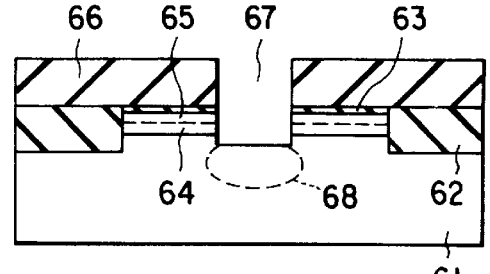

As shown in FIGS. 53A and 53B, the recess 67 is made in the interlayer insulator film 66 reaching a midway of the silicon substrate 61. More preciously, the recess 67 is made in the region where the gate electrode is to be formed, by using a resist (not shown) as a mask. The recess 67 separates the n-type diffusion layers 64 and 65, forming a pair of source/drain diffusion layers 64 with a low impurity concentration (LDD) and a pair of source/drain diffusion layers 65 with a high impurity concentration lying above the former diffusion layers.

Specifically, with a photoresist pattern (not shown), for example, used as a mask, the SiO$_2$ film 63, the interlayer insulator film 66 and the silicon substrate 61 in the region, where the gate electrode is to be formed, are etched by RIE, forming the recess 67 whose bottom is approximately 0.30 μm deep from the substrate surface.

Thereafter, an etching polymer layer (not shown) or the like, which has been produced in the etching step of forming the recess 67, is removed. The surface of the silicon substrate 61 is exposed and subjected to a heat treatment for about 3 minutes at, for example, 900° C., in the hydrogen atmosphere, activating the Si atoms at the surface of the recess 67.

At this time, Si atoms move, minimizing the silicon surface area. A damage or the like occurred in the etching step of forming the recess 67 is eliminated. Of course, other schemes may be used as well to eliminate such a damage.

Next, a dummy SiO$_2$ film (not shown) of approximately 5 nm in thickness is formed on the exposed silicon surface at the bottom of the recess 67 by, for example, thermal oxidization, after which with the interlayer insulator film 66 or the like or a photoresist (not shown) used as a mask, channel ion implantation is performed on the silicon substrate 61 (channel region) under the bottom of the recess 67, thus forming the channel ion implantation layer 68.

In the case of an n-channel transistor, to set the threshold voltage (Vth) of, for example, about 0.7V, the n-type diffusion layer 64 with a low impurity concentration, which will be a lightly doped source/drain diffusion layer (LDD). The conditions for boron (B$^+$) ions are implanted with the acceleration voltage of, for example, 10 KeV and a dose of about $5 \times 10^{12}$ cm$^{-2}$, thereby selectively forming the p-type channel ion implantation layer 68 in the channel region.

Ion implantation in this step may be performed on the entire surface through the SiO$_2$ film 63 at the stage shown in FIGS. 52A and 52B, in which case selective channel ion implantation cannot be carried out.

The activation of the impurity in the channel ion implantation layer 68 may be implemented in a subsequent teat treatment at 800° C. for about ten seconds using, for example, RTA.

In consideration of the subsequent heating step, the impurity profile of the channel region (channel ion implantation layer 68) is optimized to be able to suppress the short channel effect of the transistor.

Figures 54A, 54B:
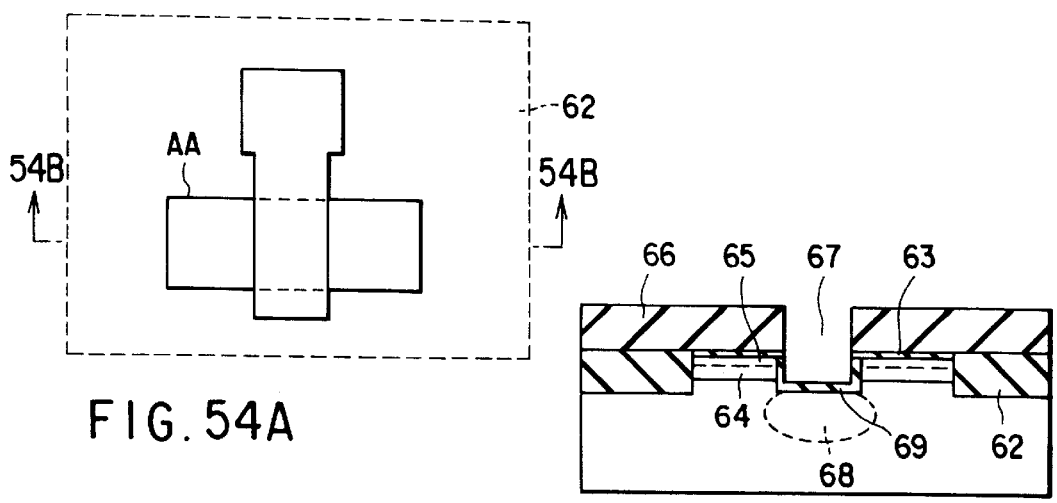

Next, as shown in FIGS. 54A and 54B, after the dummy SiO$_2$ film (not shown) is removed, the gate insulator film (thermal oxide film) 69 is formed inside (bottom and sides) of the recess 67 at the substrate surface by thermal oxidization. Further, a film resulting from the thermal nitrization of the surface of an oxide film may be used as the gate insulator film. Furthermore, a lamination film including a CVD-SiO$_2$ film, CVD-SiON film or CVD-Si$_3$N$_4$ film may be used as the gate insulator film.

Figures 55A, 55B:
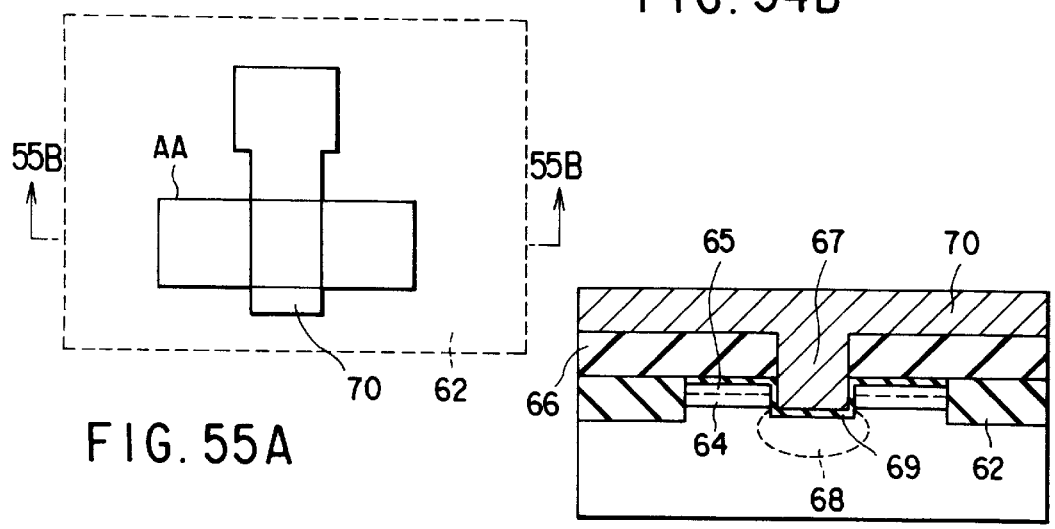

Then, as shown in FIGS. 55A and 55B, the conductive film 70 to be the gate electrode is formed on the entire surface to fill inside the recess 67. As the conductive film 70, for example, a polysilicon film, which is heavily doped with an impurity, or metal film is used. The metal layer may be an Ru film, TiN film, W film, tungsten nitride film (WN$_x$) film, WSi$_2$ film, TiSi$_2$ film or a lamination film comprising any one of them such as W/TiN. When a lamination film including a CVD-SiO$_2$ film, CVD-SiON film or CVD-Si$_3$N$_4$ film is used as the gate insulator film, an impurity-doped polysilicon film may be used for the gate electrode.

Figures 56A, 56B:
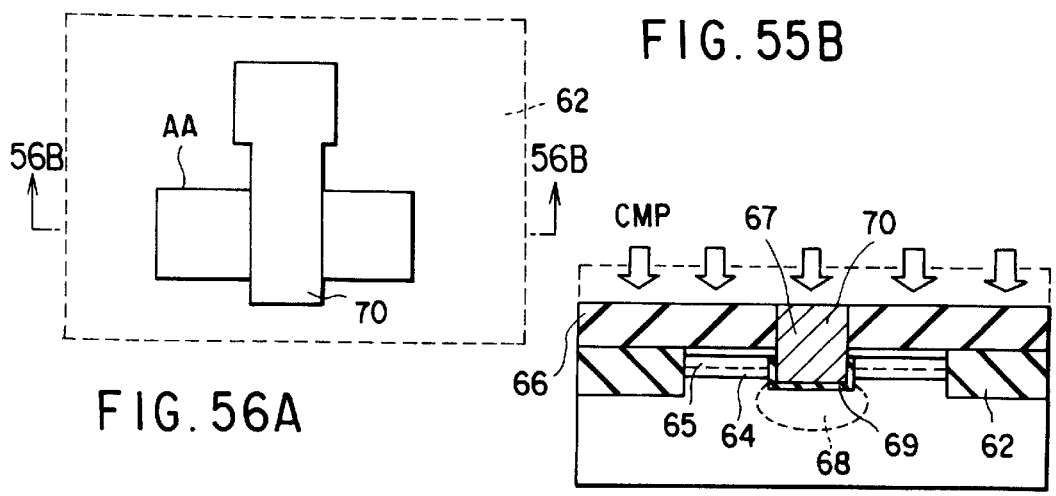

Next, the conductive film 70 outside the recess 67 is polished out by CMP to bury the gate electrode 70 inside the recess 67 as shown in FIGS. 56A and 56B.

Figures 57A, 57B:
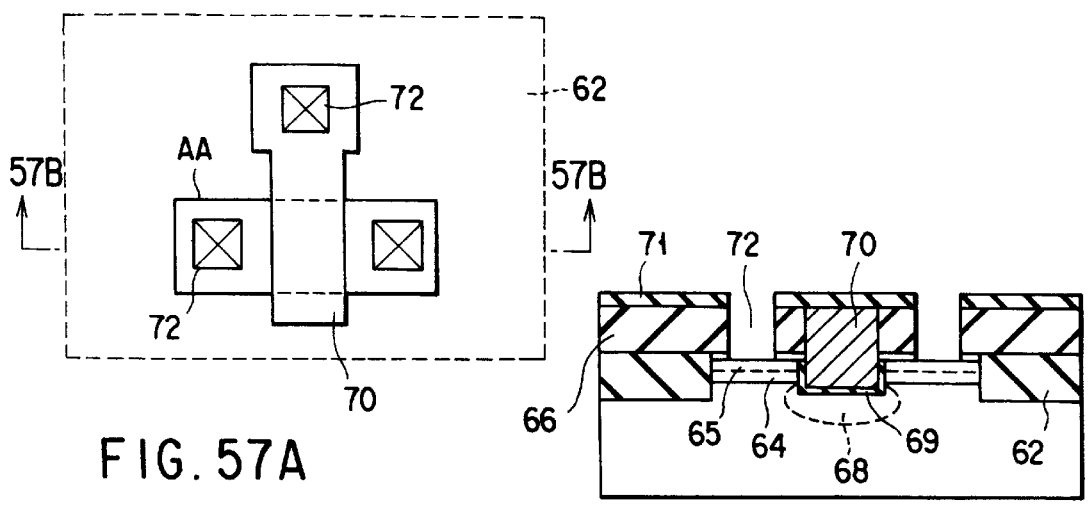

Then, after the interlayer insulator film 71 of SiO$_2$ with a thickness of about 150 nm is formed on the entire surface, the contact holes 72 to the source/drain diffusion layer and the gate electrode 70 are formed in the interlayer insulator films 66 and 71, as shown in FIGS. 57A and 57B.

Finally, a metal film like an Al film or Al—Cu film is formed on the entire surface and is then patterned to form the wiring 73 as shown in FIGS. 51A–51C, after which a passivation film (not shown) is formed on the entire surface to complete the basic structure of the transistor.

The manufacturing method of this embodiment can form the source/drain diffusion layers 64 and 65 self-aligned with the gate electrode 70.

As the gate electrode 70 is buried by using CMP, unlike in the case of burying the gate electrode using RIE, this method does not have the plasma process damages which would otherwise be made at the time of forming the gate electrode (e.g., the dielectric breakdown of the gate insulator film 69 and the reduced reliability of the gate insulator film 69).

Because the gate electrode 70 is buried by using CMP, unlike in the case of burying the gate electrode using RIE, there is no material restriction (e.g., restriction on the etching property) even if a metal gate electrode is used.

Since the channel ion implantation region 68 can be formed by selectively implanting impurity ions in the channel region, i.e., since unnecessary impurities are not put in the source/drain diffusion layers 64 and 65, it is possible to prevent increases in the junction capacitance and leak current through a reverse pn junction between the substrate and the source and drain regions.

As the channel ion implantation layer 68 is not subjected to a high-temperature anneal treatment for activating the source/drain diffusion layers 64 and 65, a sharp impurity profile can be maintained, so that the channel ion implantation layer 68 can have the optimal impurity profile to suppress the short channel effect.

Further, the RIE-based side wall leaving step is not required to obtain the source/drain diffusion layer 64, thus simplifying the overall steps.

Fourteenth Embodiment

Figure 58:
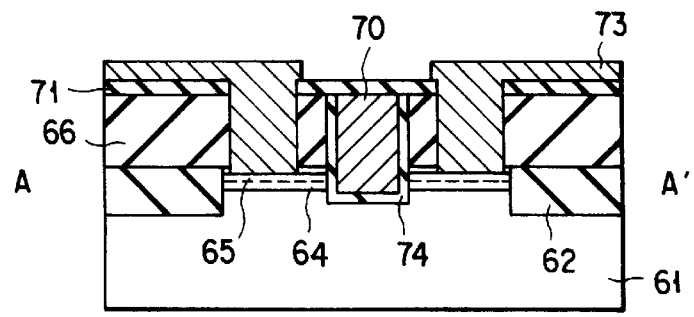
FIG. 58 is a cross-sectional view of an MOS transistor with a groove type channel structure according to a fourteenth embodiment.

FIG. 58 is a cross-sectional view showing an MOS transistor with a groove type channel structure according to the fourteenth embodiment. To avoid the redundant detailed description, like or same reference numerals are given to those components which are the same as the corresponding components in FIGS. 51A–51C. (The same is true of the other following embodiments.)

This embodiment differs from the thirteenth embodiment mainly in that a deposition insulator film (e.g., a CVD insulator film) is used as the gate insulator film 74 in place of a thermal oxide film.

According to this embodiment, a deposition insulator film is used s the gate insulator film 74, it is formed extending inside the recess as compared with a thermal oxide film or the like. That is, the channel length can be made shorter than the size determined by the lithographic limitation by about two times the thickness of the gate insulator film 74. This ensures a shorter channel which can further improve the transistor performance.

In a case where groove type device isolation like STI is employed, even if minute dents are formed at the boundary between the device isolation insulator film 62 and the device isolation groove, the dents can be buried with the gate insulator film 74 (deposition insulator film).

This can prevent production of so-called corner devices (parasitic transistors) and can prevent deterioration of the device characteristics such as a variation in threshold voltage. When MOS transistors with a groove type channel structure are integrated, a variation in the device characteristics such as the threshold voltage between MOS transistors can be suppressed.

A manufacturing method for an MOS transistor with a groove type channel structure according to this embodiment will now be discussed. As the process up to the step of forming the gate insulator film 74 (process until the dummy $SiO_2$ film is removed) is the same as the process of the previous embodiment, the detailed description will be omitted.

First, the deposition type gate insulator film 74 is formed on the entire surface by using a deposition scheme like CVD. For example, a high-dielectric film (e.g., $Ta_2O_5$ film) with a thickness of approximately 20 nm is formed by CVD as the gate insulator film 74.

At this time, the following steps should be carried out to make it difficult to provide a so-called interface level at the interface between the silicon surface of the recess 67 and the high-dielectric film (the gate insulator film 74), or to prevent reaction at the interface between the silicon surface of the recess 67 and the high-dielectric film.

The high-dielectric film should be formed after a thin (e.g., about 1 nm in thickness) $SiO_2$ film is formed on the silicon surface of the recess 67, or the high-dielectric film should be formed after a nitride film is formed directly on the silicon surface of the recess 67 by RTP (Rapid Thermal process) in the $NH_3$ gas atmosphere, or the high-dielectric film (e.g., $Ta_2O_5$ film, (Ba, Sr) $TiO_3$ film) should be formed via a so-called oxynitride film which is obtained by performing nitrization of the surface of an $SiO_2$ film of about 1 nm in thickness using $NO_2$ gas or the like.

If a lamination film including a CVD-$SiO_2$ film, CVD-SiON film or CVD-$Si_3N_4$ film is used as the gate insulator film 74, the same advantages can be acquired. In other words, after film formation, densification is carried out by a RTP heat treatment for about 10 seconds at, for example, 1000° C., the interface level at the interface between the silicon surface of the recess 67 and the lamination insulator film (the gate insulator film 74) is reduced or the leak current is reduced to thereby improve the insulating property of the lamination film as the insulator film.

Next, the gate electrode 70 is buried in the recess 67 via the gate insulator film 74 by using CMP. At this time, the width of the gate electrode 70 is thinner by twice the thickness of the gate insulator film 74. That is, the channel length of the transistor can be made shorter than is determined the lithography.

The gate electrode 70 may be formed by an impurity-doped polysilicon film or metal film (e.g., an Ru film, TiN film, W film, tungsten nitride film ($WN_x$) film, $WSi_2$ film, $TiSi_2$ film or a lamination film comprising any one of them). When a lamination film including a CVD-$SiO_2$ film, CVD-SiON film or CVD-$Si_3N_4$ film is used as the gate insulator film, an impurity-doped polysilicon film may of course be used for the gate electrode.

The subsequent steps are the same as those of the thirteenth embodiment.

This manufacturing method can perform a high-temperature heat treatment like the activation of the source/drain diffusion layers 64 and 65 and the reflow step prior to the formation of the gate insulator film 74.

Even if a high-dielectric constant film and a metal film are respectively used as the gate insulator film 74 and the gate electrode 70, it is possible to suppress deterioration of the gate insulator film 74 like an increase in leak current. Because those films are not subjected to a high-temperature treatment for activating the source/drain diffusion layers and for planarization. A high-dielectric film if used as the gate insulator film 74 can reduce the thickness of the gate insulator film 74 in terms of the thickness of an oxide film, so that the device characteristics of the transistor can be improved.

Because the gate electrode 70 is buried by using CMP, unlike in the case of burying the gate electrode using RIE, there is no restriction on the material for the metal gate electrode (e.g., thermal budget limitation), thus ensuring the use of such a metal gate electrode that lowers the leak current of the high-dielectric film.

In addition, the same advantages as those of the thirteenth embodiment can be obtained.

Fifteenth Embodiment

Figures 59A, 59B:
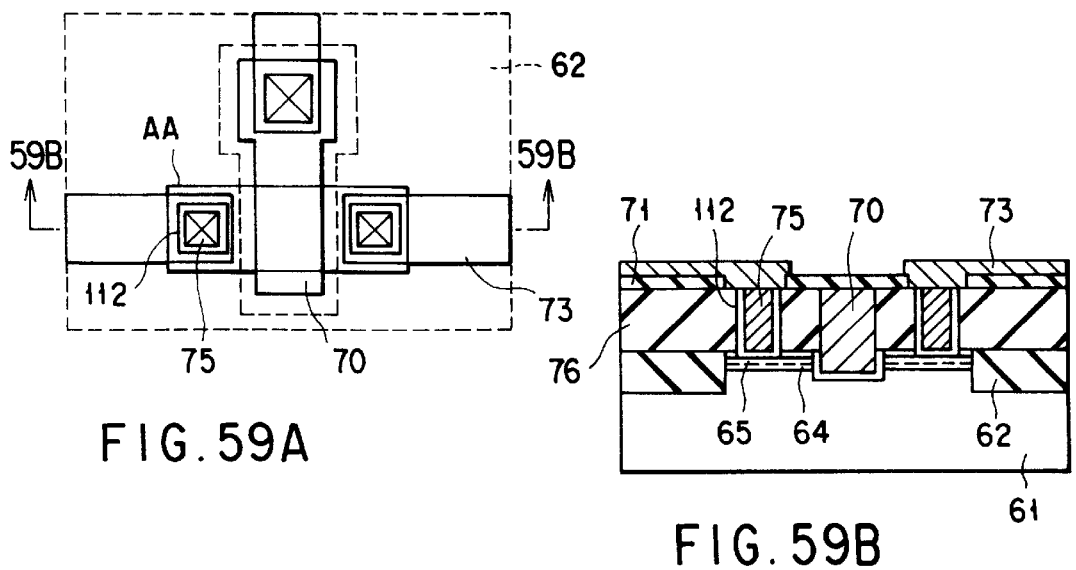
FIGS. 59A and 59B are a plan view and a cross-sectional view showing an MOS transistor with a groove type channel structure according to a fifteenth embodiment.

FIGS. 59A and 59B are diagrams depicting an MOS transistor with a groove type channel structure according to the fifteenth embodiment. FIG. 59A is a plan view, and FIG. 59B is a cross-sectional view along the line 59B—59B in the plan view.

The wiring 73 made of metal like Al is directly buried in the contact holes 72 in the thirteenth embodiment. If the aperture size of the contact holes 72 becomes smaller, the Al film does not get into the contact holes 72, thus reducing the reliability of the wiring 73.

According to this embodiment, therefore, for example, a TiN film/Ti film is formed on the entire surface so as to cover inside the contact holes 72, followed by the formation of a W film on the entire surface so as to fill the contact holes 72, and then the TiN film/Ti film and the W film outside the contact holes 72 are removed by using CMP or the like, forming a plug electrode (contact plug) 75. If the wiring 73 is formed thereafter, the reliability of the wiring 73 becomes higher even when the aspect ratio is high.

Sixteenth Embodiment

FIGS. 60A through 60C are diagrams depicting an MOS transistor with a groove type channel structure according to the sixteenth embodiment. FIG. 60A is a plan view, FIG. 60B is a cross-sectional view along the line 60B—60B in the plan view, and FIG. 60C is a cross-sectional view along the line 60C—60C in the plan view.

This embodiment differs from the thirteenth embodiment in that the gate electrode 70 is formed deeper in the silicon substrate 61 than the device isolation insulator film 62. In other words, the bottom of the recess 67 is located below the bottom of the device isolation groove. For example, the depth of the recess 67 is 0.4 μm while the depth of the device isolation groove is 0.25 μm.

With this structure, the channel width can be designed three-dimensionally as shown in FIG. 60C, so that the channel width can be increased without increasing the planar area of the transistor. This can permit an increase in channel current while keeping the miniaturization.

Seventeenth Embodiment

FIGS. 61A through 61C are diagrams depicting an MOS transistor with a groove type channel structure according to the seventeenth embodiment. FIG. 61A is a plan view, FIG. 61B is a cross-sectional view along the line 61B—61B in the plan view, and FIG. 61C is a cross-sectional view along the line 61C—61C in the plan view.

In the thirteenth embodiment, to cancel etching damages on the silicon surface of the recess 67, a special high-temperature treatment (e.g., after exposure of the silicon surface of the recess 67, the resultant structure is subjected to a heat treatment for about three minutes at, for example, in the hydrogen atmosphere) is performed to activate the Si atoms at the silicon surface of the recess 67.

At this time, the Si atoms move in such a way as to minimize the silicon surface area, so that a damage or the like which has occurred in the etching step of forming the recess 67 can be canceled. The shape of the recess 67 can be changed by adjusting the heat treatment conditions (e.g., the heat treatment is changed to a heat treatment at 950° C. for about five minutes in the hydrogen atmosphere after exposure of the silicon surface of the recess 67).

That is, the bottom of the recess 67 can be modified to have a gentle arcuate shape as shown in FIG. 61B. This structure eliminates sharp corners at the bottom of the recess 67 (the region where the gate insulator film 69 is to be formed), so that the breakdown voltage of the gate insulator film 69 can be improved and the channel portion can be formed gentle. This can suppress deterioration of the electron mobility, thereby improving the transistor characteristics.

Eighteenth Embodiment

Figure 62A:
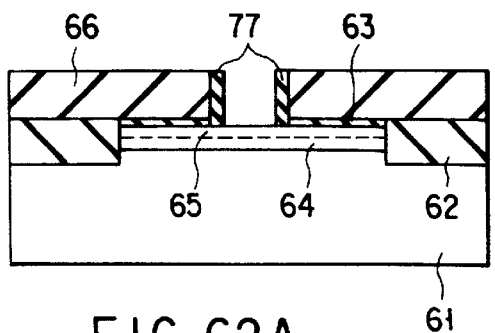
FIGS. 62A and 62B are cross-sectional views of an MOS transistor with a groove type channel structure according to an eighteenth embodiment.
Figure 62B:
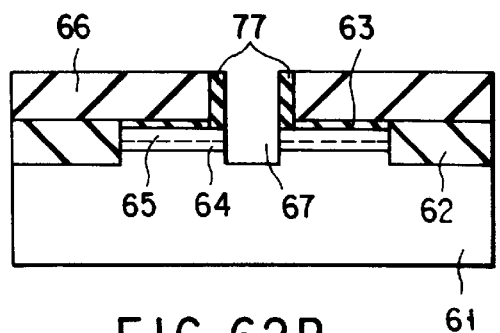

FIGS. 62A and 62B are cross-sectional step views illustrating a manufacturing method for an MOS transistor with a groove type channel structure according to the eighteenth embodiment.

This embodiment differs from the thirteenth embodiment in that after the interlayer insulator film 66 is etched to form a groove and a side wall 77 formed of an $SiO_2$ film is formed on the side walls of the groove as shown in FIG. 62A, the silicon substrate 61 is etched with the interlayer insulator film 66 and the side wall 77 used as masks, thus forming the recess 67 as shown in FIG. 62B.

The side wall 77 is formed by so-called a side wall forming method according to which after an $SiO_2$ film with a thickness of approximately 20 nm is deposited on the entire surface, this $SiO_2$ film is etched over the entire surface by RIE.

This scheme can make the width of the recess 67 in the channel length direction smaller than the size that is determined by the lithographic limitation. A gate electrode with a short gate length can therefore be realized.

If the gate length (channel length) is shortened, ordinary transistors has a short channel effect, lowering the threshold voltage (Vth) which increases the leak current.

According to this embodiment, by contrast, the junction depth of the source/drain diffusion layers 64 and 65 becomes substantially minus, which can suppress the short channel effect, as per the thirteenth embodiment.

According to this embodiment, therefore, the transistor characteristics can be improved by forming the side wall 77 to shorten the channel length.

According to the thirteenth to eighteenth embodiments, with regard to the thickness of the gate insulator film, plural types of MOS transistors with different thicknesses of gate insulator films may be formed to cope with different voltages, such as a 3.3V type and 2.5V type, though not described specifically.

This can be accomplished by repeating a step of masking other regions than transistor regions where the gate insulator film with a desired thickness is to be formed and selectively forming the desired gate insulator film in the desired transistor regions, before the step of forming the gate electrode.

Alternatively, a step of first forming the gate insulator film with a desired thickness and the gate electrode in all the transistor regions, and then masking the transistor regions where the gate insulator film with the desired thickness and the gate electrode should be formed and removing the gate insulator films and the gate electrodes of the other transistor regions may be repeated.

The formation of plural types of MOS transistors with different thicknesses of gate insulator films on the same chip can maximize the performances of, for example, p-channel MOS transistors and n-channel MOS transistors or maximize the performances of MOS transistors in a memory cell portion and those of a peripheral circuit control section.

Further, plural types of MOS transistors whose gate insulator films are formed of different materials may be formed.

This may be accomplished as follows. After a first gate insulator film (e.g., a laminated insulator film comprised of an $SiO_2$ film and a $Ta_2O_5$ film overlying the former) is formed, the gate electrode (e.g., a Ru film) is formed on this first gate insulator film in every transistor region. Then, after selectively removing the first gate insulator film and the first gate electrode of those transistor regions where a second gate insulator film (e.g., a ferroelectric film like a PZT film) is to be formed, the second gate insulator film and the first gate electrode are selectively formed in those transistor regions. At this time, if necessary, a second gate electrode of a different material from that of the first gate electrode may be formed on the second gate insulator film. Those steps should be repeated a required number of times.

The formation of plural types of MOS transistors with gate insulator films of different materials on the same chip can maximize the performances of, for example, p-channel MOS transistors and n-channel MOS transistors or maximize the performances of MOS transistors in a memory cell portion and those of a peripheral circuit control section.

Further, ferroelectric memory devices using a ferroelectric film as the gate insulator film and transistor using a high-dielectric film as the gate insulator film can continuously be formed with the same transistor structure in a series of processes. This can provide a large-scale memory chip by a simple manufacturing process.

It should be apparent to those skilled in the art that the present invention may be embodied in many other specific forms without departing from the spirit or scope of the invention.

According to the thirteenth to eighteenth embodiments, as apparent from the above, the gate electrode is buried in the recess which penetrates the interlayer insulator film and reaches a midway of the semiconductor substrate, and the source/drain diffusion layers are so formed as to sandwich the recess, thereby eliminating extension of the gate electrode above the source/drain diffusion layers. Those embodiments can therefore implement semiconductor devices and manufacturing methods which can ensure miniaturization of MOS transistors with a groove type channel structure.

Nineteenth Embodiment

This embodiment is designed in such a way that the thickness of the upper portion of the gate electrode which protrudes from the surface of the semiconductor substrate and the thickness of the lower portion of the gate electrode buried in the groove are so defined as to optimize the transistor performance.

Figures 63A, 63B, 63C:
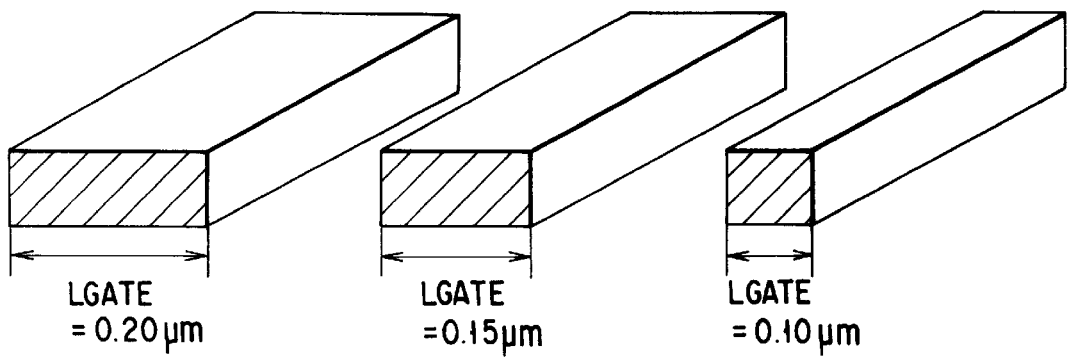
FIGS. 63A through 63C are perspective views depicting three kinds of gate electrodes with the same film thickness and different gate lengths according to a nineteenth embodiment.
Figure 64:
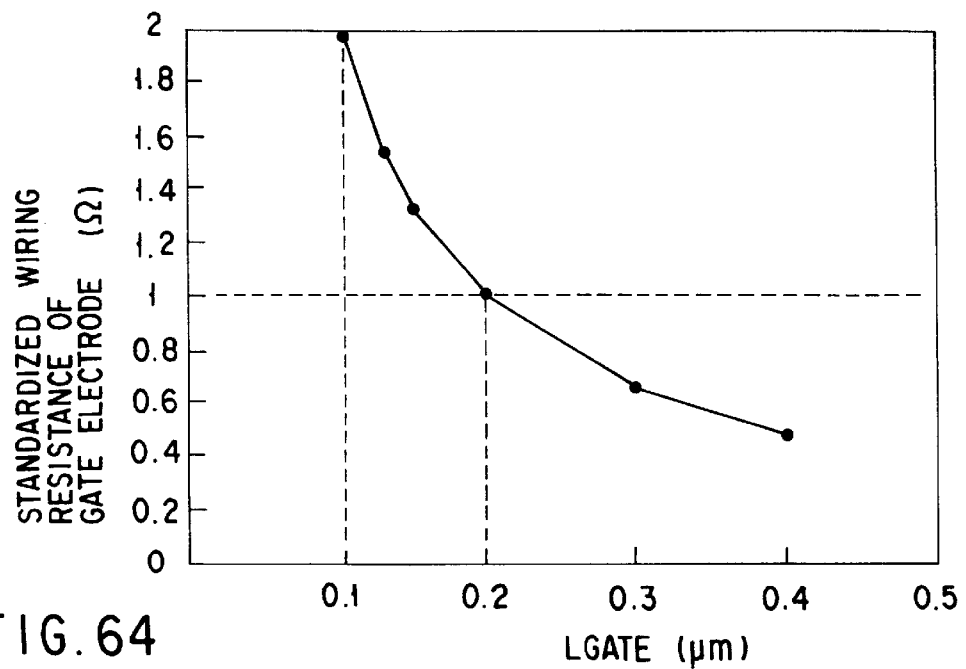
FIG. 64 is a graph showing a relationship between the gate length ($L_{gate}$) of the gate electrode and the wiring resistance of the gate electrode according to the nineteenth embodiment.

FIGS. 63A through 63C illustrate three kinds of gate electrodes with the same film thickness (e.g., H=0.10 μm) and different gate lengths (L), and FIG. 64 is a graph showing a relationship between the gate lengths ($L_{gate}$) of those gate electrodes (of tungsten) and the wiring resistances of the gate electrodes.

As apparent from FIG. 64, when the gate length ($L_{gate}$) becomes a half, from 0.2 μm to 0.1 μm, the wiring resistance of the gate electrode becomes approximately doubled. When the wiring resistance of the gate electrode significantly affects the device performance (driving speed, etc.), conventionally, reduction in the device performance has been prevented by doubling the thickness of the gate electrode with respect to a demand of shorting $L_{gate}$ for device miniaturization. If the gate electrode is made thicker, however, the gate electrode protrudes above, enlarging the step, so that the interlayer insulator film should be made thicker for planarization. This however increases the aspect ratio of the contact holes to be formed in the interlayer insulator film, thus making the formation of contacts difficult.

According to transistors with a concave structure according to this embodiment, part of the gate electrode is buried in the Si substrate to overcome this problem; there are three types of burying depths.

Figure 65A:
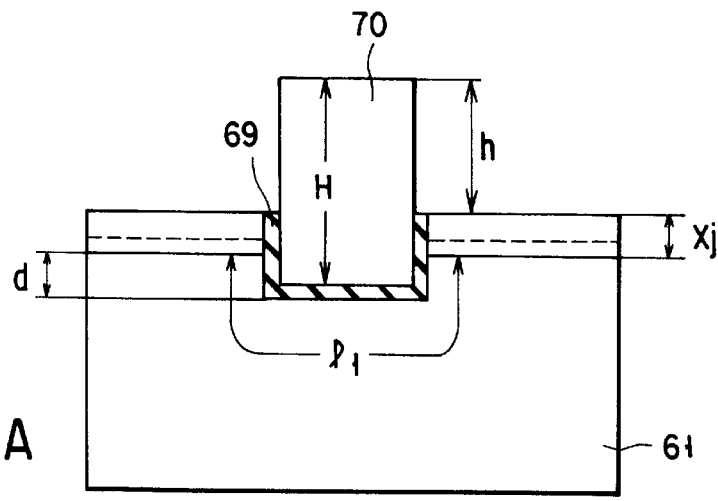
FIGS. 65A to 65C are cross-sectional views depicting transistors which differ from one another in the depth of the portion of the gate electrode in the nineteenth embodiment that is buried in an Si substrate.

(1) Part of the gate electrode 70 is buried in the Si substrate 61 at the optimal depth without deteriorating the transistor characteristics (FIG. 65A).

Figure 65B:
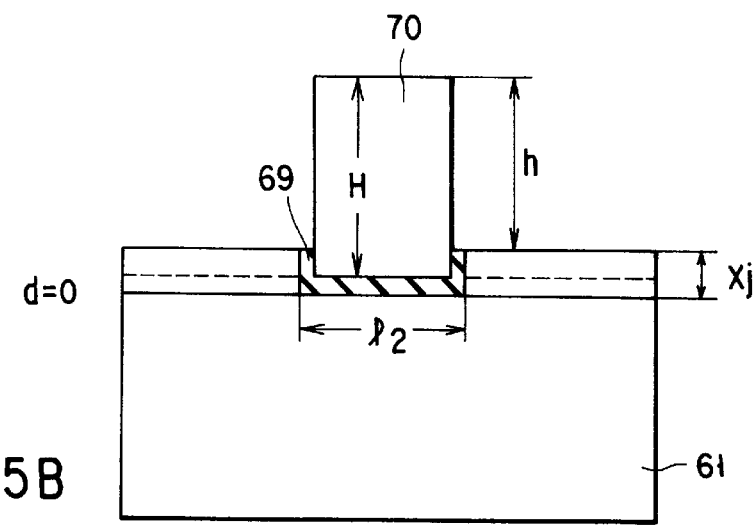

(2) Part of the gate electrode 70 is buried shallow in the Si substrate 61 (FIG. 65B).

Figure 65C:
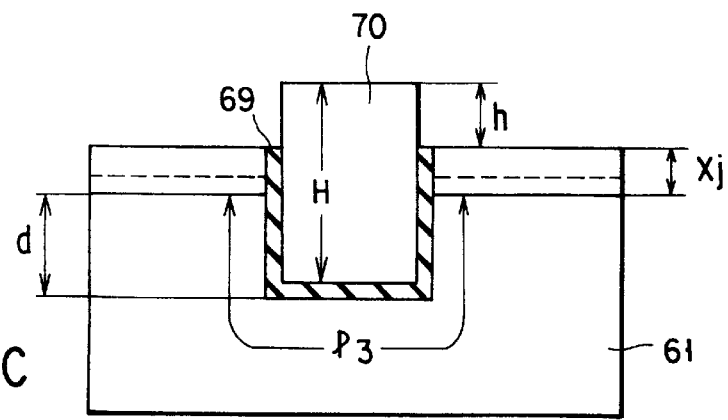

(3) Part of the gate electrode 70 is buried deep in the Si substrate 61 (FIG. 65C).

Given that H is the total thickness of the gate electrode 70, h is the size of the gate electrode 70 protruding above the Si substrate 61, Xj is the junction depth of the source/drain diffusion region, $t_{OX}$ is the thickness of the gate insulator film 69, and d is a difference between the level at the bottom of the source/drain diffusion region and the level of the channel region underlying the gate electrode 70, the following equation (1) is satisfied as apparent from FIGS. 65A–65C.

$$H = h + Xj + d - t_{OX} \tag{1}$$

In this embodiment, the optimal values for h and d will be contemplated.

Figure 66:
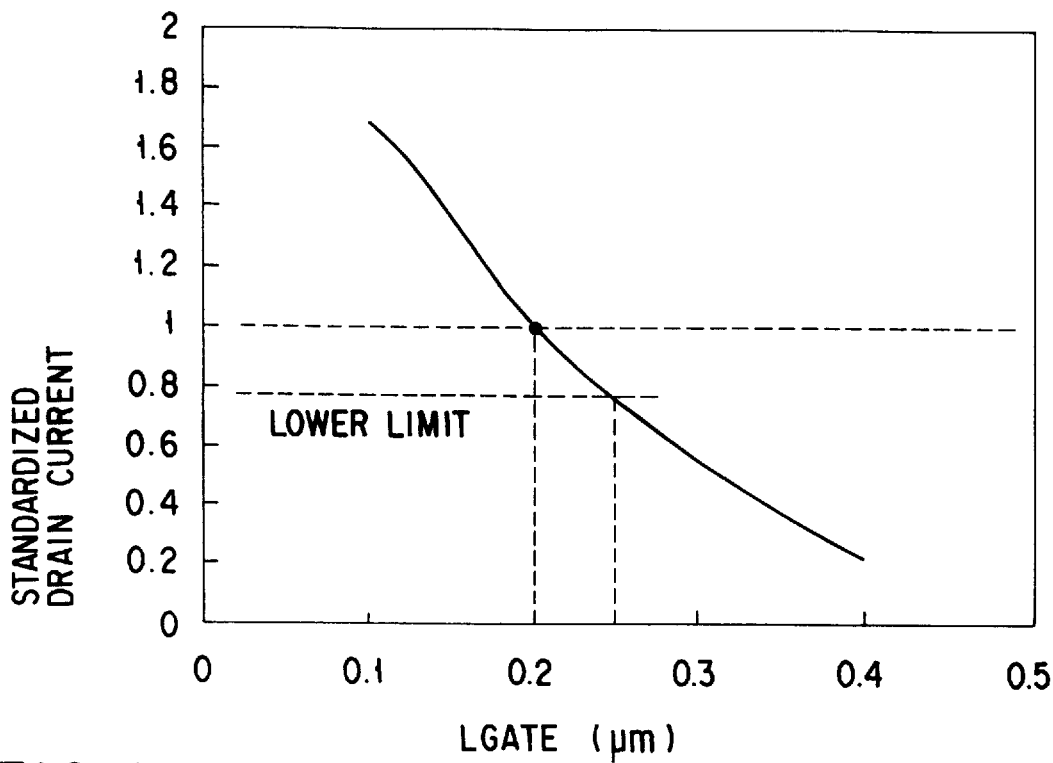
FIG. 66 is a graph showing a relationship between the gate length ($L_{gate}$) and a drain current Id according to the nineteenth embodiment.

FIG. 66 is a graph showing a relationship between the gate length $L_{gate}$ and the drain current Id. The drain current Id shows a value which is standardized to be 1 when the gate length $L_{gate}$=0.20 μm. Here, the values of Xj, $t_{OX}$, etc. are optimized for a transistor with $L_{gate}$=0.20 μm.

As apparent from FIG. 66 that as the gate length $L_{gate}$ gets longer, the drain current Id becomes smaller. As reducing the drain current Id by more than 20% affects the device operation, it is understood that a reduction of the drain current Id by 20% or the channel length L=0.25 μm (greater than $L_{gate}$ by 25%) is the upper limit of the channel length L.

In the case of a transistor with a concave structure as shown in FIGS. 65A–65C, the deeper the burying depth of the gate electrode 70 gets, the longer the total channel length ($l_1, l_2, l_3$) becomes. This is because the sides of the groove contribute to the channel length too.

From the above, the gate length $L_{gate}$ (the channel length at the bottom of the groove) and d should desirably satisfy the following equation from the viewpoint of the transistor performance.

$$d < L_{gate} \times 0.25/2 \tag{2}$$

Figure 67:
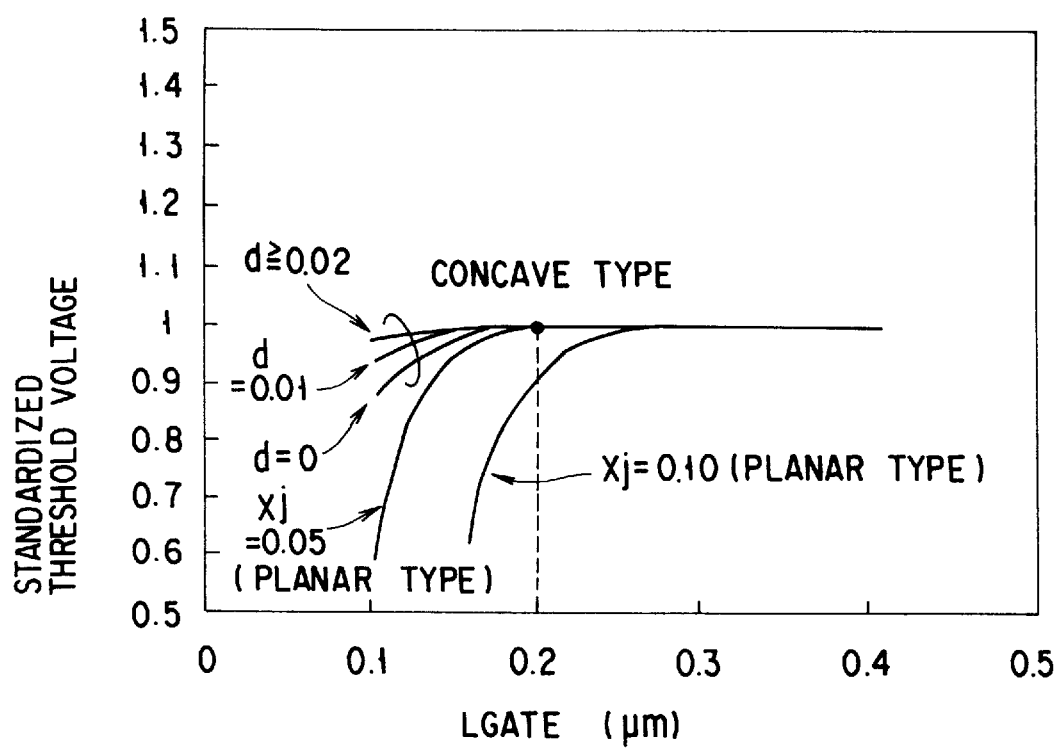
FIG. 67 is a graph showing a relationship between the gate length ($L_{gate}$) and a threshold voltage according to the nineteenth embodiment.

The lower limit of d will now be considered with reference to FIG. 67.

For a transistor whose gate has a planar structure, not a concave structure, it is important to set the junction depth Xj of the source/drain diffusion region shallow to prevent the short channel effect. For example, it is known that a transistor with Xj=0.05 μm can reduce the short channel effect more than a transistor with Xj=0.1 μm. According to the conventional transistors with the planar structure, it is in principle not possible to set Xj=0 μm.

According to a transistor with a concave structure as that of this embodiment, Xj can appear to be set to a minus value by changing the value of d. This means that the short channel effect of a transistor with a concave structure can be reduced significantly. That is, as apparent from FIG. 67, the short channel effect can be reduced by increasing d from d=0 (equivalent to Xj=0) to d=0.01 μm, and to d=0.02 μm. To suppress the short channel effect, therefore, it is important that d>0. With d>0.02 μm, an effect of suppressing the short channel effect is saturated.

Figure 68:
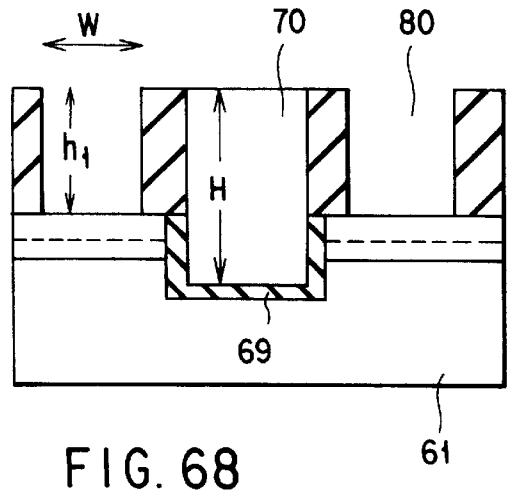
FIGS. 68 and 69 are cross-sectional views of transistors which differ from each other in the height of the portion of the gate electrode in the nineteenth embodiment that protrudes above the Si substrate.
Figure 72B:
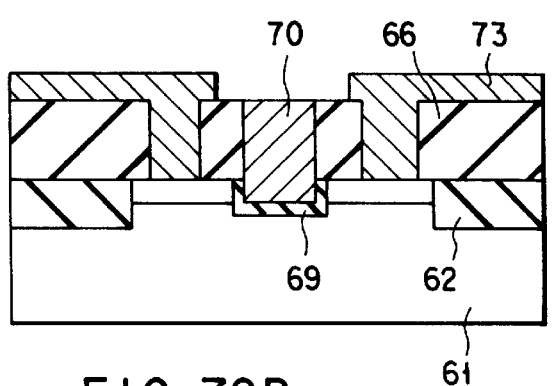
Figure 69:
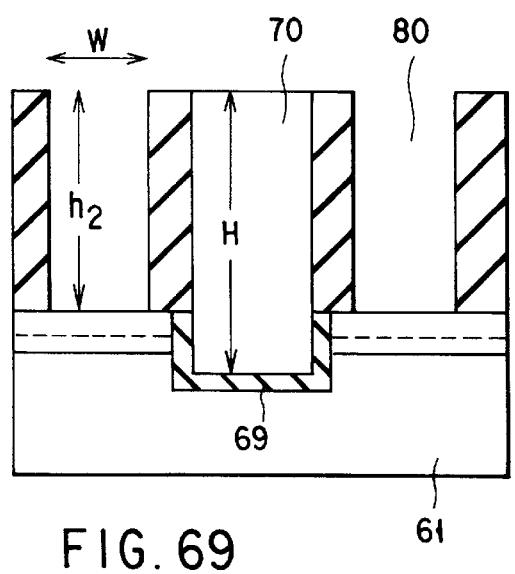
Figure 70:
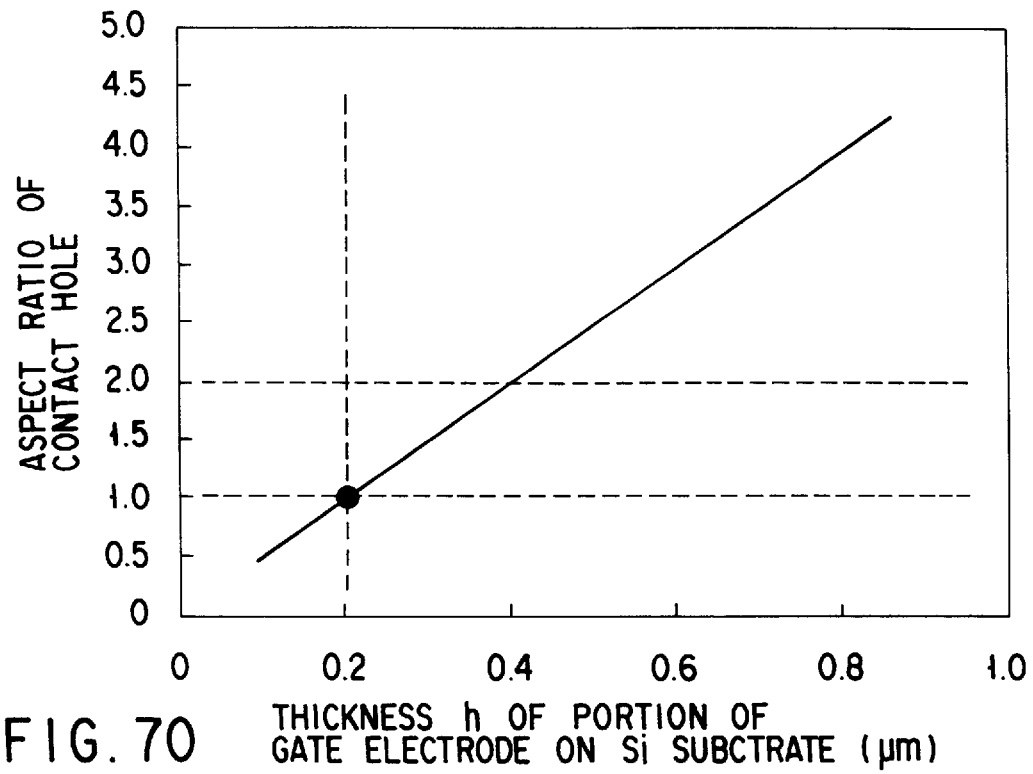
FIG. 70 is a graph illustrating a relationship between the height of the portion of the gate electrode in the nineteenth embodiment that protrudes above the Si substrate, and the aspect ratio of a contact hole.

Next, the height h of the portion of the gate electrode that protrudes above the Si substrate will be contemplated. FIG. 68 shows a case where h is $h_1$ while FIG. 69 shows a case where h is $h_2$ larger than $h_1$. With L=0.20 μm as an example, FIG. 70 shows the result of computation of the aspect ratio of contact holes 80 (equivalent to h/W in the diagrams) according to the design rule for L=0.20 μm.

When $h_1$=0.20 μm in FIG. 68, the aspect ratio of the contact holes 80 is 1. When $h_2$=0.60 μm in FIG. 69, the aspect ratio of the contact holes 80 becomes 3. Apparently, with such a large aspect ratio, it becomes hard to form the contact holes 80 and bury the contact plug but also the resistance of the contact plug increases.

As h gets greater, however, the wiring resistance of the gate electrode 70 can be reduced. From this, it is understood that h is a value which is determined by tradeoff of a reduction in the wiring resistance of the gate electrode, an increase in the resistance of the contact plug and the burying difficulty thereof in the transistor characteristics.

From the conventional examples of forming contacts and the viewpoint of the transistor characteristics, it is known that the aspect ratio of contact holes should desirably be set equal to or smaller than 3. Given that the minimum film thickness is larger than the gate length L in light of the wiring resistance of the gate electrode, therefore, with the gate length L being the minimum design rule, the following equation is satisfied.

$$L_{gate} < h < \text{gate length } L \times 3 \qquad (3)$$

The above relationships lead to the following.

$$L + Xj - t_{OX} < H < 3 \times L_{gate}$$

$$L + Xj - t_{OX} < H < 3.125 \times L_{gate} + Xj - t_{OX} \qquad (4)$$

The values of Xj, $d_{max}$, $h_{max}$, $t_{OX}$, $H_{min}$ and $H_{max}$ in the individual design rules (L=0.20 μm, 0.15 μm, 0.10 μm) become as given in the following table.

TABLE

| L (μm) | Xj (μm) | $d_{max}$ (μm) | $h_{max}$ (μm) | $t_{OX}$ (μm) | $H_{min}$ (μm) | $H_{max}$ (μm) |
|---|---|---|---|---|---|---|
| 0.20 | 0.10 | 0.025 | 0.60 | 50 | 0.25 | 0.675 |
| 0.15 | 0.10 | 0.01875 | 0.45 | 40 | 0.20 | 0.52875 |
| 0.10 | 0.10 | 0.0125 | 0.30 | 30 | 0.17 | 0.3825 |

Note: To reduce the resistance of the source/drain diffusion region, Xj is set to a constant value of 0.10 μm.

Figure 71:
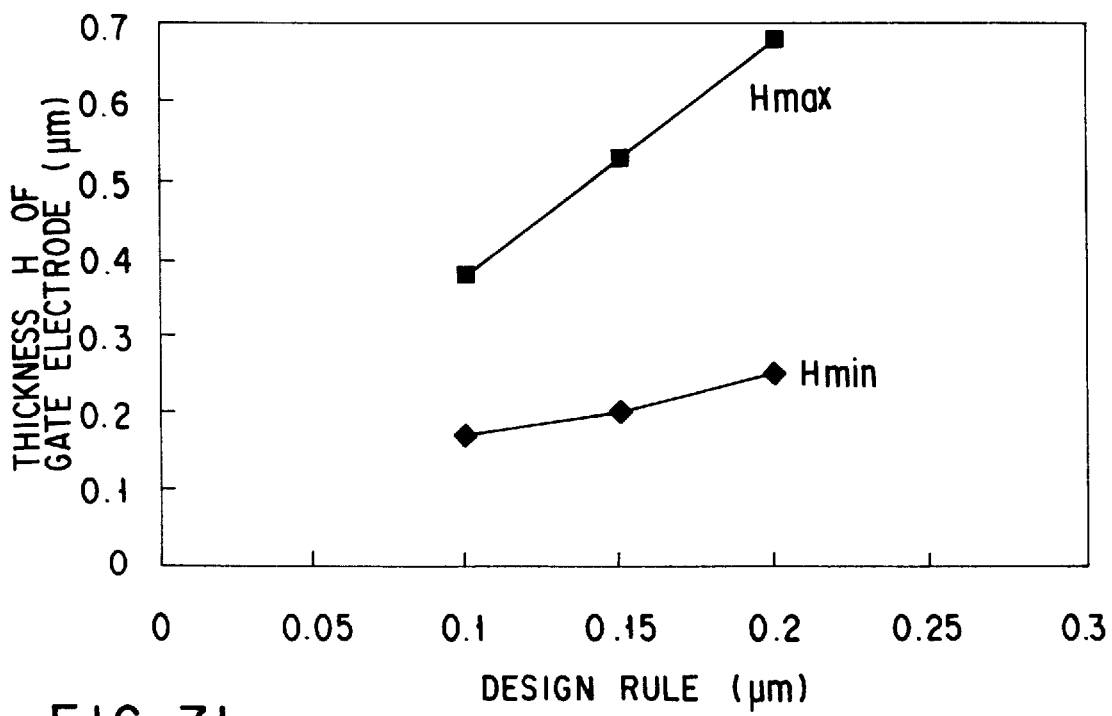
FIG. 71 is a graph showing $H_{min}$ and $H_{max}$ in each design rule.

FIG. 71 shows a plot of $H_{min}$ and $H_{max}$. As apparent from FIG. 71, it is necessary to adjust the thickness of the gate electrode to fall between $H_{min}$ and $H_{max}$.

Figure 72A:
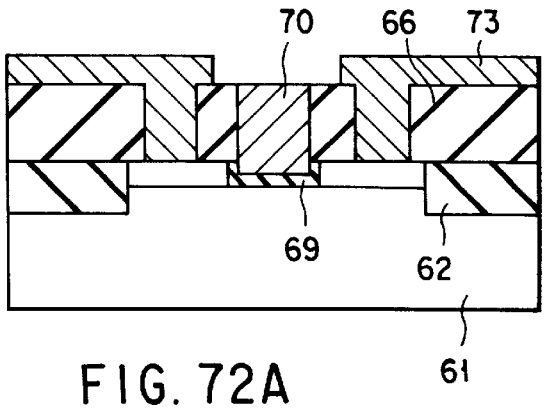
FIGS. 72A through 72D are cross-sectional views depicting transistors with different thicknesses of gate electrodes and different depths of the portions of the gate electrodes buried in Si substrates.

FIGS. 72A through 72 D show transistors obtained by varying the thickness of the gate electrode 70 and the depth of the portion of the gate electrode 70 buried in the Si substrate 61. In view of the above, if the depth of the portion of the gate electrode 70 buried in the Si substrate 61 is too shallow as shown in FIG. 72A, it is difficult to suppress the short channel effect, if the depth of the portion of the gate electrode 70 buried in the Si substrate 61 is too deep as shown in FIG. 72B, the drain current of the transistor drops, and if the gate electrode 70 is thin as shown in FIG. 72D, the wiring resistance of the gate electrode 70 becomes higher. Thus, the structure as shown in FIG. 72C is the optimal one.

Figure 72C:
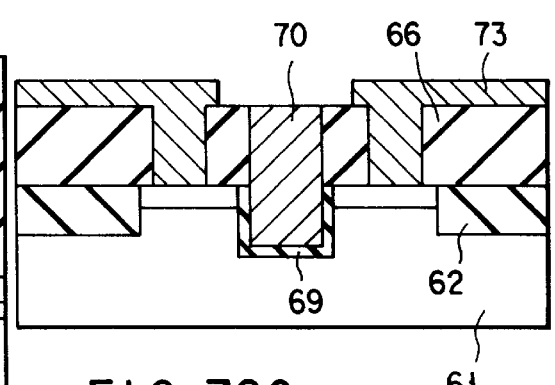
Figure 72D:
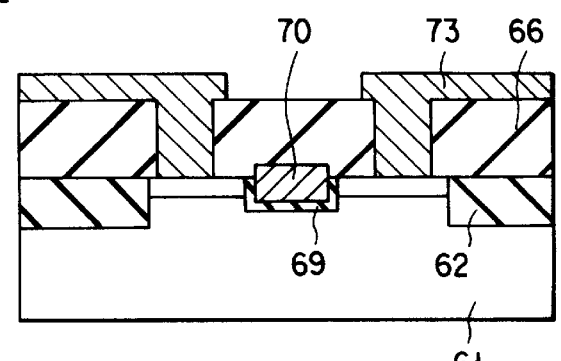

The use of the structure as shown in FIG. 72C can prevent the device characteristic from being deteriorated by an increase in the wiring resistance of the gate electrode, the formation of contacts from becoming difficult due to an increase in the aspect ratio of contact holes, and the device characteristic from being deteriorated by an increase in the contact resistance.

According to the nineteenth embodiment, as apparent from the above, as part of the gate electrode is buried in the substrate, a step formed by the gate electrode can be suppressed even when the thickness of the gate electrode is increased to reduce the resistance of the gate electrode.

Further, a semiconductor device with the optimal performance can be obtained by defining the size of the portion of the gate electrode which is buried in the substrate and the size of the portion of the gate electrode which protrudes above the surface of the substrate within a predetermined range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device comprising the steps of:

forming a first film and a second film on a semiconductor substrate;

selectively removing said second film, said first film and a top portion of said semiconductor substrate to form a first groove;

burying a first insulator film in said first groove to form an isolation region;

patterning said second film surrounded by said isolation region to form a dummy gate layer;

doping said semiconductor substrate with an impurity using said dummy gate layer as a mask;

forming a second insulator film on said semiconductor substrate surrounded by said dummy gate layer and said first insulator film;

removing said dummy gate layer and said first film to form a second groove;

forming a gate insulator film on said semiconductor substrate in said second groove; and forming a gate electrode on said gate insulator film in said second groove.

2. The method according to claim 1, further comprising the step of forming a wiring pattern to be connected to said gate electrode, on said gate electrode and said first and second insulator films, after said gate electrode forming step.

3. The method according to claim 1, wherein at least part of said second film consists essentially of a semiconductor.

4. The method according to claim 1, wherein in said step of forming said gate electrode on said gate insulator film in said second groove, a wiring pattern connected to said gate electrode is formed on said first insulator film and said second insulator film.

5. The method according to claim 1, wherein said second film has a double-layer structure.

6. The method according to claim 1, further comprising the step of forming a sidewall insulator film higher than a surface of said semiconductor substrate, on a side wall of said dummy gate layer after said step of forming said dummy gate layer.

7. The method according to claim 1, further comprising the step of forming a third insulator film and a sidewall insulator film higher than a surface of said semiconductor substrate, on a side wall of said dummy gate layer.

8. A method of manufacturing a semiconductor device comprising the steps of:

forming a gate insulator film and a first conductive film on a semiconductor substrate;

selectively removing said first conductive film, said gate insulator film and a top portion of said semiconductor substrate to form a first groove;

burying a first insulator film in said first groove to form an isolation region;

forming a dummy film on said first conductive film and said isolation region;

patterning said dummy film and said first conductive film to form an island-like layer;

doping said semiconductor substrate with an impurity using said island-like layer as a mask;

forming a second insulator film on said gate insulator film surrounded by said island-like layer and said first insulator film;

removing said dummy film to form a second groove; and forming a second conductive film on said first conductive film in said second groove to form a gate electrode comprised of said first conductive film and said second conductive film.

9. The method according to claim 8, further comprising the step of forming a sidewall insulator film higher than a surface of said semiconductor substrate, on a side surface of said island-like layer after said step of forming said island-like layer.

10. The method according to claim 8, further comprising the step of forming a third insulator film and a sidewall insulator film higher than a surface of said semiconductor substrate, on a side surface of said island-like layer after said step of forming said island-like layer.

11. The method according to claim 8, wherein said second conductive film is comprised of a reaction preventing film and a wiring material film.

12. A method of manufacturing a semiconductor device comprising the steps of:

forming a first groove in a semiconductor substrate;

burying a first insulator film in said first groove to form an isolation region;

forming a first film and a second film on a surface of said semiconductor substrate surrounded by said isolation region;

patterning said second film to form a dummy gate layer;

doping said semiconductor substrate with an impurity using said dummy gate layer as a mask;

forming a second insulator film on said first film surrounded by said dummy gate layer and said first insulator film;

removing said dummy gate layer and said first film to form a second groove;

forming a gate insulator film on said semiconductor substrate in said second groove; and forming a gate electrode on said gate insulator film in said second groove.

13. The method according to claim 12, wherein in said step of forming said second groove, said dummy gate layer and said first film as well as a surface portion of said semiconductor substrate lying under said dummy gate layer and said first film are removed.

14. The method according to claim 12, further comprising the step of forming a sidewall insulator film on a side surface of said dummy gate layer after said step of forming said dummy gate layer.

15. A method of manufacturing a semiconductor device comprising the steps of:

forming a dummy gate layer on a semiconductor substrate;

forming a dummy sidewall film on a side surface of said dummy gate layer;

depositing an interlayer insulator film on an entire surface of the substrate having the dummy gate layer and the dummy sidewall;

removing said interlayer insulator film until a top surface of said dummy gate layer is exposed;

removing said dummy gate layer to form a groove;

forming a gate electrode in said groove;

removing said dummy sidewall film to form a cavity; and burying a sidewall material in said cavity to form a sidewall film.

16. The method according to claim 15, further comprising the step of forming a gate insulator film on said bottom surface of said groove.

17. The method according to claim 15, wherein said sidewall material is an organic insulation material.

18. A method of manufacturing a semiconductor device comprising the steps of:

forming a gate insulator film on a semiconductor substrate;

forming a gate electrode on said gate insulator film;

forming a dummy sidewall film on a side surface of said gate electrode;

depositing an interlayer insulator film on an entire surface of the substrate having the gate insulator, the gate electrode and the dummy side wall film;

removing said interlayer insulator film until a top surface of said gate electrode is exposed;

removing said dummy sidewall film to form a cavity; and burying a sidewall material in said cavity to form a sidewall film.

19. The method according to claim 18, wherein said sidewall material is an organic insulation material.

20. A method of manufacturing a semiconductor device comprising the steps of:

forming a dummy gate layer on a semiconductor substrate;

forming a sidewall insulator film on a side wall of said dummy gate layer, said sidewall insulator film having an etching selectivity with a material for forming said dummy gate layer;

depositing an interlayer insulator film on an entire surface of the substrate having the dummy gate layer and the sidewall insulator film;

removing said interlayer insulator film until a top surface of said dummy gate layer is exposed;

removing said dummy gate layer to form a groove;

forming a gate insulator film on a bottom surface of said groove; and forming a gate electrode in said groove on whose bottom surface said gate insulator film is formed.

21. The method according to claim 20, wherein said sidewall insulator film consists essentially of an oxide selected from a group of tantalum oxide, niobium oxide, yttrium oxide and cerium oxide.

22. The method according to claim 20, wherein said sidewall insulator film is comprised of a first insulator film consisting essentially of an oxide selected from a group consisting of tantalum oxide, niobium oxide, yttrium oxide and cerium oxide, and a silicon oxide film.

23. A method of manufacturing a semiconductor device comprising the steps of:

forming a dummy gate comprised of a first silicon nitride film, on a semiconductor substrate;

forming a first silicon oxide film on an entire surface of the semiconductor substrate having the first silicon nitride film formed thereon;

forming a second silicon nitride film on an entire surface of the first silicon oxide film;

forming an interlayer insulator film on an entire surface of the second silicon oxide film;

polishing said interlayer insulator film until said dummy gate is exposed;

removing upper portions of said first and second silicon nitride films to form a first groove;

burying a second silicon oxide film in said first groove;

performing anisotropic etching on said second silicon oxide film to expose said dummy gate while leaving said second silicon oxide film remaining on said second silicon nitride film;

removing said dummy gate to form a second groove;

forming a gate insulator film on a bottom surface and a side surface of said second groove; and forming a gate electrode in said second groove on whose bottom surface and side wall said gate insulator film is formed.

* * * * *